US009514944B2

(12) United States Patent
Masuoka et al.

(10) Patent No.: US 9,514,944 B2
(45) Date of Patent: Dec. 6, 2016

(54) METHOD FOR PRODUCING AN SGT-INCLUDING SEMICONDUCTOR DEVICE

(71) Applicant: UNISANTIS ELECTRONICS SINGAPORE PTE. LTD., Singapore (SG)

(72) Inventors: Fujio Masuoka, Tokyo (JP); Nozomu Harada, Tokyo (JP)

(73) Assignee: Unisantis Electronics Singapore Pte. Ltd., Singapore (SG)

( * ) Notice: Subject to any disclaimer, the term of this patent is extended or adjusted under 35 U.S.C. 154(b) by 0 days.

(21) Appl. No.: 14/732,208

(22) Filed: Jun. 5, 2015

(65) Prior Publication Data

US 2015/0325444 A1 Nov. 12, 2015

Related U.S. Application Data

(63) Continuation of application No. PCT/JP2013/063701, filed on May 16, 2013.

(51) Int. Cl.
*H01L 21/336* (2006.01)
*H01L 21/28* (2006.01)
(Continued)

(52) U.S. Cl.
CPC ..... *H01L 21/28158* (2013.01); *H01L 27/1108* (2013.01); *H01L 29/42356* (2013.01);
(Continued)

(58) Field of Classification Search
CPC .................... H01L 21/28158; H01L 29/42356; H01L 29/66666; H01L 27/1108; H01L 29/7827; H01L 29/42392
See application file for complete search history.

(56) References Cited

U.S. PATENT DOCUMENTS 5,258,635 A 11/1993 Nitayama et al.
5,311,050 A 5/1994 Nitayama et al.
(Continued)

FOREIGN PATENT DOCUMENTS

JP H02188966 A 7/1990
JP 04207069 A 7/1992
(Continued)

OTHER PUBLICATIONS

Takato et al., Impact of Surrounding Gate Transistor (SGT) for Ultra-High-Density LSI's, IEEE Transaction on Electron Devices, vol. 38, No. 3, pp. 573-578, Mar. 1991.
(Continued)

*Primary Examiner* — Stephen W Smoot
*Assistant Examiner* — Vicki B Booker
(74) *Attorney, Agent, or Firm* — Laurence Greenberg; Werner Stemer; Ralph Locher

(57) ABSTRACT

A method for producing an SGT-including semiconductor device includes forming a gate insulating layer on an outer periphery of a Si pillar, forming a gate conductor layer on the gate insulating layer, and forming an oxide layer on the gate conductor layer. Then a hydrogen fluoride ion diffusion layer containing moisture is formed so as to make contact with the oxide layer and lie at an intermediate position of the Si pillar. A part of the oxide film in contact with the hydrogen fluoride ion diffusion layer is etched with hydrogen fluoride ions generated from hydrogen fluoride gas supplied to the hydrogen fluoride ion diffusion layer and an opening is thereby formed on the outer periphery of the Si pillar.

9 Claims, 44 Drawing Sheets

(51) Int. Cl.

| | |
|---|---|
| ***H01L 29/66*** | (2006.01) |
| ***H01L 29/423*** | (2006.01) |
| ***H01L 27/11*** | (2006.01) |
| ***H01L 29/78*** | (2006.01) |
| *G11C 11/412* | (2006.01) |

(52) U.S. Cl.

CPC .. *H01L 29/42392* (2013.01); *H01L 29/66666* (2013.01); *H01L 29/7827* (2013.01); *G11C 11/412* (2013.01)

(56) References Cited

U.S. PATENT DOCUMENTS

| | | | |
|---|---|---|---|
| 6,882,006 | B2 | 4/2005 | Maeda et al. |
| 8,212,311 | B2 | 7/2012 | Masuoka et al. |
| 8,476,132 | B2 | 7/2013 | Masuoka et al. |
| 8,728,338 | B2 | 5/2014 | Ohmi et al. |

FOREIGN PATENT DOCUMENTS

| | | | |
|---|---|---|---|
| JP | H0799311 | A | 4/1995 |
| JP | 2008205168 | A | 9/2008 |
| JP | 2010232631 | A | 10/2010 |
| JP | 2012119656 | A | 6/2012 |
| WO | 0074135 | A1 | 12/2000 |
| WO | 2009096002 | A1 | 8/2009 |
| WO | 2011043402 | A1 | 4/2011 |
| WO | 2012098637 | A1 | 7/2012 |

OTHER PUBLICATIONS

Na et al., "A New Compact SRAM Cell by Vertical MOSFET for Low-power and Stable Operation", Memory Workshop, 201 3rd IEEE International Digest, pp. 1-4 (2011).

Shibata et al., "A New Field Isolation Technology for High Density MOS LSI", Japanese Journal of Applied Physics, vol. 18, pp. 263-267 (1979).

Kikyuama et al., "Principles of Wet Chemical Processing in ULSI Microfabrication", IEEE Transactions on Semiconductor Manufacturing, vol. 4, No. 1, pp. 26-35 (1991).

METHOD FOR PRODUCING AN SGT-INCLUDING SEMICONDUCTOR DEVICE

CROSS REFERENCES TO RELATED APPLICATIONS

This application is a continuation of international patent application PCT/JP2013/063701, filed May 16, 2013, the contents of which are incorporated herein by reference in their entirety.

BACKGROUND OF THE INVENTION

Field of the Invention

The present invention relates to a method for producing a semiconductor device that includes surrounding gate MOS transistors (SGTs).

Description of the Related Art

Applications of surrounding gate MOS transistors (hereinafter referred to as SGTs) to semiconductor elements that offer highly integrated semiconductor devices have expanded in recent years and higher integration of SGT-including semiconductor devices is pursued under such trends.

FIG. 5 shows a structure of a representative example of a CMOS inverter circuit that includes MOS transistors. The CMOS inverter circuit includes an N-channel MOS transistor 100*a* and a P-channel MOS transistor 100*b*. A gate 101*a* of the N-channel MOS transistor 100*a* and a gate 101*b* of the P-channel MOS transistor 100*b* are connected to an input terminal Vi. A drain 102*a* of the N-channel MOS transistor 100*a* and a drain 102*b* of the P-channel MOS transistor 100*b* are connected to an output terminal Vo. A source 103*b* of the P-channel MOS transistor 100*b* is connected to a power source terminal VDD. A source 103*a* of the N-channel MOS transistor 100*a* is connected to a ground terminal VSS. In this CMOS inverter circuit, when an input voltage corresponding to "1" or "0" is applied to the input terminal Vi, an output voltage corresponding to the inverted input voltage, "0" or "1," is output from the output terminal Vo.

These types of CMOS inverter circuits are used in many circuit chips such as microprocessors and the like. Increasing the degree of integration of CMOS inverter circuits directly leads to size-reduction of circuit chips such as microprocessors. Moreover, size reduction of circuit chips that use CMOS inverter circuits leads to cost reduction of circuit chips.

FIG. 6 is a cross-sectional view of a known planar CMOS inverter circuit. As illustrated in FIG. 6, an N-well region 105 (hereinafter a semiconductor region where a P-channel MOS transistor is formed and that contains a donor impurity is referred to as an N-well region) is formed in a P-type semiconductor substrate 104 (hereinafter a semiconductor substrate that contains an acceptor impurity is referred to as a P-type semiconductor substrate). Element isolation insulating layers 106*a* and 106*b* are each formed between a surface layer portion of the N-well region 105 and a surface layer portion of the P-type semiconductor substrate 104. A gate oxide film 107*a* for a P-channel MOS transistor and a gate oxide film 107*b* for an N-channel MOS transistor are respectively formed on a surface of the P-type semiconductor substrate 104 and a surface of the N-well region 105. A gate conductor layer 108*a* for a P-channel MOS transistor and a gate conductor layer 108*b* for an N-channel MOS transistor are respectively formed on the gate oxide film 107*a* and the gate oxide film 107*b*. On the left side of the gate conductor layer 108*a* for a P-channel MOS transistor, a $P^+$ region 109*a* (a semiconductor region that has a high acceptor impurity concentration is hereinafter referred to as a "$P^+$ region") is formed on a surface of the N-well region 105. On the right side of the gate conductor layer 108*a*, a $P^+$ region 109*b* is formed on the surface of the N-well region 105. Similarly, a $N^+$ region 110*b* (a semiconductor region having a high donor impurity concentration is hereinafter referred to as an "$N^+$ region") is formed on the surface of the P-type semiconductor substrate 104 on the right side of the gate conductor layer 108*b* for a N-channel MOS transistor, and a $N^+$ region 110*a* is formed on the surface of the P-type semiconductor substrate 104 on the left side of the gate conductor layer 108*b*. A first interlayer insulating layer 111 is formed. Contact holes 112*a*, 112*b*, 112*c*, and 112*d* are formed in the first interlayer insulating layer 111 so as to be on the $P^+$ regions 109*a* and 109*b* and the $N^+$ regions 110*a* and 110*b*, respectively.

A power supply wiring metal layer Vdd formed on the first interlayer insulating layer 111 is connected to the $P^+$ region 109*a* of the P-type MOS transistor through the contact hole 112*a*. An output wiring metal layer Vo formed on the first interlayer insulating layer 111 is connected to the $P^+$ region 109*b* of a $P^-$ channel MOS transistor and the $N^+$ region 110*a* of an N-channel MOS transistor through the contact holes 112*b* and 112*c*. A ground wiring metal layer Vss is connected to the $N^+$ region 110*b* of an N-channel MOS transistor through the contact hole 112*d*. A second interlayer insulating layer 113 is formed on the first interlayer insulating layer 111. Contact holes 114*a* and 114*b* are formed so as to penetrate through the first interlayer insulating layer 111 and the second interlayer insulating layer 113. The contact hole 114*a* is on the gate conductor layer 108*a* for a P-channel MOS transistor and the contact hole 114*b* is on the gate conductor layer 108*b* for a N-channel MOS transistor. An input wiring metal layer Vi formed on the second interlayer insulating layer 113 is connected to the gate conductor layer 108*a* for a P-channel MOS transistor and the gate conductor layer 108*b* for an N-channel MOS transistor through the contact holes 114*a* and 114*b*.

In order to reduce the area in which a planar CMOS inverter circuit is formed, it is necessary to reduce the two-dimensional size of the P-type semiconductor substrate 104, on which the gate conductor layers 108*a* and 108*b* of P- and N-channel MOS transistors, the $N^+$ regions 110*a* and 110*b*, the $P^+$ regions 109*a* and 109*b*, the contact holes 112*a*, 112*b*, 112*c*, 112*d*, 114*a*, and 114*b*, and the wiring metal layers 108*a* and 108*b* are formed, as viewed in plan in a direction perpendicular to the substrate surface. In a typical planar CMOS inverter circuit, many contact holes are formed in addition to the contact holes 112*a*, 112*b*, 112*c*, 112*d*, 114*a*, and 114*b*. Accordingly, in order to form fine contact holes at high accuracy, processing technologies such as lithographic technologies and etching technologies are required to achieve ever higher accuracy.

In a typical planar MOS transistor, the channel of a P- or N-channel MOS transistor lies in a horizontal direction along the surface of the P-type semiconductor substrate 104 and the N-well region 105 and between the source and the drain. In contrast, the channel of an SGT lies in a direction perpendicular to a surface of a semiconductor substrate (for example, refer to Japanese Unexamined Patent Application Publication No. 2-188966, and Hiroshi Takato, Kazumasa Sunouchi, Naoko Okabe, Akihiro Nitayama, Katsuhiko Hieda, Fumio Horiguchi, and Fujio Masuoka: IEEE Transaction on Electron Devices, Vol. 38, No. 3, pp. 573-578 (1991)).

FIG. 7A is a schematic diagram illustrating an N-channel SGT. $N^+$ regions 116*a* and 116*b* are respectively formed in a lower portion and an upper portion of a P-type or i-type (intrinsic) Si pillar 115 (hereinafter a silicon semiconductor pillar is referred to as a Si pillar). When one of the $N^+$ regions 116*a* and 116*b* functions as a source, the other functions as a drain. A portion of the Si pillar 115 that lies between the source and drain $N^+$ regions 116*a* and 116*b* is a channel region 117. A gate insulating layer 118 is surrounds the channel region 117, and a gate conductor layer 119 surrounds the gate insulating layer 118. In a SGT, source and drain $N^+$ regions 116*a* and 116*b*, the channel region 117, the gate insulating layer 118, and the gate conductor layer 119 are formed in one Si pillar 115. Thus, the area of the surface of the SGT appears to be equal to the area of one source or drain $N^+$ region of a planar MOS transistor. Accordingly, a circuit chip that includes SGTs can achieve further chip-size reduction compared to a circuit chip that includes planar MOS transistors.

FIG. 7B is a cross-sectional view of an SGT-including CMOS inverter circuit (for example, refer to Japanese Unexamined Patent Application Publication No. 7-99311).

As illustrated in FIG. 7B, an i-layer 121 ("i-layer" refers to an intrinsic Si layer) is formed on an insulating layer substrate 120 and a Si pillar SP1 for a P-channel SGT and a Si pillar SP2 for an N-channel SGT are formed on the i-layer 121.

The i-layer 121 is connected to a lower portion of the Si pillar SP1 of a P-channel SGT. A $P^+$ region 122 of a P-channel SGT is formed in the same layer as the i-layer 121 and surrounds the lower portion of the Si pillar SP1. A $N^+$ region 123 of an N-channel SGT is formed in the same layer as the i-layer 121 and surrounds the lower portion of the Si pillar SP2.

A $P^+$ region 124 of a P-channel SGT is formed in an upper portion of the Si pillar SP1 for a P-channel SGT. A $N^+$ region 125 of an N-channel SGT is formed in an upper portion of the Si pillar SP2 for an N-channel SGT.

As illustrated in FIG. 7B, gate insulating layers 126*a* and 126*b* are formed so as to surround the Si pillars SP1 and SP2. A gate conductor layer 127*a* of a P-channel SGT and a gate conductor layer 127*b* of an N-channel SGT are formed so as to surround the gate insulating layers 126*a* and 126*b*.

Insulating layers 128*a* and 128*b* are formed so as to surround the gate conductor layers 127*a* and 127*b*.

The $P^+$ region 122 of a P-channel SGT and the $N^+$ region 123 of an N-channel SGT are connected to each other through a silicide layer 129*b*. A silicide layer 129*a* is formed on the $P^+$ region 124 of a P-channel SGT and a silicide layer 129*c* is formed on the $N^+$ region 125 of an N-channel SGT. An i-layer 130*a* between the $P^+$ region 122 under the Si pillar SP1 and the $P^+$ region 124 in an upper portion of the Si pillar SP1 serves as a channel of a P-channel SGT. An i-layer 130*b* between the $N^+$ region 123 under the Si pillar SP2 and the $N^+$ region 125 in an upper portion of the Si pillar SP2 serves as a channel of an N-channel SGT.

As illustrated in FIG. 7B, a $SiO_2$ layer 131 is formed by chemical vapor deposition (CVD) so as to cover the i-layer substrate 120 (insulating layer substrate) and the Si pillars SP1 and SP2. Contact holes 132*a*, 132*b*, and 132*c* are formed in the $SiO_2$ layer 131. The contact hole 132*a* is formed on the Si pillar SP1, the contact hole 132*c* is formed on the Si pillar SP2, and the contact hole 132*b* is formed on part of the $P^+$ region 122 and the $N^+$ region 123.

A power supply wiring metal layer Vdd on the $SiO_2$ layer 131 is connected to the $P^+$ region 124 of a P-channel SGT and the silicide layer 129*a* through the contact hole 132*a*. An output wiring metal layer Vo on the $SiO_2$ layer 131 is connected to the $P^+$ region 122 of a P-channel SGT, the $N^+$ region 123 of an N-channel SGT, and the silicide layer 129*b* through the contact hole 132*b*. The ground wiring metal layer Vss on the $SiO_2$ layer 131 is connected to the $N^+$ region 125 of an N-channel SGT and the silicide layer 129*c* through the contact hole 132*c*.

The gate conductor layer 127*a* of a P-channel SGT and the gate conductor layer 127*b* of an N-channel SGT are connected to each other and to an input wiring metal layer (not shown in the drawing). Since a P-channel SGT and an N-channel SGT are respectively formed in the Si pillar SP1 and the Si pillar SP2 in the inverter circuit that has these SGTs, the area of the circuit in a plan view taken in a direction perpendicular to the insulating layer substrate 120 is reduced. Accordingly, the circuit can achieve further side reduction compared to an inverter circuit that has typical planar MOS transistors.

Currently, efforts are being made to further reduce the size of a circuit chip that includes SGTs. In this regard, as illustrated in the diagram of FIG. 8, it has been predicted that the circuit area can be reduced by respectively forming two SGTs in an upper portion and a lower portion of one Si pillar SPa (for example, refer to Hyoungiun Na and Tetsuo Endoh: "A New Compact SRAM cell by Vertical MOSFET for Low-power and Stable Operation", Memory Workshop, 201 3rd IEEE International Digest, pp. 1 to 4 (2011)).

As illustrated in FIG. 8, a CMOS inverter circuit includes an N-channel SGT 133*a* formed in a lower portion of the Si pillar SPa and a P-channel SGT 133*b* is formed above the N-channel SGT 133*a*. A $N^+$ region 134*a* of the N-channel SGT 133*a* is formed in a lower portion of the Si pillar SPa, and is connected to the ground wiring metal layer Vss. A channel i-layer 136*a* is formed on the $N^+$ region 134*a*. A gate insulating layer 137*a* is formed on the outer periphery of the channel i-layer 136*a*. A gate conductor layer 138*a* for an N-channel SGT is formed on the outer periphery of the gate insulating layer 137*a*. A $N^+$ region 134*b* is formed on the channel i-layer 136*a*. A $P^+$ region 135*a* of the P-channel SGT 133*b* is formed on the $N^+$ region 134*b*. A channel i-layer 136*b* is formed on the $P^+$ region 135*a*. A gate insulating layer 137*b* is formed on the outer periphery of the channel i-layer 136*b*, and a gate conductor layer 138*b* for the P-channel SGT 133*b* is formed on the outer periphery of the gate insulating layer 137*b*. A $P^+$ region 135*b* is formed in a top portion of the Si pillar SPa and on the channel i-layer 136*b*. The $P^+$ region 135*b* is connected to the power supply wiring metal layer VDD. A connecting part 160*a* that is in contact with the gate conductor layer 138*a* of the N-channel SGT 133*a* and is formed of a metal wire having an opening and a connecting part 160*b* that is in contact with the gate conductor layer 138*b* of the P-channel SGT 133*b* and is formed of a metal wire having an opening are connected to the input wiring metal layer Vi. A connecting part 161 formed of a metal wire and having an opening in contact with the $N^+$ region 134*b* of the N-channel SGT 133*a* and the $P^+$ region 135*a* of the P-channel SGT 133*b* (this opening corresponds to the contact hole 132*b* on the $P^+$ region 122 and the $N^+$ region 123 in FIG. 7B) is connected to an output terminal wire Vo.

Some production difficulties need to be resolved in order to form an SGT-including inverter circuit in one Si pillar SPa as illustrated in FIG. 8. That is, in FIG. 8, the $P^+$ region 135*a* of the P-channel SGT 133*b* and the $N^+$ region 134*b* of the N-channel SGT 133*a* that lie in a middle portion of the Si pillar SPa are in contact with each other. Thus, the connecting part 161 that is in contact with the $N^+$ region 134*b* of the N-channel SGT 133*a* and the $P^+$ region 135*a* of the P-channel SGT 133*b* must be formed on the side wall of the Si pillar SPa. This means that the opening of the connecting part 161 must be formed on the side wall of the Si pillar SPa. Similarly, the openings of the connecting parts 160*a* and 160*b* in contact with the gate conductor layers 138*a* and 138*b* must also be formed on the side wall of the Si pillar SPa. This means that fine openings of the connecting parts 160*a*, 160*b*, and 161 each formed of a metal wire having an opening must be formed on the side wall of the Si pillar SPa with high accuracy. Although it is necessary to highly accurately form fine openings on the side wall of the Si pillar SPa in order to form openings of the connecting parts 160*a*, 160*b*, and 161, this cannot be achieved by a known method for forming fine contact holes 112*a*, 112*b*, 112*c*, 112*d*, 114*a*, 114*b*, 132*a*, 132*b*, and 132*c* with high accuracy in a flat region on the semiconductor substrate 104 and the insulating layer substrate 120 described by referring to FIGS. 6 and 7B.

FIG. 9 is a diagram showing a structure that includes two Si pillars, SPb and SPc, two SGTs, namely, SGT139*a* and SGT 139*b*, formed in the Si pillar SPb, and two SGTs, namely, SGT 140*a* and 140*b*, formed in the Si pillar SPc with the SGTs 139*a*, 139*b*, 140*a*, and 140*b* being connected to one another through a conducting wire. The SGT 139*a* formed in a lower portion of the Si pillar SPb is constituted by source and drain $N^+$ regions 141*a* and 141*b*, a channel i-region 150*a*, a gate insulating layer 143*a*, and a gate conductor layer 144*a*. The SGT 139*b* in the upper portion of the Si pillar SPb is constituted by $P^+$ regions 142*a* and 142*b*, a channel i-region 150*b*, a gate insulating layer 143*b*, and a gate conductor layer 144*b*. The SGT 140*a* in the lower portion of the Si pillar SPc is constituted by $N^+$ regions 145*a* and 145*b*, a channel i-region 151*a*, a gate insulating layer 147*a*, and a gate conductor layer 148*a*. The SGT 140*b* in the upper portion of the Si pillar SPc is constituted by $N^+$ regions 146*a* and 146*b*, a channel i-region 151*b*, a gate insulating layer 147*b*, and a gate conductor layer 148*b*.

As illustrated in FIG. 9, a connecting part 163*a* that is formed of a metal wire having an opening, the metal wire contacting the gate conductor layer 144*a* and surrounding the Si pillar SPb, is formed. A connecting part 163*b* that is formed of a metal wire having an opening, the metal wire contacting the gate conductor layer 144*b* and surrounding the Si pillar SPb, is formed. A connecting part 149*a* that is formed of a metal wire having an opening, the metal wire contacting the gate conductor layer 148*a* and surrounding the Si pillar SPc, is formed. A connecting part 149*b* that is formed of a metal wire having an opening, the metal wire contacting the gate conductor layer 148*a* and surrounding the Si pillar SPc, is formed. A connecting part 164*a* that is formed of a metal wire having an opening, the metal wire contacting the $N^+$ region 141*b* and the $P^+$ region 142*a* and surrounding the Si pillar SPb, is formed. A connecting part 164*b* that is formed of a metal wire having an opening, the metal wire contacting the $N^+$ region 145*b* and the $N^+$ region 146*a*, is formed.

As illustrated in FIG. 9, in the Si pillar SPb, the connecting part 163*a* is connected to a metal terminal wiring V1, the connecting part 163*b* is connected to a metal terminal wiring V2, and the connecting part 164*a* is connected to a metal terminal wiring V4. In the Si pillar SPc, the connecting part 149*a* is connected to a metal wiring 162*a*, the connecting part 149*b* is connected to a metal terminal wiring V3, and the connecting part 164*b* is connected to a metal wiring 162*b*. The connecting part 163*a* and the connecting part 149*a* are connected to each other via the metal wiring 162*a* and the connecting part 164*a* and the connecting part 164*b* are connected to each other via the metal wiring 162*b*.

In forming an SGT-including inverter circuit illustrated in FIG. 9, it is preferable to form the connecting part 163*a* and the connecting part 149*a* simultaneously at the same position in terms of the height in a perpendicular direction (height direction) of the Si pillars SPb and SPc. As a result, the number of steps required to form the connecting parts 163*a* and 149*a* can be reduced. Similarly, it is preferable to form the connecting part 163*b* and the connecting part 149*b* simultaneously at the same position in terms of the height in the perpendicular direction of the Si pillars SPb and SPc. The connecting part 164*a* and the connecting part 164*b* are preferably formed simultaneously at the same position in terms of height in the perpendicular direction of the Si pillars SPb and SPc. In order to achieve this, the openings of the connecting part 163*a* and the connecting part 149*a* must be formed simultaneously at the same height in the perpendicular direction of the Si pillars SPb and SPc and the same applies to the openings of the connecting part 163*b* and the connecting part 149*b* and the openings of the connecting part 164*a* and the connecting part 164*b*. Furthermore, the openings of these connecting parts 163*a*, 163*b*, 149*a*, 149*b*, 164*a*, and 164*b* must be fine and made highly accurately. Although it is necessary to highly accurately form fine openings on the side walls of the Si pillars SPb and SPc to form these openings, this cannot be achieved by a known method for forming fine contact holes 112*a*, 112*b*, 112*c*, 112*d*, 114*a*, 114*b*, 132*a*, 132*b*, and 132*c* with high accuracy in a flat region on the semiconductor substrate 104 and the insulating layer substrate 120 described by referring to FIGS. 6 and 7B.

As illustrated in FIG. 10, a gate insulating layer 152 that surrounds the Si pillar SPb is formed as one continuous layer that bridges the SGT 139*a* and the SGT 139*b* in the upper and lower portions of the Si pillar SPb. A gate conductor layer 153 is also formed as one continuous layer. A connecting part 154 and a metal terminal wiring V5 are formed to be in contact with the gate conductor layer 153. A connecting part 155 that is in contact with the $N^+$ region 141*b* and the $P^+$ region 142*a* and is connected to the connecting part 164*b* via the metal wiring 162*b* is formed so as not to electrical short with the gate conductor layer 153. According to this approach illustrated in FIG. 10, the gates of the SGT 139*a* and the SGT 139*b* in the upper and lower portions of the Si pillar SPb can be electrically connected to each other via the gate conductor layer 153, the connecting part 154, and the metal terminal wiring V5 whereas the structure illustrated in FIG. 9 requires two connecting parts 145*a* and 145*b* and two metal terminal wirings V1 and V2 in order to electrically connect the gate conductor layers 144*a* and 144*b* of the SGT 139*a* and the SGT 139*b* in the upper and lower portions of the Si pillar SPb to each other. In order to form the structure illustrated in FIG. 10, it is necessary to form the opening of the connecting part 155 so as not to be in contact with the gate conductor layer 153. Forming this opening requires highly accurate forming of a fine opening in the side wall of the Si pillar SPb. However, this cannot be achieved by a known method for forming fine contact holes 112*a*, 112*b*, 112*c*, 112*d*, 114*a*, 114*b*, 132*a*, 132*b*, and 132*c* with high accuracy in a flat region on the semiconductor substrate 104 and the insulating layer substrate 120 described by referring to FIGS. 6 and 7B.

According to the methods for producing SGT-including semiconductor devices described by referring to FIGS. 8, 9, and 10, SGTs are formed on top of the other in each of the Si pillars SPa, SPb, and SPc in a longitudinal direction and Si pillars SPa, SPb, and SPc are formed in which the N-channel SGTs 133*a*, 139*a*, 140*a*, and 140*b*, and P-channel SGTs 133*b* and 139*b* positioned in upper and lower portions of the Si pillars SPa, SPb, and SPc are used in different combinations. According to these production methods, it is difficult to form openings of the connecting parts 161, 164*a*, 164*b*, and 155 in contact with the $N^+$ regions 134*b*, 141*b*, 145*b*, and 146*a* and the $P^+$ regions 135*a* and 142*a* that contain donor or acceptor impurities and openings of the connecting parts 163*a*, 163*b*, 149*a*, 149*b*, and 154 of the gate conductor layers 138*a*, 138*b*, 145*a*, 145*b*, 149*a*, 149*b*, and 153 at predetermined positions with high accuracy.

SUMMARY OF THE INVENTION

It is accordingly an object of the invention to provide a method for producing an SGT-including semiconductor device which overcomes the above-mentioned and other disadvantages of the heretofore-known devices and methods of this general type.

With the foregoing and other objects in view there is provided, in accordance with the invention, a method for producing an SGT-including semiconductor device. The method comprises a semiconductor pillar forming step of forming a semiconductor pillar on a semiconductor substrate; a first impurity region forming step of forming a first impurity region below the semiconductor pillar, the first impurity region containing a donor impurity or an acceptor impurity; a second impurity region forming step of forming a second impurity region in the semiconductor pillar so that the second impurity region is distanced from and above the first impurity region, the second impurity region having the same conductivity type as the first impurity region; a first gate insulating layer forming step of forming a first gate insulating layer on an outer periphery of the semiconductor pillar and on at least a portion of the semiconductor pillar that lies between the first impurity region and the second impurity region; a first gate conductor layer forming step of forming a first gate conductor layer on an outer periphery of the first gate insulating layer; a first insulating layer forming step of forming a first insulating layer so that the first insulating layer covers the semiconductor pillar and the first gate conductor layer; a second insulating layer forming step of forming a second insulating layer on the semiconductor substrate and on an outer periphery of the first insulating layer, the second insulating layer being shorter than the semiconductor pillar; a hydrogen fluoride ion diffusion layer forming step of forming a hydrogen fluoride ion diffusion layer having a particular thickness on the second insulating layer, the hydrogen fluoride ion diffusion layer being capable of generating hydrogen fluoride ions and allowing the hydrogen fluoride ions to diffuse therein; a hydrogen fluoride gas supplying step of supplying hydrogen fluoride gas to the hydrogen fluoride ion diffusion layer; a first insulating layer etching step of etching a part of the first insulating layer in contact with the hydrogen fluoride ion diffusion layer by using the hydrogen fluoride ions generated in the hydrogen fluoride ion diffusion layer from the hydrogen fluoride gas supplied to the hydrogen fluoride ion diffusion layer; and a hydrogen fluoride ion diffusion layer removing step of removing the hydrogen fluoride ion diffusion layer after the first insulating layer etching step. An SGT is constituted by the first impurity region and the second impurity region that respectively function as a source and a drain or vice versa, a part of the semiconductor pillar that lies between the first impurity region and the second impurity region and serves as a channel between the drain and the source, the first gate insulating layer, and the first gate conductor layer.

The method may further include a third impurity region forming step of forming a third impurity region containing a donor impurity or an acceptor impurity on the second impurity region and in the semiconductor pillar, the third impurity region forming step being performed after the second impurity region forming step and before the hydrogen fluoride ion diffusion layer forming step. In the hydrogen fluoride ion diffusion layer forming step, the hydrogen fluoride ion diffusion layer may be formed in a range that extends across where the second impurity region and the third impurity region are formed with respect to an upright direction of the semiconductor pillar. The method may further include a first gate conductor layer etching step of etching the first gate conductor layer by using the first insulating layer as a mask, the first gate conductor layer etching step being performed after the hydrogen fluoride ion diffusion layer removing step.

The method may further include a first gate insulating layer etching step of etching the first gate insulating layer by using one or both of the first insulating layer and the first gate conductor layer as a mask. The first gate insulating layer etching step may be performed after the first gate conductor layer etching step.

A top portion of the second insulating layer may be positioned within a range where the second impurity region is formed in the semiconductor pillar with respect to the upright direction of the semiconductor pillar. The method may further include a first conductor wiring layer forming step of forming a first conductor wiring layer so as to connect exposed portions of the second impurity region and the third impurity region in the semiconductor pillar, the first conductor wiring layer forming step being performed after the first gate insulating layer etching step.

A top portion of the second insulating layer and a bottom portion of the second insulating layer may be positioned within a range where the first gate conductor layer is formed with respect to an upright direction of the semiconductor pillar. The method may further include a second conductor wiring layer forming step of forming a second conductor wiring layer connected to the exposed first gate conductor layer, the second conductor wiring layer forming step being performed after the hydrogen fluoride ion diffusion layer removing step.

The method preferably further includes a third impurity region forming step of forming a third impurity region in the semiconductor pillar and on the second impurity region, the third impurity region containing a donor impurity or an acceptor impurity; a fourth impurity region forming step of forming a fourth impurity region above the third impurity region, the fourth impurity region containing a donor impurity or an acceptor impurity and having the same conductivity type as the third impurity region; a second gate insulating layer forming step of forming a second gate insulating layer on the outer periphery of the semiconductor pillar and on at least a portion of the semiconductor pillar that lies between the third impurity region and the fourth impurity region, the second gate insulating layer being separated from the first gate insulating layer; and a second gate conductor layer forming step of forming a second gate conductor layer on an outer periphery of the second gate insulating layer, the second gate conductor layer being separated from the first gate conductor layer.

In the hydrogen fluoride ion diffusion layer forming step, the hydrogen fluoride ion diffusion layer may be formed so as to be in contact with a part of the first insulating layer in an outer periphery direction so that a top portion of the hydrogen fluoride ion diffusion layer comes within a range of the third impurity region with respect to an upright direction of the semiconductor pillar. A bottom portion of the hydrogen fluoride ion diffusion layer may come within a range of the second impurity region with respect to the upright direction. The method may include a second hydrogen fluoride gas supplying step of supplying hydrogen fluoride gas to the hydrogen fluoride ion diffusion layer; a second insulating layer etching step of etching a part of the first insulating layer in contact with the hydrogen fluoride ion diffusion layer by using the hydrogen fluoride ions generated in the hydrogen fluoride ion diffusion layer from the hydrogen fluoride gas supplied to the hydrogen fluoride ion diffusion layer; and a third gate insulating layer etching step of etching the first gate conductor layer by using the first insulating layer as a mask and then etching the first gate insulating layer by using one or both of the first insulating layer and the first gate conductor layer as a mask, the third gate insulating layer etching step being performed after the hydrogen fluoride ion diffusion layer removing step.

The first impurity region forming step may be performed after the first gate conductor layer forming step.

The method may include a third impurity region forming step of forming a third impurity region in the semiconductor pillar and on the second impurity region, the third impurity region containing a donor impurity or an acceptor impurity, the third impurity region forming step being performed after the second impurity region forming step and before the hydrogen fluoride ion diffusion layer forming step. In the hydrogen fluoride ion diffusion layer forming step, the hydrogen fluoride ion diffusion layer may be formed so as to contact a part of the first insulating layer in an outer periphery direction so that a top portion of the hydrogen fluoride ion diffusion layer comes within a range of the third impurity region with respect to an upright direction of the semiconductor pillar and a bottom portion of the hydrogen fluoride ion diffusion layer comes within a range of the second impurity region with respect to the upright direction. The method may include a second hydrogen fluoride gas supplying step of supplying hydrogen fluoride gas to the hydrogen fluoride ion diffusion layer; a second insulating layer etching step of etching a part of the first insulating layer in contact with the hydrogen fluoride ion diffusion layer by using the hydrogen fluoride ions generated in the hydrogen fluoride ion diffusion layer from the hydrogen fluoride gas supplied to the hydrogen fluoride ion diffusion layer; and a third gate insulating layer etching step of etching the first gate conductor layer by using the first insulating layer as a mask and then etching the first gate insulating layer by using one or both of the first insulating layer and the first gate conductor layer as a mask, the third gate insulating layer etching step being performed after the hydrogen fluoride ion diffusion layer removing step.

According to the present invention, in producing a circuit in which two or more SGTs are formed in one semiconductor pillar in a vertical direction, an opening of a connecting part in contact with a side wall of a gate conductor layer or a source or drain $N^+$ or $P^+$ region that lies between plural SGTs can be formed with high accuracy and separation of a gate conductor layer can be carried out at a desired position with high accuracy.

BRIEF DESCRIPTION OF THE DRAWINGS

FIGS. 2OA to 2OC are respectively a plan view and cross-sectional views of an SRAM cell illustrating the method for producing an SGT-including semiconductor device according to the first embodiment.

DESCRIPTION OF THE PREFERRED EMBODIMENTS

Figure 1A:
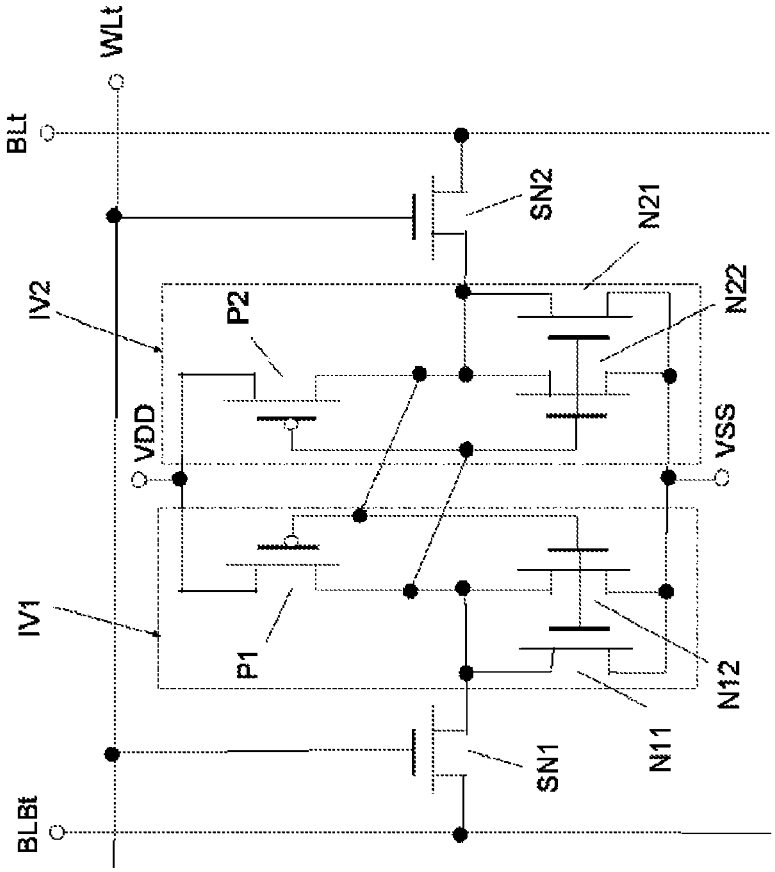
FIG. 1A is a diagram illustrating an SRAM cell circuit according to a first embodiment of the present invention.

Referring now to the figures of the drawing in detail, the following describes SGT-including semiconductor devices and production methods therefor according to several embodiments of the present invention.

First Embodiment

An SGT-including semiconductor device and a production method therefor according to a first embodiment are described below with reference to FIGS. 1A to 1C and 2AA to 2WC.

FIG. 1A is a circuit diagram of a static random access memory (SRAM) cell circuit according to this embodiment. The SRAM cell includes two inverter circuits IV1 and IV2. The inverter circuit IV1 is constituted by a P-channel SGT P1 serving as a load transistor and two N-channel SGTs N11 and N12 serving as drive transistors and being connected in parallel. The inverter circuit IV2 is constituted by a P-channel SGT P2 serving as a load transistor and two N-channel SGTs N21 and N22 serving as drive transistors and being connected in parallel. The gate of the P-channel SGT P1 of the inverter circuit IV1 is connected to the gates of the N-channel SGTs N11 and N12. The drain of the P-channel SGT P2 of the inverter circuit IV2 is connected to the drains of the N-channel SGTs N21 and N22. The gate of the P-channel SGT P2 is connected to the gates of the N-channel SGTs N21 and N22. The drain of the P-channel SGT P1 of the inverter circuit IV1 is connected to the drains of the N-channel SGTs N11 and N12.

As illustrated in FIG. 1A, the sources of the P-channel SGTs P1 and P2 are connected to a power supply terminal VDD. The sources of the N-channel SGTs N11, N12, N21, and N22 are connected to a ground terminal VSS. Selection N-channel SGTs SN1 and SN2 are disposed on the two sides of the inverter circuits IV1 and IV2. The gates of the selection N-channel SGTs SN1 and SN2 are connected to a word line terminal WLt. The drain and source of the selection N-channel SGT SN1 are connected to the drains of the N-channel SGTs N11 and N12 and the P-channel SGT P1 and to an inversion bit line terminal BLBt. The drain and source of the selection N-channel SGT SN2 are connected to the drains of the N-channel SGTs N21 and N22 and the P-channel SGT P2 and to the bit line terminal BLt. As such, a circuit that includes an SRAM cell (hereinafter referred to as an "SRAM cell circuit") according to this embodiment is constituted by a total of eight SGTs, namely, two P-channel SGTs P1 and P2 and six N-channel SGTs N11, N12, N21, N22, SN1, and SN2.

Figure 1B:
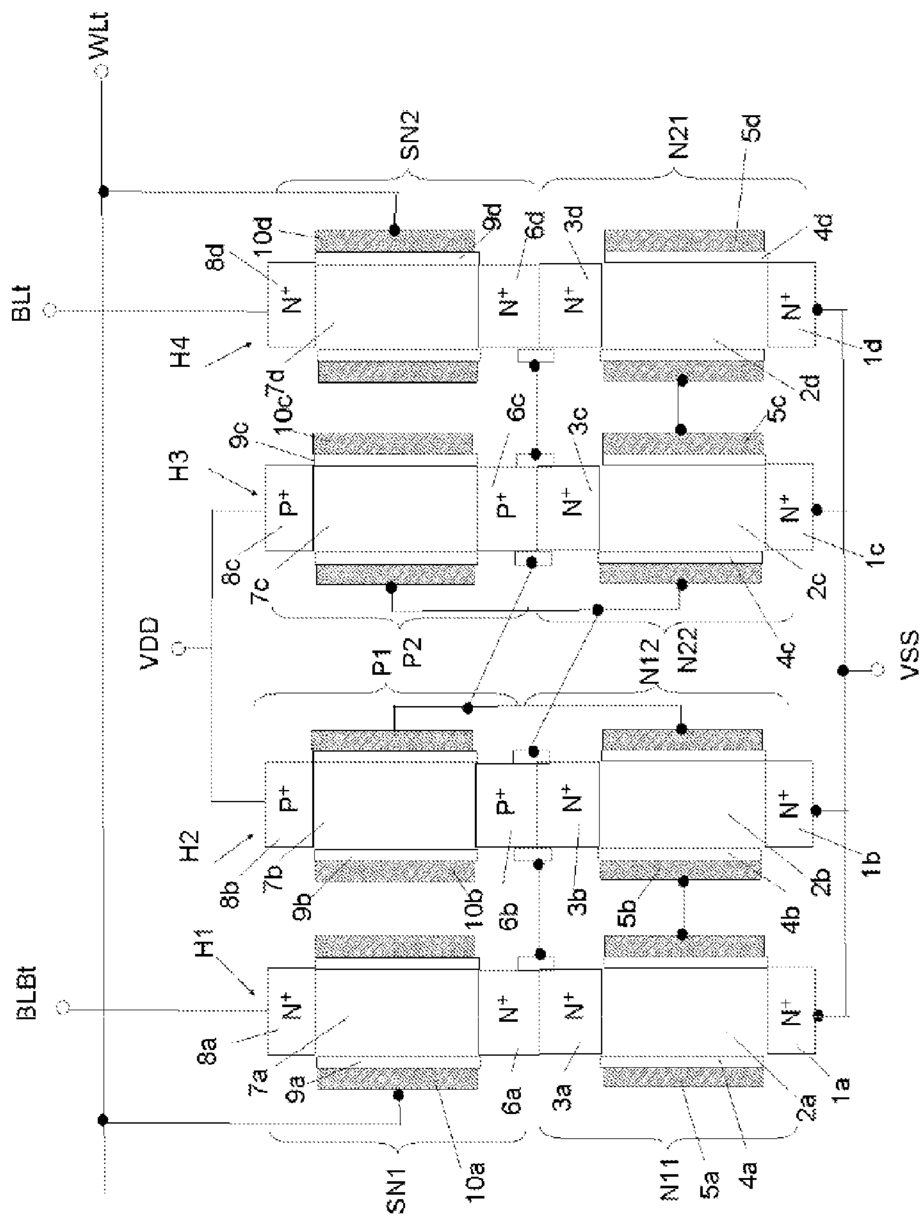
FIG. 1B is a schematic diagram illustrating a structure of the SRAM cell circuit of the first embodiment constituted by four Si pillars.

FIG. 1B is a schematic diagram of the SRAM cell circuit illustrated in FIG. 1A. The SRAM cell circuit is formed by using four Si pillars H1, H2, H3, and H4.

As illustrated in FIG. 1B, a drive N-channel SGT N11 of the inverter circuit IV1 is formed in a lower portion of the Si pillar H1 and a selection N-channel SGT SN1 is formed in an upper portion of the Si pillar H1. A drive N-channel SGT N12 of the inverter circuit IV1 is formed in a lower portion of the Si pillar H2 and a P-channel SGT P1 is formed in an upper portion of the Si pillar H2. A drive N-channel SGT N22 of the inverter circuit IV2 is formed in a lower portion of the Si pillar H3 and a P-channel SGT P2 is formed in an upper portion of the Si pillar H3. A drive N-channel SGT N21 is formed in a lower portion of the Si pillar H4 and a selection N-channel SGT SN2 is formed in an upper portion of the Si pillar H4.

As illustrated in FIG. 1B, in the drive N-channel SGT N11 disposed in the lower portion of the Si pillar H1, a $N^+$ region 1*a*, a channel i-layer 2*a*, and a $N^+$ region 3*a* are continuously disposed next to one another in this order from the lower portion toward the upper portion of the Si pillar H1. A gate insulating layer 4*a* surrounds the channel i-layer 2*a*. A gate conductor layer 5*a* surrounds the gate insulating layer 4*a*.

In the selection N-channel SGT SN1 disposed in the upper portion of the Si pillar H1, a $N^+$ region 6*a*, a channel i-layer 7*a*, and a $N^+$ region 8*a* are continuously disposed next to one another in this order from the lower portion toward the upper portion. A gate insulating layer 9*a* surrounds the channel i-layer 7*a*. A gate conductor layer 10*a* surrounds the gate insulating layer 9*a*. In the drive N-channel SGT N12 disposed in the lower portion of the Si pillar H2, a $N^+$ region 1*b*, a channel i-layer 2*b*, and a $N^+$ region 3*b* are continuously disposed next to one another in this order from the lower portion toward the upper portion of the Si pillar H2. A gate insulating layer 4*b* surrounds the channel i-layer 2*b*. A gate conductor layer 5*b* surrounds the gate insulating layer 4*b*. In the P-channel SGT P1 disposed in the upper portion of the Si pillar H2, a $P^+$ region 6*b*, a channel i-layer 7*b*, and a $P^+$ region 8*b* are continuously disposed next to one another in this order from the lower portion toward the upper portion. A gate insulating layer 9*b* surrounds the channel i-layer 7*b*. A gate conductor layer 10*b* surrounds the gate insulating layer 9*b*.

As illustrated in FIG. 1B, in the drive N-channel SGT N22 disposed in the lower portion of the Si pillar H3, a $N^+$ region 1*c*, a channel i-layer 2*c*, and a $N^+$ region 3*c* are continuously disposed next to one another in this order from the lower portion toward the upper portion of the Si pillar H3. A gate insulating layer 4*c* surrounds the channel i-layer 2*c*. A gate conductor layer 5*c* surrounds the gate insulating layer 4*c*. In the P-channel SGT P2 disposed in the upper portion of the Si pillar H3, a $P^+$ region 6*c*, a channel i-layer 7*c*, and a $P^+$ region 8*c* are continuously disposed next to one another in this order from the lower portion toward the upper portion. A gate insulating layer 9*c* surrounds the channel i-layer 7*c*. A gate conductor layer 10*c* surrounds the gate insulating layer 9*c*. In the drive N-channel SGT N21 disposed in the lower portion of the Si pillar H4, an $N^+$ region 1*d*, a channel i-layer 2*d*, and an $N^+$ region 3*d* are continuously disposed next to one another in this order from the lower portion toward the upper portion of the Si pillar H4. A gate insulating layer 4*d* surrounds the channel i-layer 2*d*. A gate conductor layer 5*d* surrounds the gate insulating layer 4*d*. In the selection N-channel SGT SN2 disposed in the upper portion of the Si pillar H4, a $N^+$ region 6*d*, a channel i-layer 7*d*, and a $N^+$ region 8*d* are continuously disposed next to one another in that order from the lower portion toward the upper portion. A gate insulating layer 9*d* surrounds the channel i-layer 7*d*. A gate conductor layer 10*d* surrounds the gate insulating layer 9*d*.

As illustrated in FIG. 1B, the gate conductor layer 10*b* of the P-channel SGT P1 of the inverter circuit IV1 is connected to the gate conductor layer 5*b* and the gate conductor layer 5*a* of the N-channel SGTs N11 and N12. The gate conductor layers 10*b*, 5*b*, and 5*a* are connected to the $P^+$ region 6*c* of the P-channel SGT P2 and the $N^+$ regions 3*c* and 3*d* of the drive N-channel SGTs N21 and N22. Likewise, the gate conductor layer 10*c* of the P-channel SGT P2 of the inverter circuit IV2 is connected to the gate conductor layers 5*c* and 5*d* of the drive N-channel SGTs N21 and N22. The gate conductor layers 10*c*, 5*c*, and 5*d* are connected to the $P^+$ region 6*b* of the P-channel SGT P1 and the $N^+$ regions 3*a* and 3*b* of the drive N-channel SGTs N11 and N12.

As illustrated in FIG. 1B, the $P^+$ regions 8*b* and 8*c* of the P-channel SGTs P1 and P2 are connected to a power source terminal VDD. The $N^+$ regions l*a*, 1*b*, 1*c*, and 1*d* of the drive N-channel SGTs N11, N12, N21, and N22 are connected to a ground terminal VSS. The gate conductor layers 10*a* and 10*d* of the selection N-channel SGTs SN1 and SN2 are connected to a word line WLt. The $N^+$ region 6*a* of the selection N-channel SGT SN1 is connected to the $N^+$ regions 3*a* and 3*b* of the N-channel SGTs N11 and N12 and the $P^+$ region 6*b* of the load P-channel SGT P1. The $N^+$ region 6*d* of the selection N-channel SGT SN2 is connected to the $N^+$ regions 3*c* and 3*d* of the drive N-channel SGTs N21 and N22. The $N^+$ region 8*a* of the selection N-channel SGT SN1 is connected to an inversion bit line terminal BLBt. The $N^+$ region 8*d* of the selection N-channel SGT SN2 is connected to a bit line terminal BLt. In the first embodiment, eight SGTs constituting the SRAM cell are formed in four Si pillars H1, H2, H3, and H4.

Figure 1C:
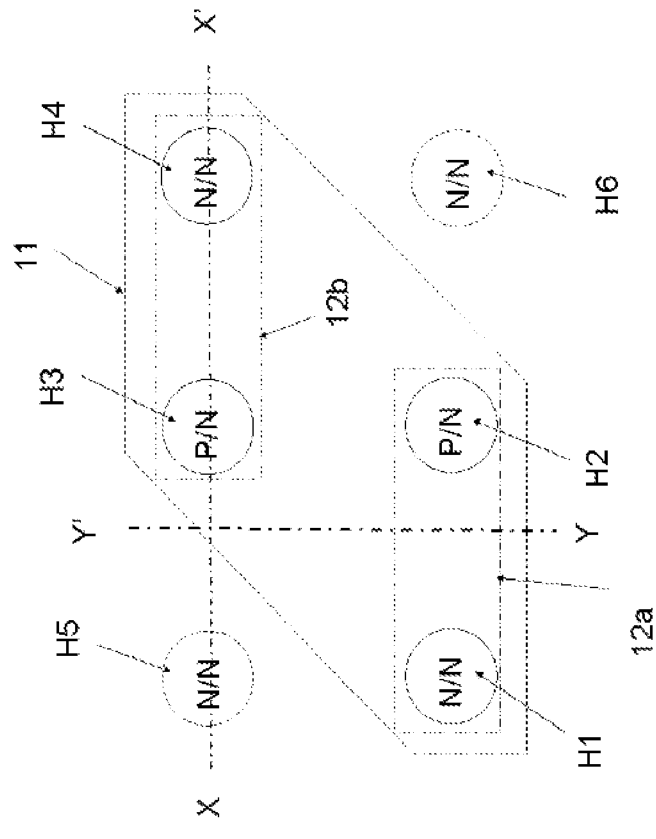
FIG. 1C is a plan view showing an arrangement of Si pillars in the SRAM cell circuit of the first embodiment.

FIG. 1C is a schematic plan view of the arrangement of the Si pillars H1, H2, H3, and H4 in the SRAM cell circuit illustrated in FIGS. 1C and 1B as viewed in the perpendicular direction. As illustrated in FIG. 1C, one SRAM cell is formed within a broken line region 11 that includes the Si pillars H1, H2, H3, and H4. The inverter circuit IV1 and the selection N-channel SGT SN1 are formed within a two-dot chain line region 12*a* that includes the Si pillars H1 and H2. The inverter circuit IV2 and the selection N-channel SGT SN2 are formed within a two-dot chain line region 12*b* that includes the Si pillars H3 and H4. Each of the Si pillars H5 and H6 includes a drive N-channel SGT and a selection N-channel SGT of the SRAM cell circuit. The two SGTs are adjacent to and in contact with each other in the perpendicular direction. The Si pillars H1, H2, and H6 are arranged on a straight line extending in a horizontal direction. The Si pillars H5, H3, and H4 are arranged on another straight line extending in a horizontal direction. The Si pillars H1 and H5 are arranged on a straight line extending in a perpendicular direction and so are the Si pillars H2 and H3, and the Si pillars H6 and H4. In a semiconductor device that includes such an SRAM cell circuit, the SRAM cell in the broken line region 11 is two-dimensionally arranged on a substrate that extends in a horizontal direction.

Figure 2A:
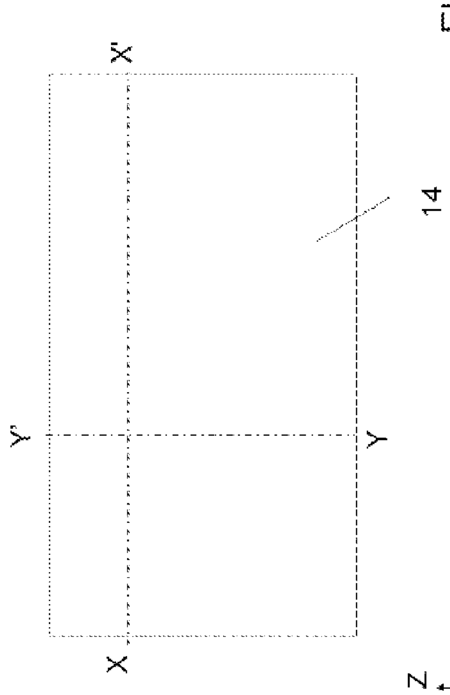
FIGS. 2AA to 2AC are respectively a plan view and cross-sectional views of an SRAM cell illustrating a method for producing an SGT-including semiconductor device according to a first embodiment.
Figure 2A:
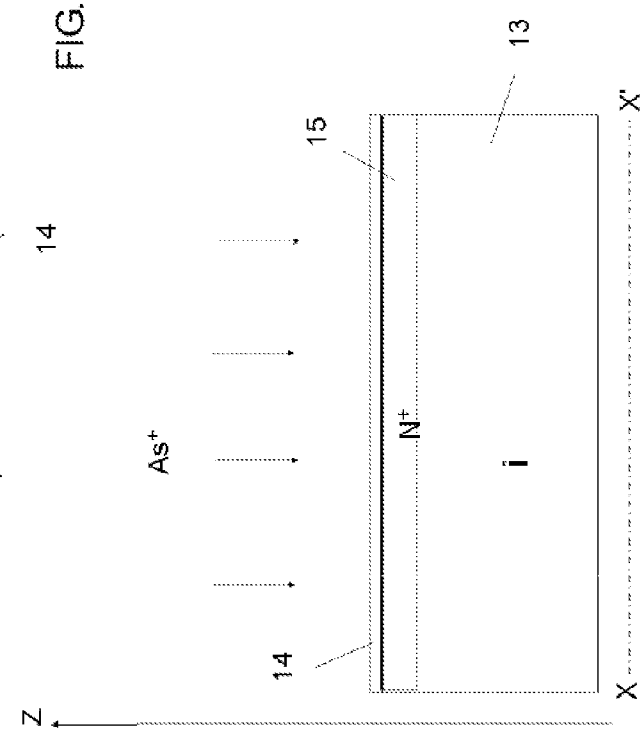
Figure 2A:
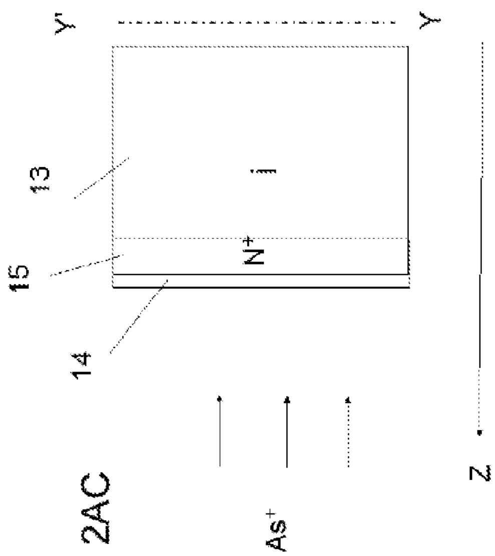

FIGS. 2AA to 2AC are respectively a plan view and cross-sectional views that show a first production step of a method for producing an SRAM cell circuit according to this embodiment (the region shown in the plan view corresponds to the region where the Si pillars H1 to H6 are arranged in FIG. 1C). FIG. 2AA is a plan view, FIG. 2AB is a cross-sectional view taken along line X-X' (corresponding to line X-X' in FIG. 1C), and FIG. 2AC is a cross-sectional view taken along line Y-Y' (corresponding to line Y-Y' in FIG. 1C). In FIGS. 2AA to 4DC, the drawings whose reference ends with A, B, and C also respectively present the same types of drawings.

The method for producing an SRAM cell circuit shown in FIGS. 1A, 1B, and 1C will now be described with reference to FIGS. 2AA to 2WC.

First, as illustrated in FIGS. 2AA to 2AC, a $SiO_2$ layer 14 is formed on an i-layer substrate 13 by, for example, a thermal oxidation process. Arsenic ions (As+) are implanted from above the $SiO_2$ layer 14 so as to form an $N^+$ region 15 in a surface layer portion of the i-layer substrate 13.

Figure 2B:
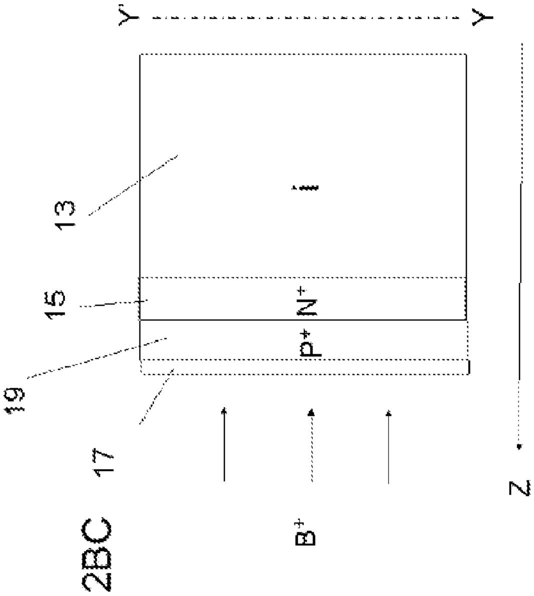
FIGS. 2BA to 2BC are respectively a plan view and cross-sectional views of an SRAM cell illustrating the method for producing an SGT-including semiconductor device according to the first embodiment.
Figure 2B:
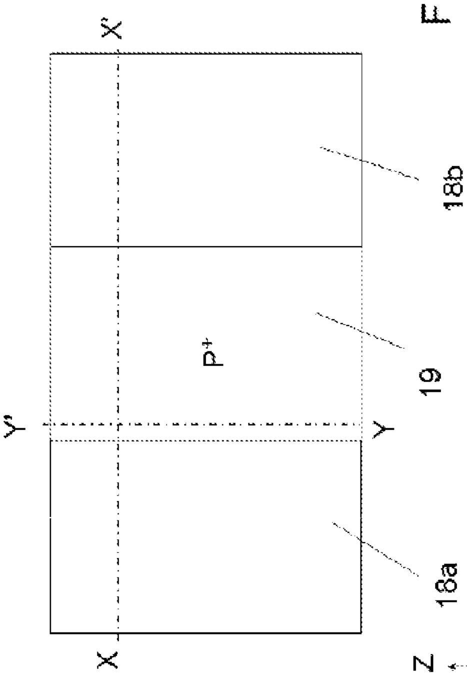
Figure 2B:
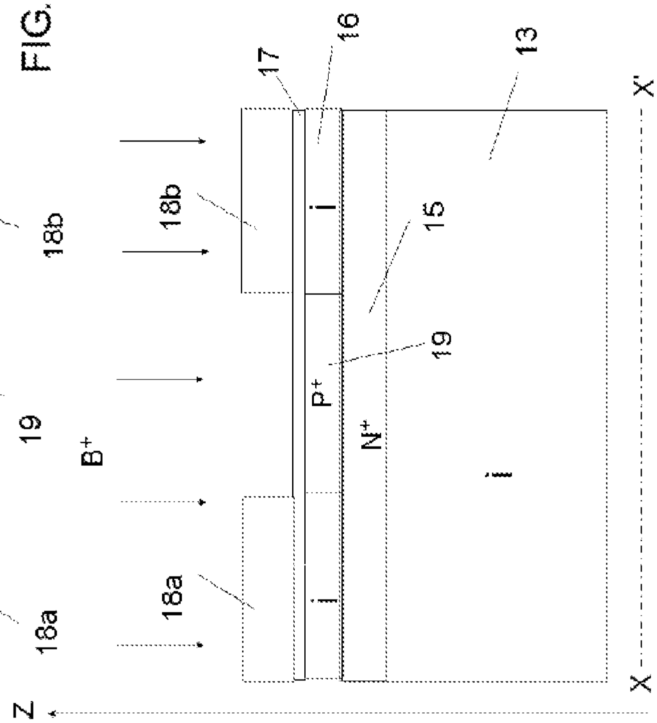

Then, as illustrated in FIGS. 2BA to 2BC, the $SiO_2$ layer 14 is removed and an i-layer (intrinsic semiconductor layer) 16 is formed on the $N^+$ region 15 by, for example, a low-temperature epitaxial growth process. A $SiO_2$ layer 17 is formed on the i-layer 16 by, for example, a CVD process. Then resist layers 18$a$ and 18$b$ are formed on the $SiO_2$ layer 17 so as to cover the regions where the Si pillars H5, H1, H4, and H6 are to be formed. Boron ions ($B^+$), which are acceptor impurity ions, are implanted from above the upper surface of the i-layer substrate 13 so as to form a $P^+$ region 19 in the portion of the i-layer 16 not covered with the resist layers 18$a$ and 18$b$.

Figure 2C:
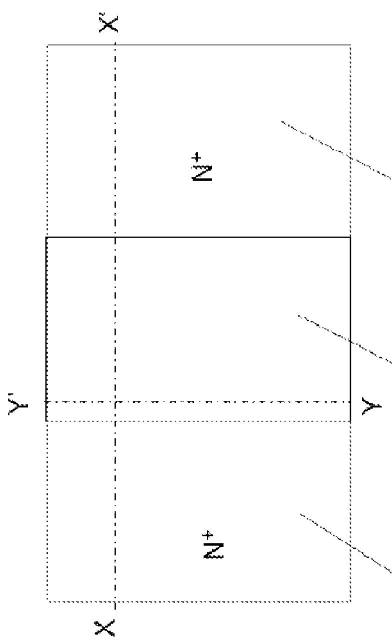
FIGS. 2CA to 2CC are respectively a plan view and cross-sectional views of an SRAM cell illustrating the method for producing an SGT-including semiconductor device according to the first embodiment.
Figure 2C:
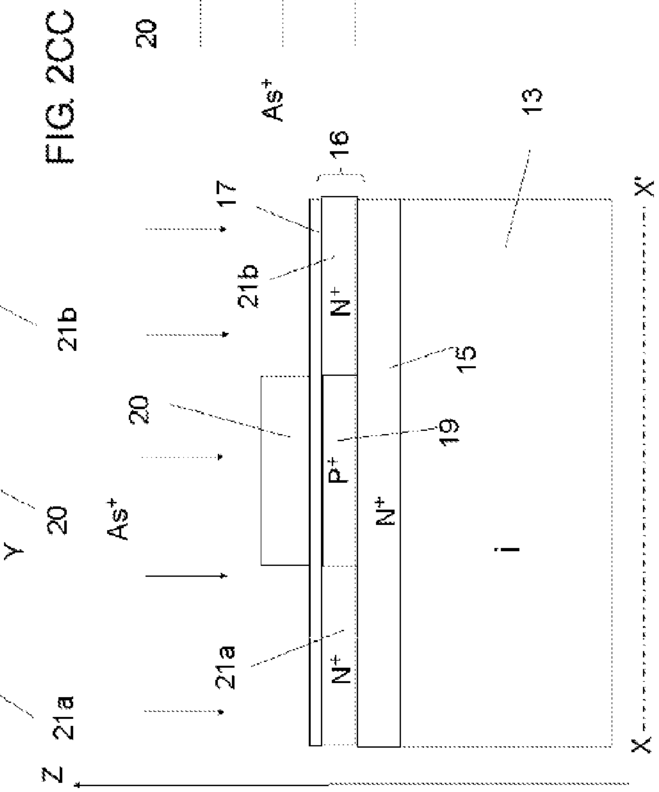
Figure 2C:
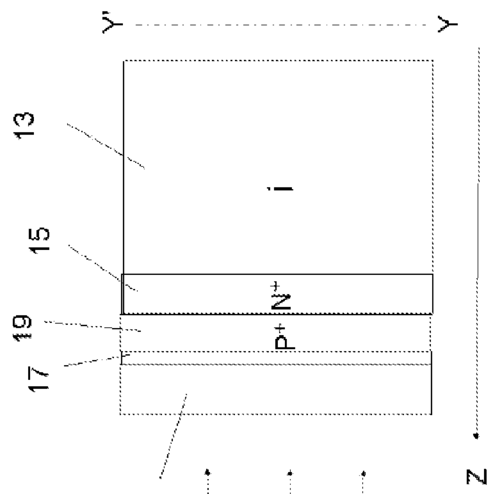

Then, as illustrated in FIGS. 2CA to 2CC, the resist layers 18$a$ and 18$b$ are removed and a resist layer 20 is formed on the $SiO_2$ layer 17 so as to cover the region where the Si pillars H2 and H3 are to be formed. Arsenic ions ($As^+$) serving as a donor impurity are implanted from above the surface of the i-layer substrate 13 so as to form $N^+$ regions 21$a$ and 21$b$ in the i-layer 16.

Figure 2D:
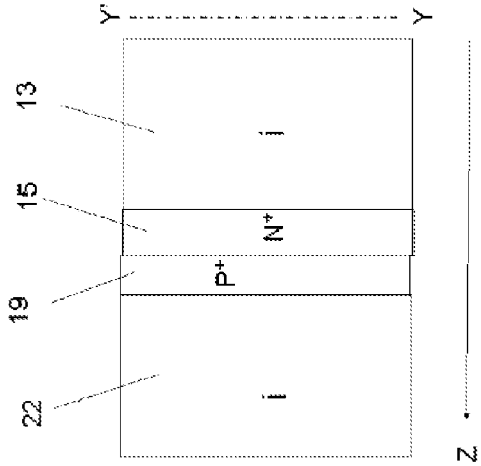
FIGS. 2DA to 2DC are respectively a plan view and cross-sectional views of an SRAM cell illustrating the method for producing an SGT-including semiconductor device according to the first embodiment.
Figure 2D:
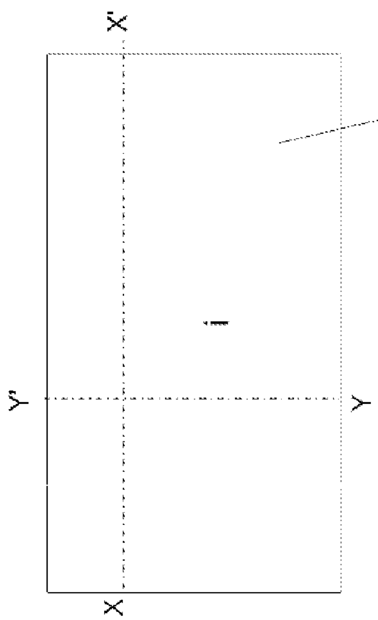
Figure 2D:
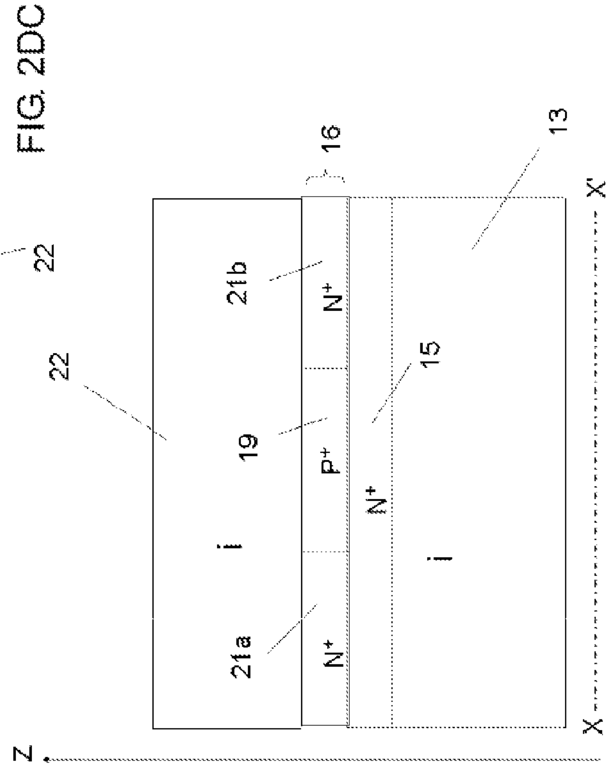

Then, as illustrated in FIGS. 2DA to 2DC, the $SiO_2$ layer 17 is removed. An i-layer 22 is formed by, for example, a low-temperature Si epitaxial growth process on the $N^+$ regions 21$a$ and 21$b$ and the $P^+$ region 19 uncovered as a result of removal of the $SiO_2$ layer 17. Subsequently, $SiO_2$ layers 23$a$, 23$b$, 23$c$, 23$d$, 23$e$, and 23$f$ are formed on the i-layer 22.

Figure 2E:
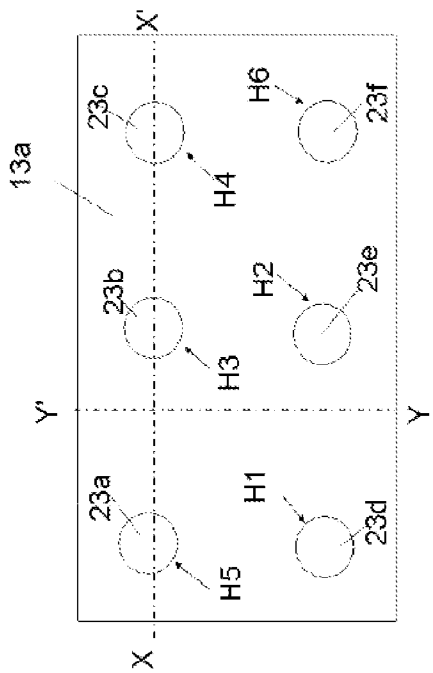
FIGS. 2EA to 2EC are respectively a plan view and cross-sectional views of an SRAM cell illustrating the method for producing an SGT-including semiconductor device according to the first embodiment.
Figure 2E:
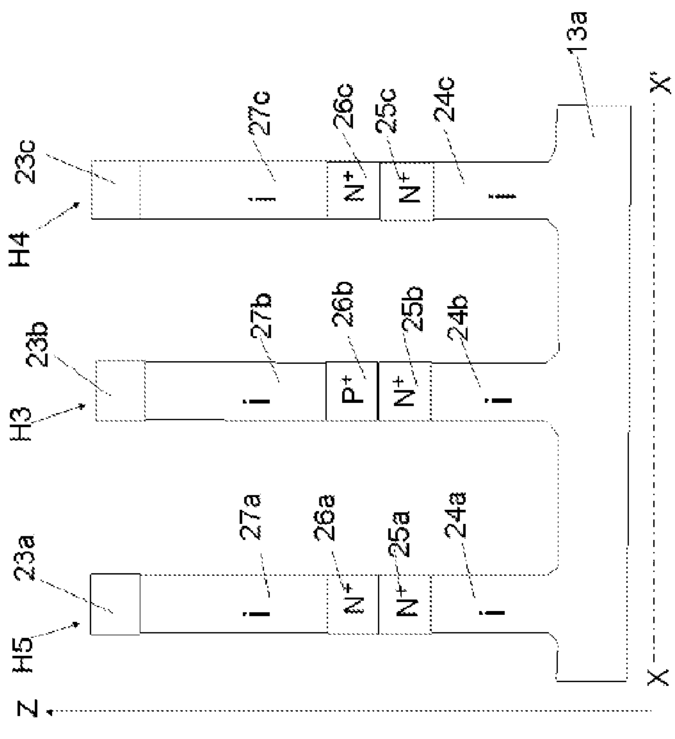
Figure 2E:
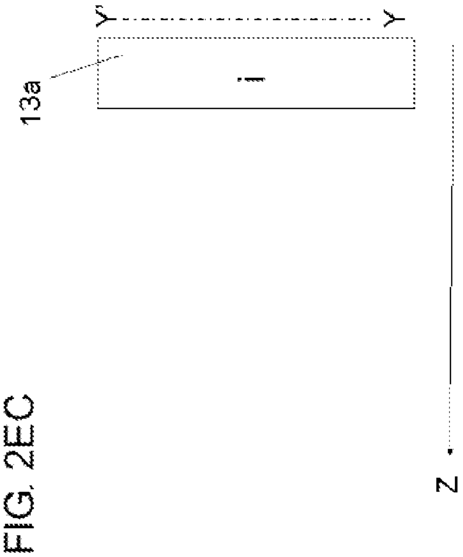

Then, as illustrated in FIGS. 2EA to 2EC, the i-layer 22, the $N^+$ regions 21$a$ and 21$b$, the $P^+$ region 19, the $N^+$ region 15, and the i-layer substrate 13 are etched by, for example, a reactive ion etching (RIE) process by using the $SiO_2$ layers 23$a$, 23$b$, 23$c$, 23$d$, 23$e$, and 23$f$ as an etching mask. As a result, Si pillars H1 to H6 are formed (the positional relationship among the Si pillars H1 to H6 corresponds to the positional relationship among the Si pillars H1 to H6 in FIG. 1C). Consequently, in the Si pillar H5, an i-layer 24$a$, an $N^+$ region 25$a$, an $N^+$ region 26$a$, an i-layer 27$a$, and a $SiO_2$ layer 23$a$ are formed at levels higher than an i-layer substrate 13$a$. In the Si pillar H3, an i-layer 24$b$, an $N^+$ region 25$b$, a $P^+$ region 26$b$, an i-layer 27$b$, and a $SiO_2$ layer 23$b$ are formed at levels higher than the i-layer substrate 13$a$. In the Si pillar H4, an i-layer 24$c$, an $N^+$ region 25$c$, an $N^+$ region 26$c$, an i-layer 27$c$, and a $SiO_2$ layer 23$c$ are formed at levels higher than the i-layer substrate 13$a$.

Figure 2F:
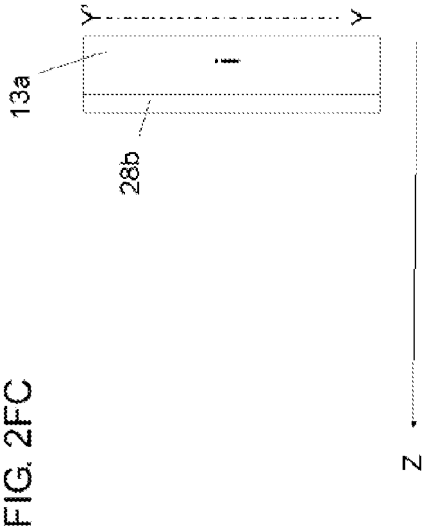
FIGS. 2FA to 2FC are respectively a plan view and cross-sectional views of an SRAM cell illustrating the method for producing an SGT-including semiconductor device according to the first embodiment.
Figure 2F:
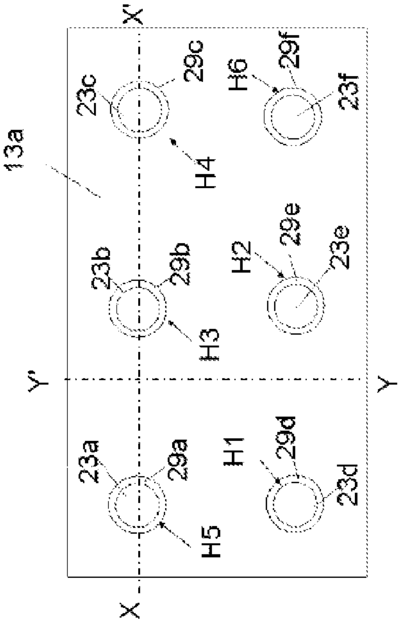
Figure 2F:
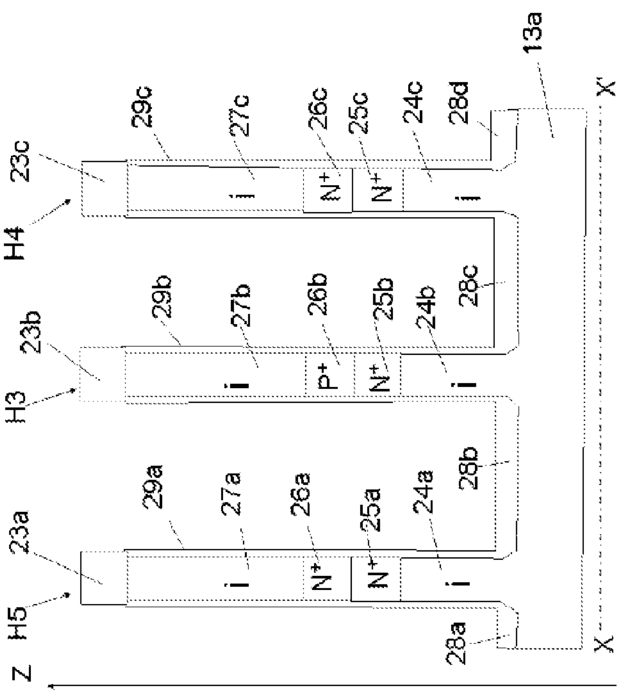

Next, as illustrated in FIGS. 2FA to 2FC, a $SiO_2$ layer is deposited by CVD on the i-layer substrate 13$a$ and the Si pillars H1 to H6. The entire $SiO_2$ layer is etched by an isotropic plasma etching process. As a result, the $SiO_2$ layer on the side walls of the Si pillars H1 to H6 are removed but $SiO_2$ layers 28$a$, 28$b$, 28$c$, and 28$d$ remain on the i-layer substrate 13$a$. This process takes an advantage of the phenomenon that when a $SiO_2$ film is deposited by CVD, the deposited $SiO_2$ film is thinner on the side walls of the Si pillars H1 to H6 than on the i-layer substrate 13$a$. Then $SiO_2$ layers 29$a$, 29$b$, 29$c$, 29$d$, 29$e$, and 29$f$ are formed on the outer peripheries of the Si pillars H1 to H6 by a thermal oxidation process.

Figure 2G:
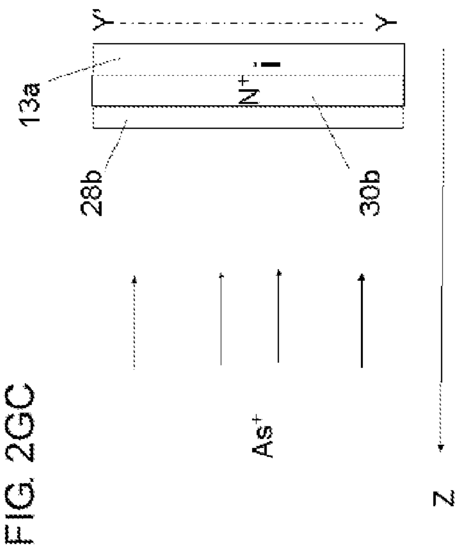
FIGS. 2GA to 2GC are respectively a plan view and cross-sectional views of an SRAM cell illustrating the method for producing an SGT-including semiconductor device according to the first embodiment.
Figure 2G:
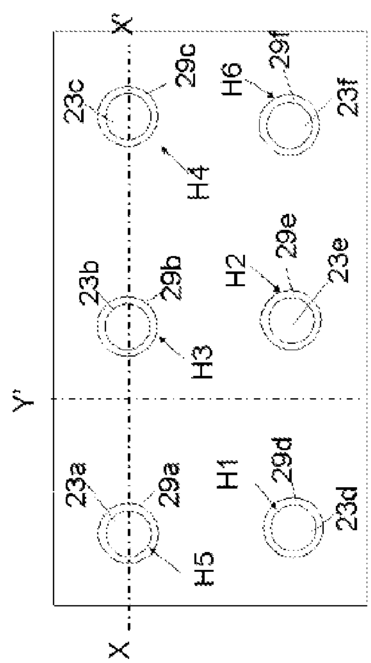
Figure 2G:
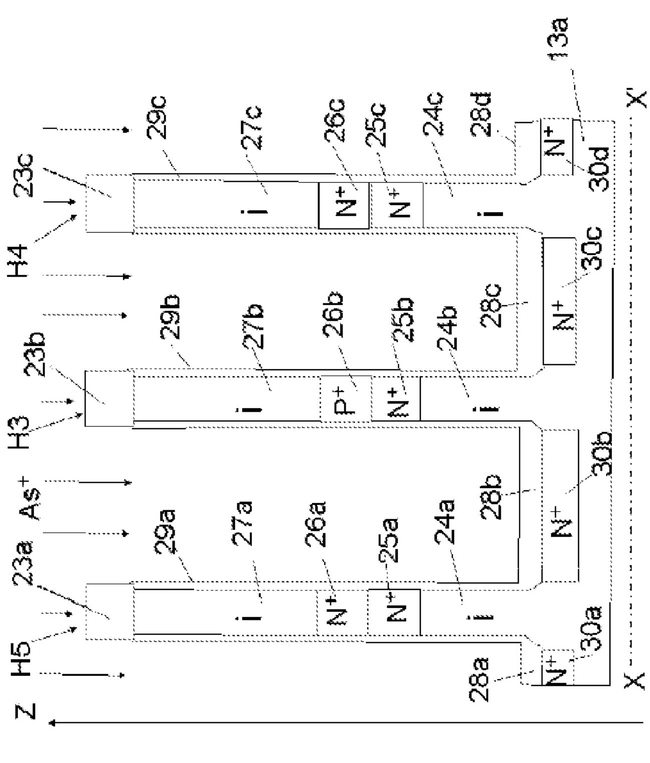

As illustrated in FIGS. 2GA to 2GC, arsenic ion ($As^+$) serving as a donor impurity are implanted into the upper surface of the i-layer substrate 13$a$ from above the i-layer substrate 13$a$ so as to form $N^+$ regions 30$a$, 30$b$, 30$c$, and 30$d$ in the surface layer portion of the i-layer substrate 13$a$ not covered by the Si pillars H1 to H6. The $N^+$ region 30$a$, 30$b$, 30$c$, and 30$d$ are continuously connected to one another in the surface layer portion of the i-layer substrate 13$a$ located outside the Si pillars H1 to H6.

Figure 2H:
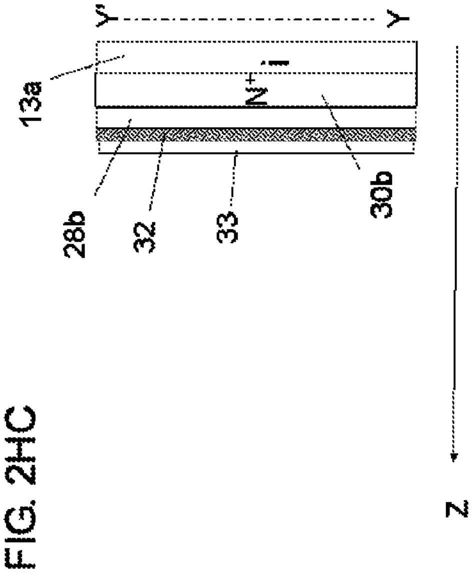
FIGS. 2HA to 2HC are respectively a plan view and cross-sectional views of an SRAM cell illustrating the method for producing an SGT-including semiconductor device according to the first embodiment.
Figure 2H:
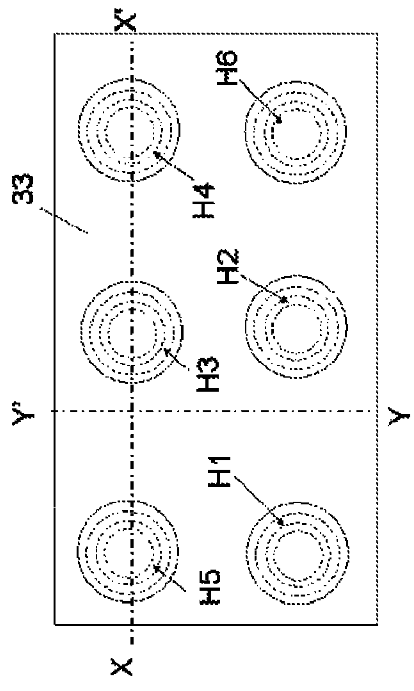
Figure 2H:
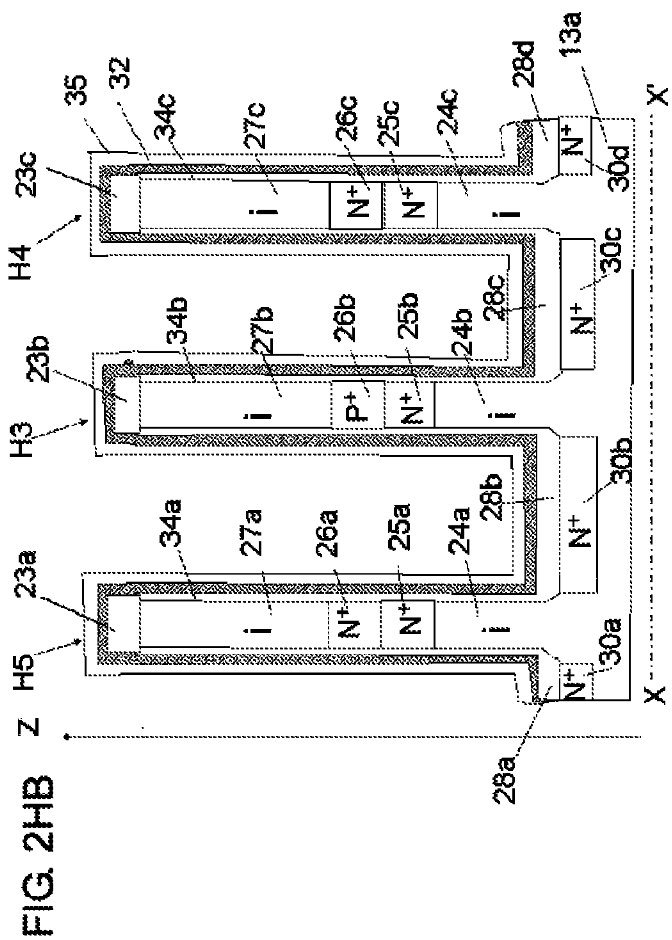

As illustrated in FIGS. 2HA to 2HC, the $SiO_2$ layers 29$a$, 29$b$, 29$c$, 29$d$, 29$e$, and 29$f$ on the outer peripheries of the Si pillars H1 to H6 are removed and gate $SiO_2$ layers 34$a$, 34$b$, and 34$c$ are formed on the outer peripheries of the Si pillars H1 to H6 by a thermal oxidation process. Then a titanium nitride (TiN) layer 32 serving as a gate conductor layer is formed on the entire structure by, for example, an atomic layer deposition (ALD) process and a $SiO_2$ layer 35 is formed by a CVD process.

Figure 2I:
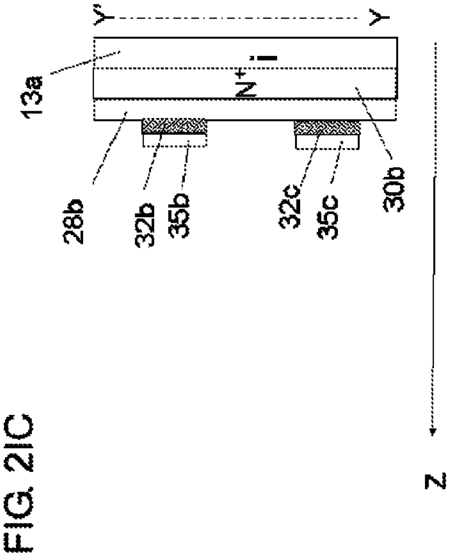
FIGS. 2IA to 2IC are respectively a plan view and cross-sectional views of an SRAM cell illustrating the method for producing an SGT-including semiconductor device according to the first embodiment.
Figure 2I:
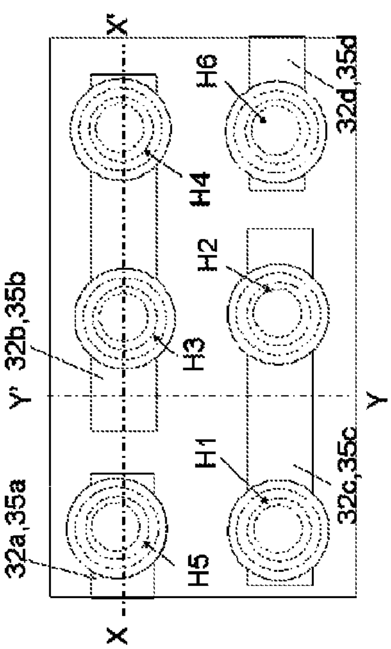
Figure 2I:
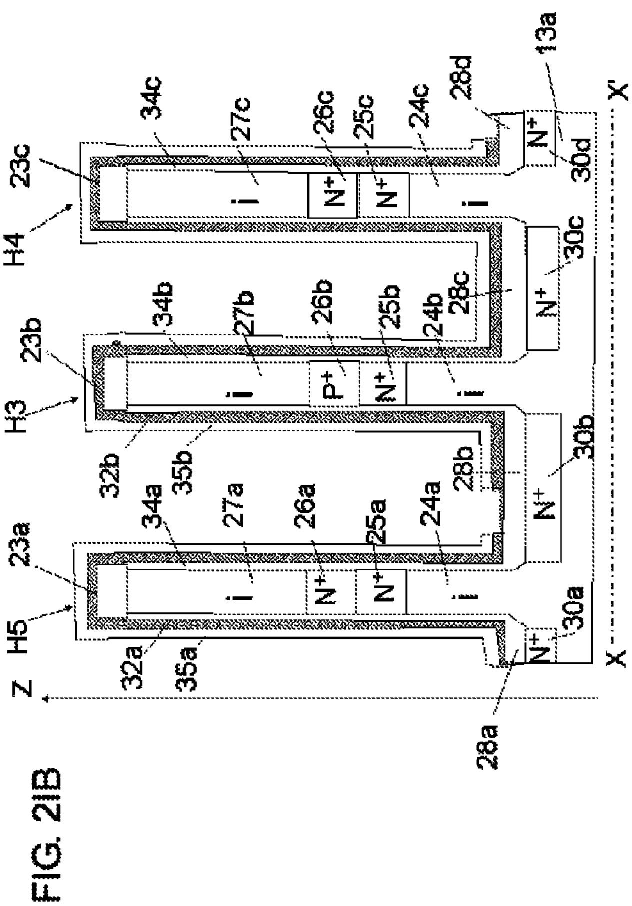

As illustrated in FIG. 2IA, a TiN layer 32$b$ and a $SiO_2$ layer 35$b$ that cover the Si pillars H3 and H4 and are connected to each other are formed by a lithographic process and a RIE process. At the same time as forming the TiN layer 32$b$ and the $SiO_2$ layer 35$b$, a TiN layer 32$a$ and a $SiO_2$ layer 35$a$ that cover the Si pillar H5 are formed. The same process is conducted on the Si pillars H1, H2, and H6 shown in FIG. 2IA so as to form TiN layers 32$c$ and 32$d$ and $SiO_2$ layers 35$c$ and 35$d$.

Figure 2J:
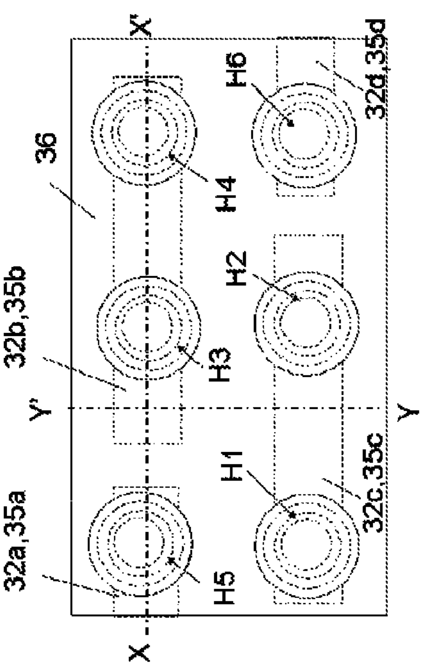
FIGS. 2JA to 2JC are respectively a plan view and cross-sectional views of an SRAM cell illustrating the method for producing an SGT-including semiconductor device according to the first embodiment.
Figure 2J:
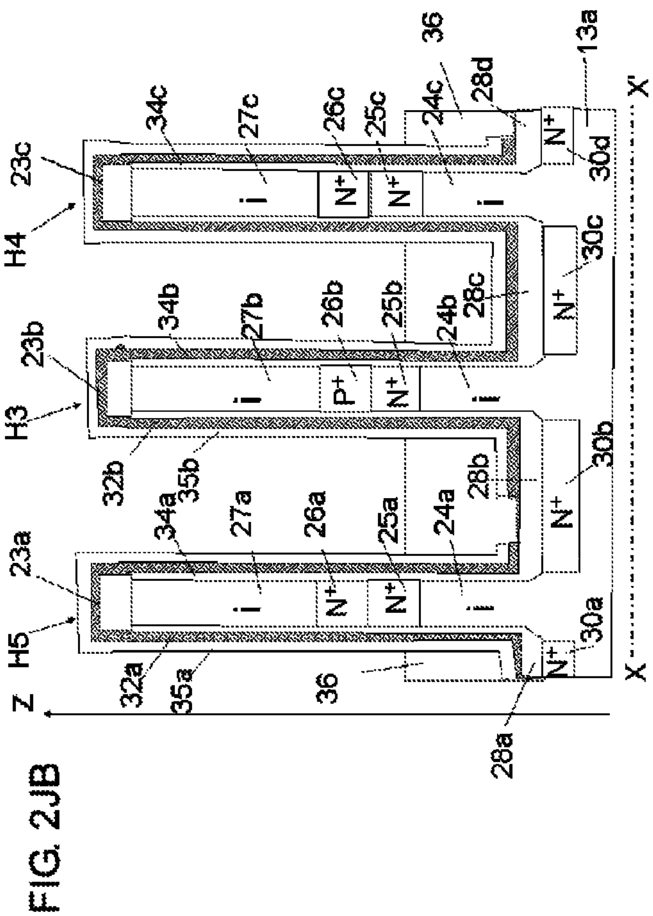
Figure 2J:
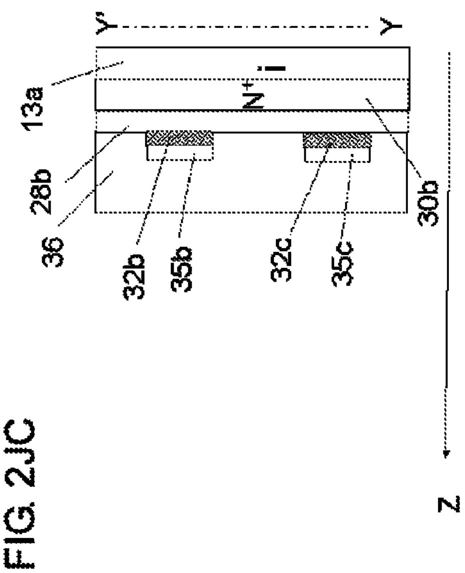

As illustrated in FIGS. 2JA to 2JC, for example, a silicon nitride (SiN) layer 36 is formed on the i-layer substrate 13$a$ so as to be at a level lower than the top portions of the Si pillars H1 to H6. The surface of the SiN layer 36 comes within the range of the length of the $N^+$ regions 25$a$, 25$b$, and 25$c$ of the Si pillars H1 to H6 in the perpendicular direction.

Figure 2K:
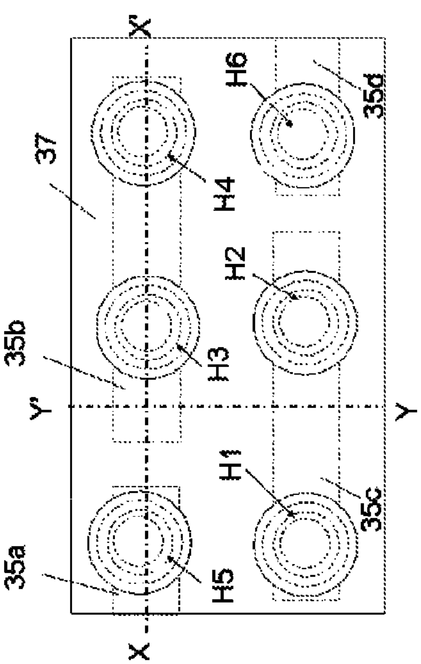
FIGS. 2KA to 2KC are respectively a plan view and cross-sectional views of an SRAM cell illustrating the method for producing an SGT-including semiconductor device according to the first embodiment.
Figure 2K:
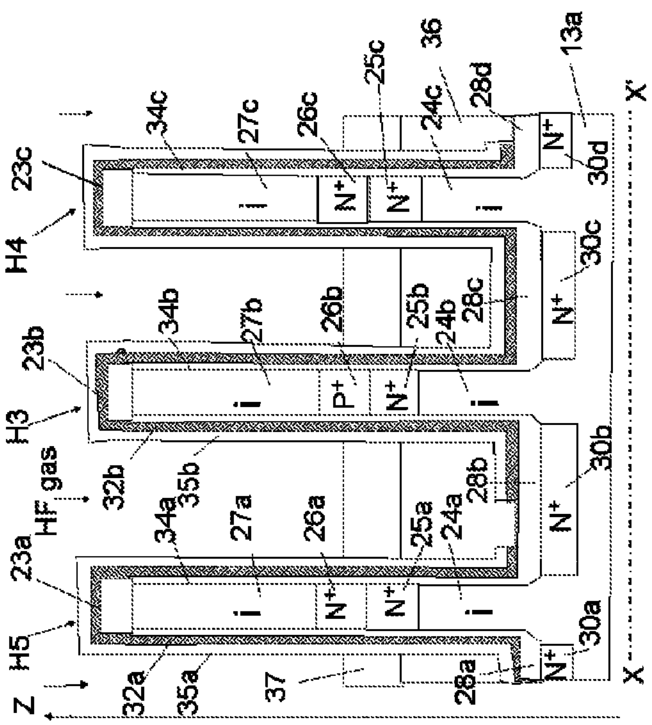
Figure 2K:
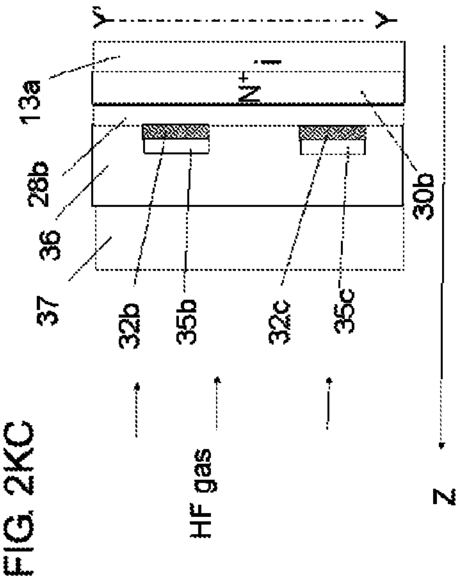

As illustrated in FIGS. 2KA to 2KC, a resist layer 37 is formed on the SiN layer 36. The resist layer 37 is planarized by performing a heat treatment at about 200° C., for example. The surface of the resist layer 37 comes within the range of the length of the $N^+$ regions 26$a$ and 26$c$ and the $P^+$ region 26$b$ in the perpendicular direction. Then hydrogen fluoride gas (hereinafter referred to as HF gas) is fed to the entire structure. For example, when a heating environment of 180° C. is created, the HF gas diffuses into the resist layer 37, is ionized by moisture contained in the resist layer 37, and forms hydrogen fluoride ions ($HF_2^+$, hereinafter referred to as HF ions). The HF ions diffuse into the resist layer 37 and partly etch the $SiO_2$ layers 35$a$ and 35$b$ in contact with the resist layer 37. The parts of the $SiO_2$ layers 35$a$ and 35$b$ not in contact with the resist layer 37 are etched with HF ions ($HF_2^+$). The parts of the $SiO_2$ layers 35$a$ and 35$b$ not in contact with the resist layer 37 are etched slower than the parts of the $SiO_2$ layers 35$a$ and 35$b$ in contact with the resist layer 37 and thus remain on the outer peripheries of the Si pillars H1 to H6. The resist layer 37 is then removed (refer to Tadashi Shibata, Susumu Kohyama, and Hisakazu lizuka: "A New Field Isolation Technology for High Density MOS LSI", Japanese Journal of Applied Physics, Vol. 18, pp. 263-267 (1979) for the mechanism of etching described here).

Figure 2L:
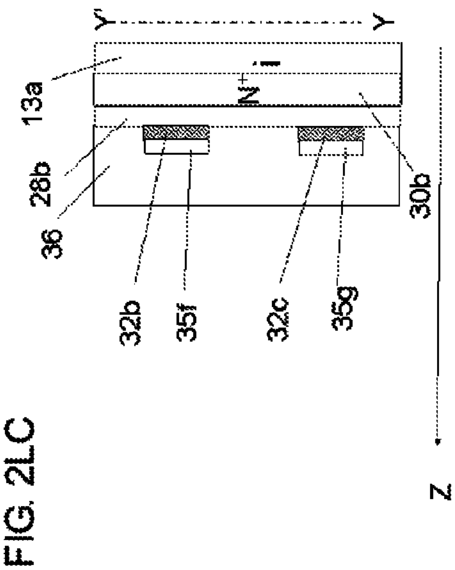
FIGS. 2LA to 2LC are respectively a plan view and cross-sectional views of an SRAM cell illustrating the method for producing an SGT-including semiconductor device according to the first embodiment.
Figure 2L:
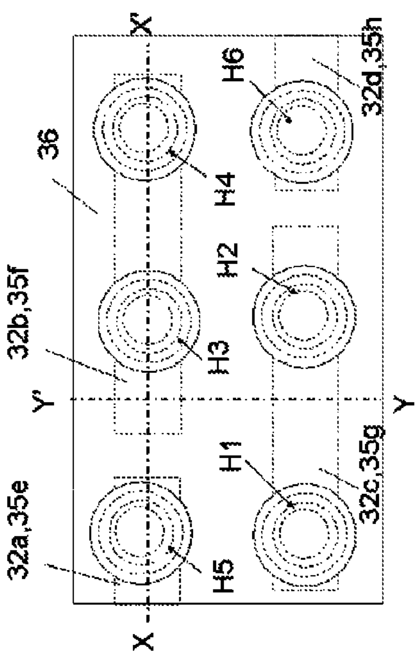
Figure 2L:
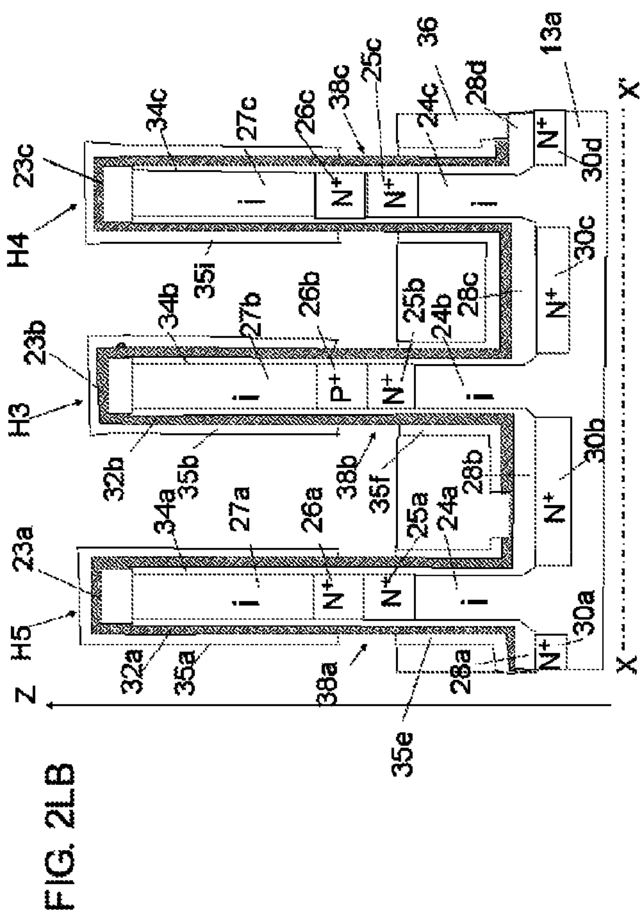

As illustrated in FIGS. 2LA to 2LC, the parts of the $SiO_2$ layers 35*a*, 35*b*, and 35*i* which have been in contact with the resist layer 37 are removed by etching. As a result, openings 38*a*, 38*b*, and 38*c* that expose the TiN layers 32*a* and 32*b* are formed on the outer periphery of the Si pillars H5, H3, and H4. At the same time with formation of the openings 38*a*, 38*b*, and 38, the TiN layers 32*c* and 32*d* in contact with the resist layer 37 are exposed at the outer periphery of the Si pillars H1, H2, and H6 as well. As a result, the lower portion and the upper portion of the $SiO_2$ layer 35*a* are separated from each other in the Si pillar H5, and a $SiO_2$ layer 35*e* is formed in the lower portion. The lower portion and the upper portion of the $SiO_2$ layer 35*b* are separated from each other in the Si pillar H3 and a $SiO_2$ layer 35*f* is formed. The upper portion and the lower portion of the $SiO_2$ layer 35*i* are separated from each other in the Si pillar H4 and the $SiO_2$ layer 35*f* is formed. Similarly, a $SiO_2$ layer 35*g* is formed in the lower portions of the Si pillars H1 and H2 and a $SiO_2$ layer 35*h* is formed in the lower portion of the Si pillar H6.

Figure 2M:
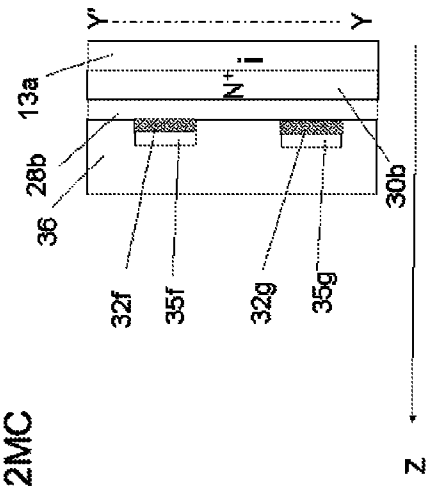
FIGS. 2MA to 2MC are respectively a plan view and cross-sectional views of an SRAM cell illustrating the method for producing an SGT-including semiconductor device according to the first embodiment.
Figure 2M:
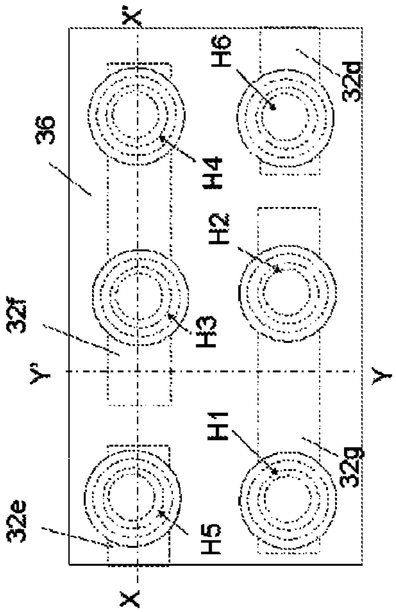
Figure 2M:
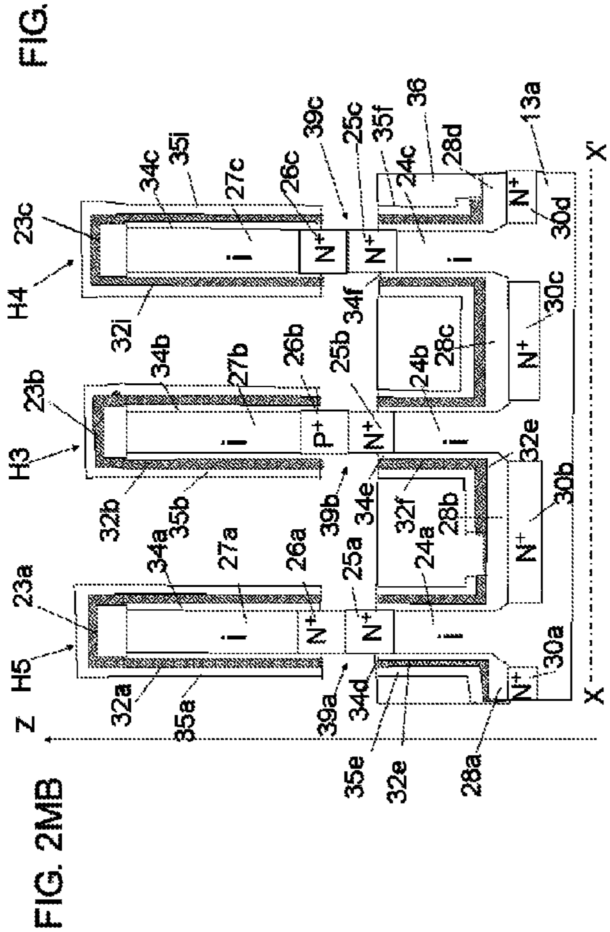

As illustrated in FIGS. 2MA to 2MC, the TiN layers 32*a*, 32*b*, 32*c*, and 32*d* are etched by using the $SiO_2$ layers 35*a*, 35*b*, 35*i*, 35*e*, and 35*f* as an etching mask. In the Si pillar H5, the lower portion of the TiN layer 32*a* is separated and a TiN layer 32*e* is formed as a result of this etching. In the Si pillar H3, the lower portion of the TiN layer 32*b* is separated and a TiN layer 32*f* is formed. In the Si pillar H4, the upper portion of the TiN layer 32*b* is separated and a TiN layer 32*i* is formed. Likewise, a TiN layer 32*g* is formed in the lower portions of the Si pillars H1 and H2. The TiN layer 32*d* of the Si pillar H6 is separated into a lower portion and an upper portion.

As a result of the process described above, TiN layers 32*e*, 32*f*, 32*g*, and 32*d* are formed in the Si pillars H1 to H6 as illustrated in FIG. 2MA.

Then, as illustrated in FIG. 2MB, the gate $SiO_2$ layers 34*a*, 34*b*, and 34*c* are etched by using the TiN layers 32*a*, 32*b*, 32*i*, 32*e*, and 32*f* as an etching mask. During this etching, the $SiO_2$ layers 35*a*, 35*b*, 35*i*, 35*e*, and 35*f* can be used as an etching mask in addition to or instead of the TiN layers 32*a*, 32*b*, 32*i*, 32*e*, and 32*f*. When the thickness of the $SiO_2$ layers 35*a*, 35*b*, and 35*i* are adjusted to be larger than the thickness of the $SiO_2$ layers 34*a*, 34*b*, and 34*c*, the $SiO_2$ layers 35*a*, 35*b*, and 35*i* can remain after etching of the gate $SiO_2$ layers 34*a*, 34*b*, and 34*c*. Each of the gate $SiO_2$ layers 34*a*, 34*b*, and 34*c* is separated into a lower portion and an upper portion. $SiO_2$ layers 34*d*, 34*e*, and 34*f* are formed in the lower portions.

Next, as illustrated in 2NB, the exposed portions of the TiN layers 32*a*, 32*b*, 32*i*, 32*e*, and 32*f* are oxidized to form TiO layers 40*a*, 40*b*, 40*c*, 41*a*, 41*b*, and 41*c* composed of titanium oxide. A $SiO_2$ layer 42 is formed by CVD over the entire structure. The deposited $SiO_2$ layer 42 is relatively thin on the side walls of the Si pillars H1 to H6 and is relatively thick on the top portions of the Si pillars H1 to H6 and on the surface of the SiN layer 36.

As illustrated in FIGS. 2OA to 2OC, a resist layer 43 is formed by the same method as the method for forming the resist layer 37. The upper surface of the resist layer 43 comes within the length of the $N^+$ regions 26*a* and 26*c* and $P^+$ region 26*b* of the Si pillars H5, H3, and H4 in the perpendicular direction. HF gas is fed from above the Si pillars H1 to H6. As in the process described above with reference to FIGS. 2KA to 2KC, the HF gas absorbed in the resist layer 43 forms HF ions ($HF_2^+$) in the resist layer 43 and the HF ions accelerate etching of the part of the $SiO_2$ layer 42 in contact with the resist layer 43 compared to etching of the part of the $SiO_2$ layer 42 not in contact with the resist layer 43.

Figure 2N:
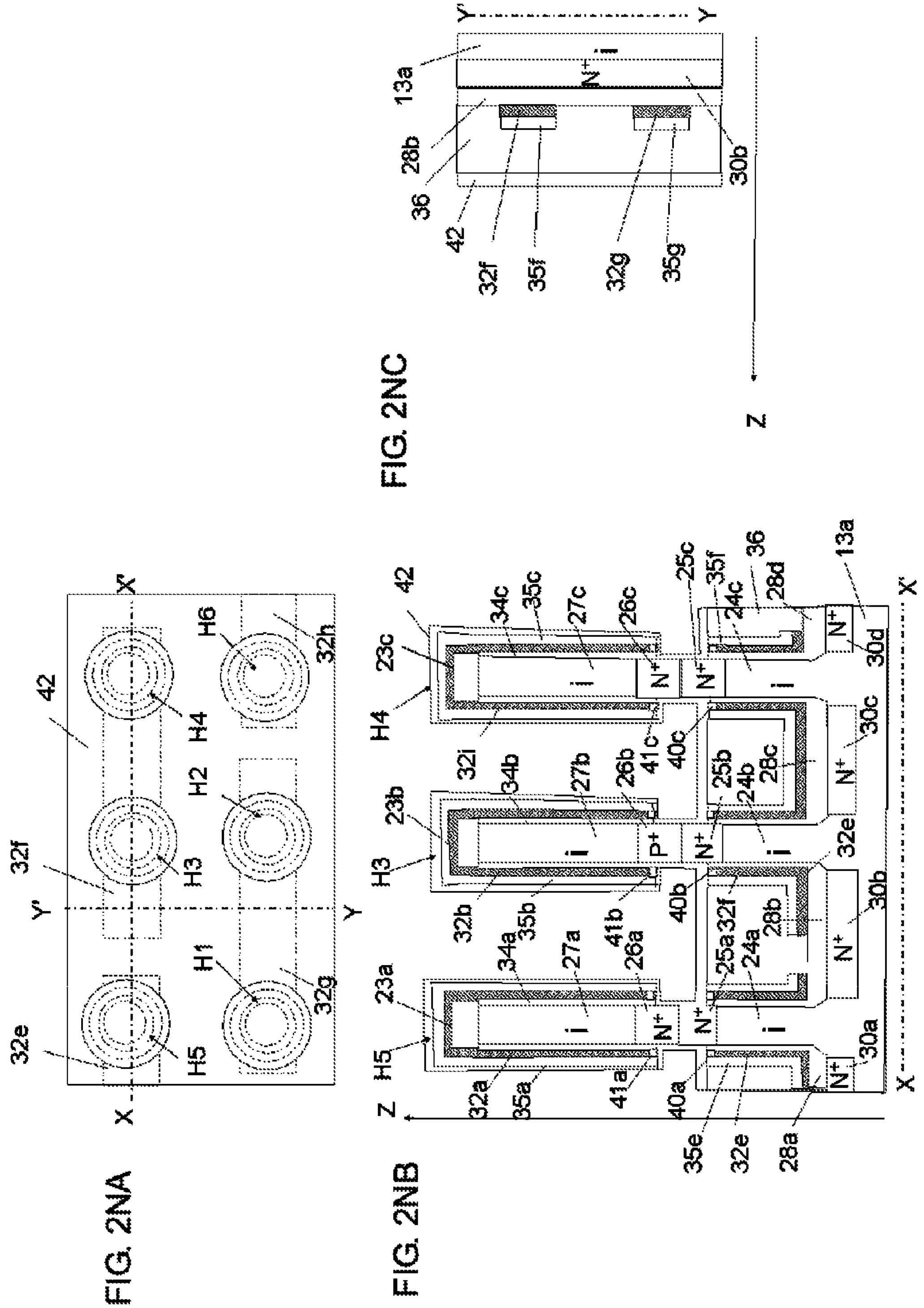
FIGS. 2NA to 2NC are respectively a plan view and cross-sectional views of an SRAM cell illustrating the method for producing an SGT-including semiconductor device according to the first embodiment.
Figures 20A, 20B, 20C:
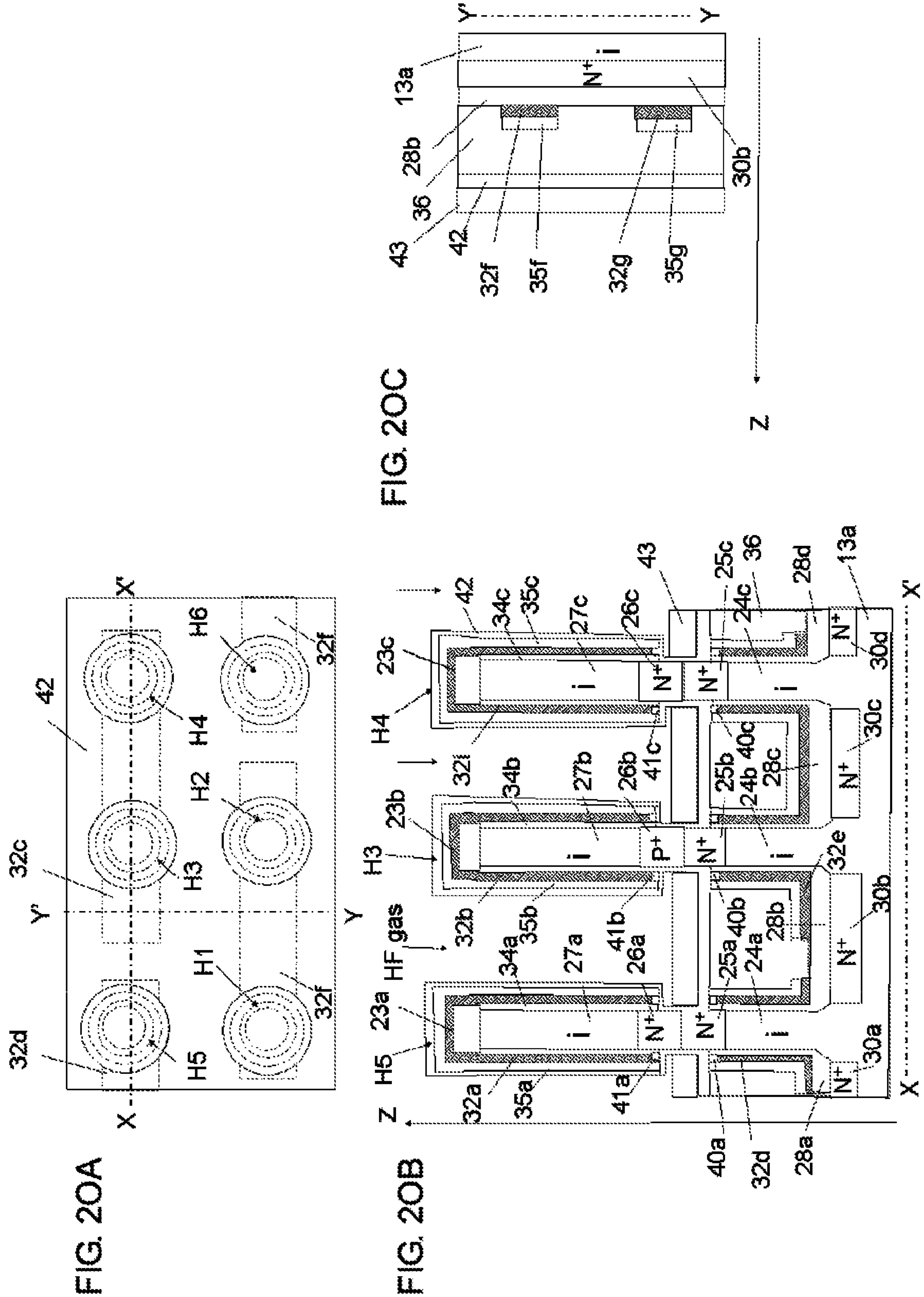
Figure 2P:
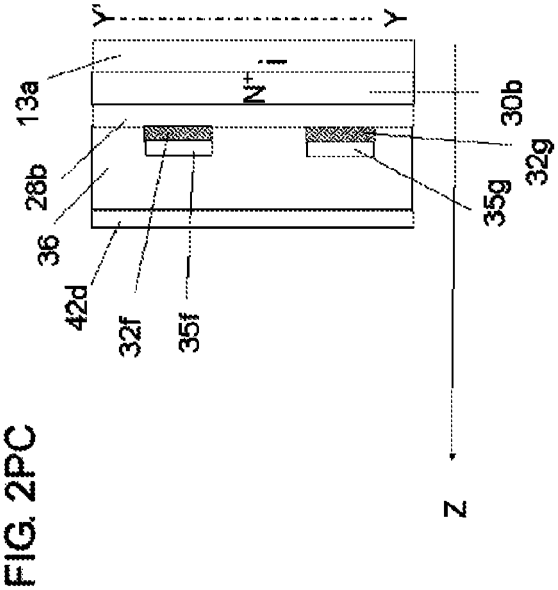
FIGS. 2PA to 2PC are respectively a plan view and cross-sectional views of an SRAM cell illustrating the method for producing an SGT-including semiconductor device according to the first embodiment.
Figure 2P:
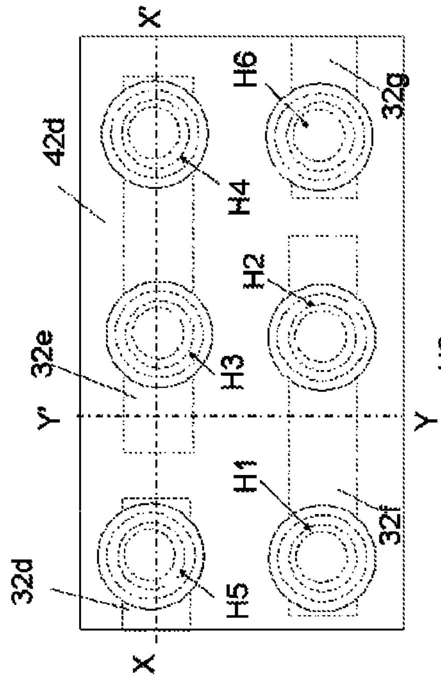
Figure 2P:
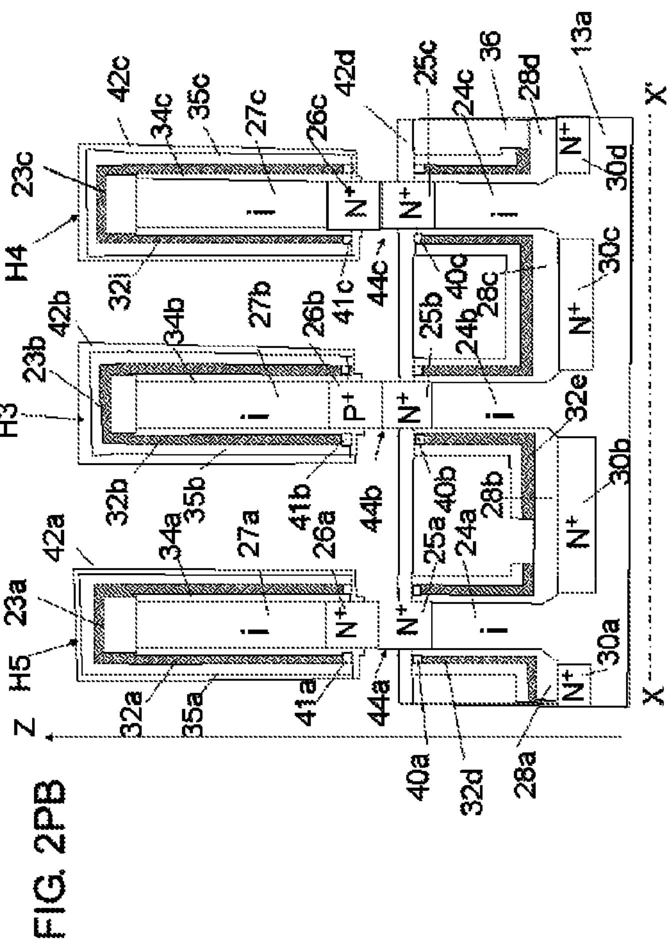

Next, as illustrated in FIGS. 2PA to 2PC, when the resist layer 43 is removed, the $SiO_2$ layer 42 which has been in contact with the resist layer 43 is etched. As a result, openings 44*a*, 44*b*, and 44*c* are formed on the side walls of the $N^+$ regions 25*a*, 25*b*, 25*c*, 26*a*, and 26*c* and the $P^+$ region 26*b* in the Si pillars H5, H3, and H4. In the $SiO_2$ layer 42, a $SiO_2$ layer 42*d* deposited on the SiN layer 36 is in contact with the resist layer 43. Since the $SiO_2$ layer 42*d* is thicker than the $SiO_2$ layers 42*a*, 42*b*, and 42*c* on the side walls of the Si pillars H1 to H6, the $SiO_2$ layer 42*d* remains on the SiN layer 36.

Figure 2Q:
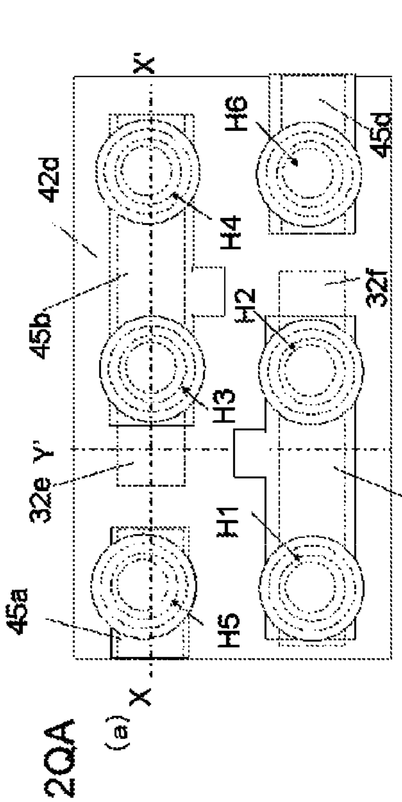
FIGS. 2QA to 2QC are respectively a plan view and cross-sectional views of an SRAM cell illustrating the method for producing an SGT-including semiconductor device according to the first embodiment.
Figure 2Q:
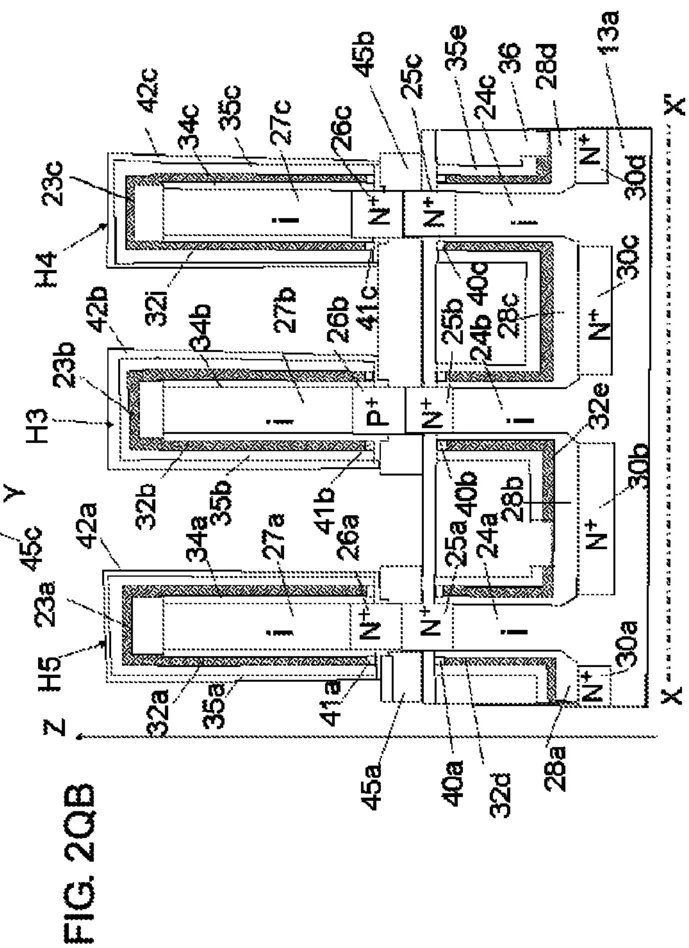
Figure 2Q:
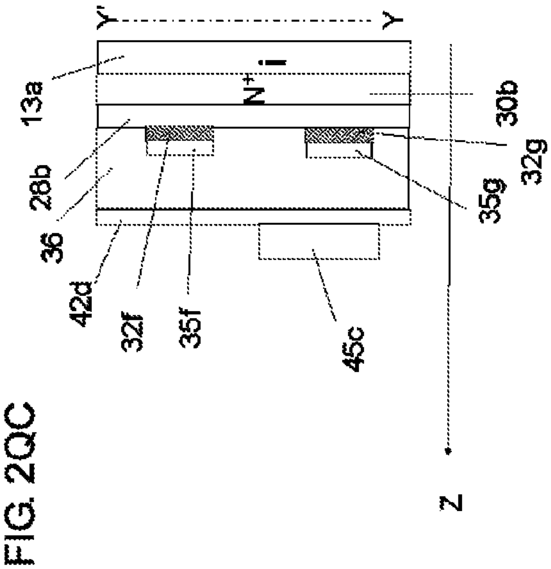

Then as illustrated in FIGS. 2QA to 2QC, conductor layers 45*a*, 45*b*, 45*c*, and 45*d* formed by siliciding poly Si layers, for example, are formed so as to connect to the $N^+$ regions 25*a*, 25*b*, 25*c*, 26*a*, and 26*c* and the $P^+$ region 26*b*. The conductor layer 45*b* is formed so as to connect the $N^+$ region 25*b* and the $P^+$ region 26*b* of the Si pillar H3 to the $N^+$ regions 25*c* and 26*c* of the Si pillar H4. The $N^+$ regions 25*a* and 26*a* of the adjacent Si pillar H5 of the SRAM cell are connected to the conductor layer 45*a*. The conductor layer 45*c* connects the Si pillar H1 to the Si pillar H2. The conductor layer 45*d* is connected to the adjacent Si pillar H6 of the SRAM cell.

Figure 2R:
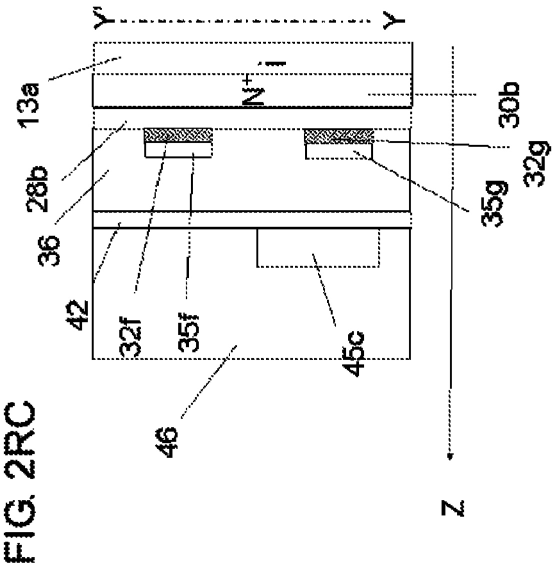
FIGS. 2RA to 2RC are respectively a plan view and cross-sectional views of an SRAM cell illustrating the method for producing an SGT-including semiconductor device according to the first embodiment.
Figure 2R:
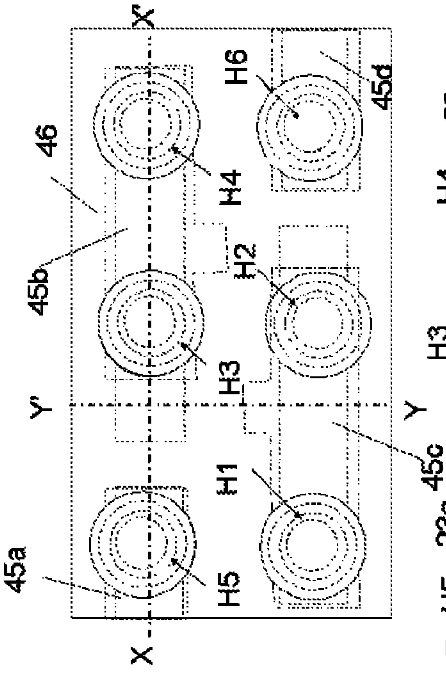
Figure 2R:
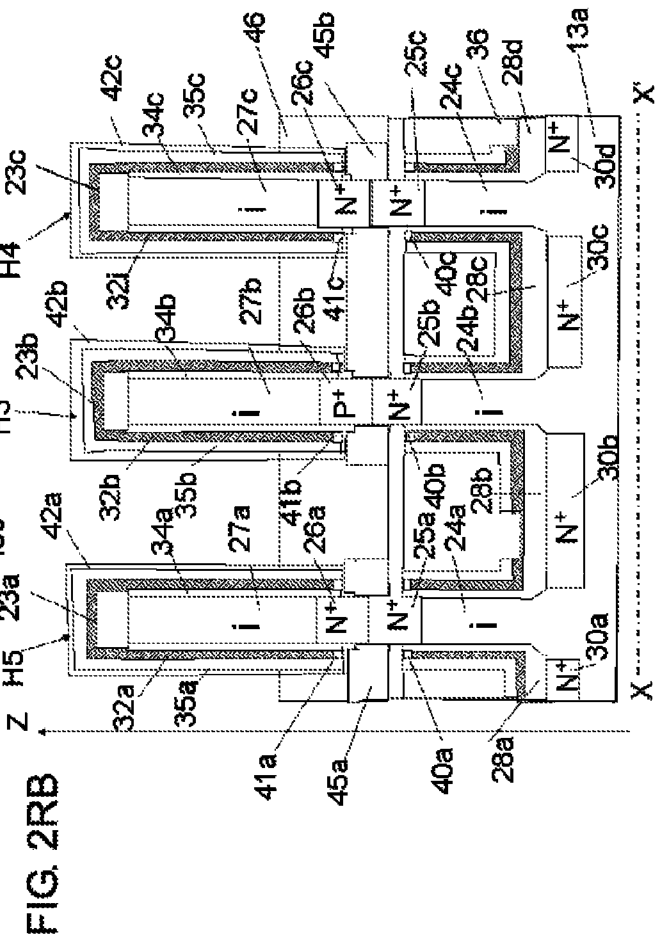

Next, as illustrated in FIGS. 2RA to 2RC, a SiN layer 46, for example, is formed so that its surface comes at approximately the center of the i-regions 27*a*, 27*b*, and 27*c* in the upper portions of the Si pillars H1 to H6.

Figure 2S:
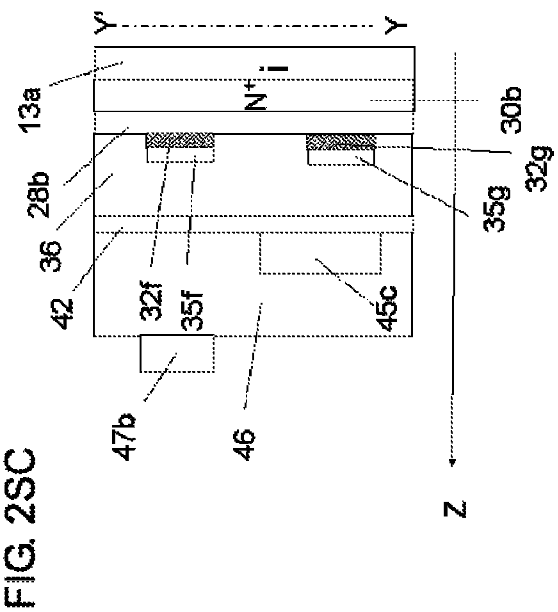
FIGS. 2SA to 2SC are respectively a plan view and cross-sectional views of an SRAM cell illustrating the method for producing an SGT-including semiconductor device according to the first embodiment.
Figure 2S:
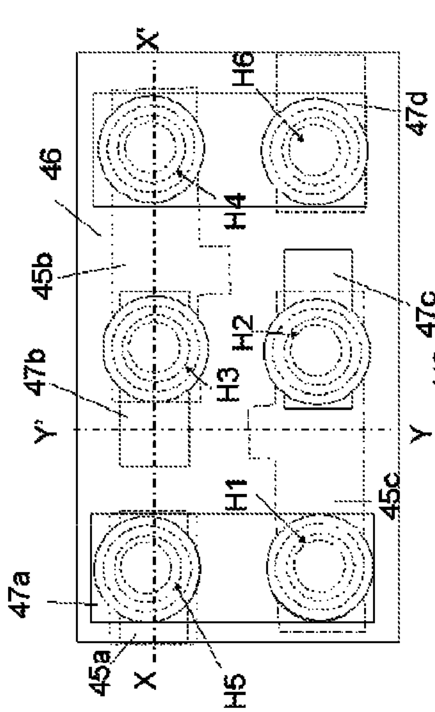
Figure 2S:
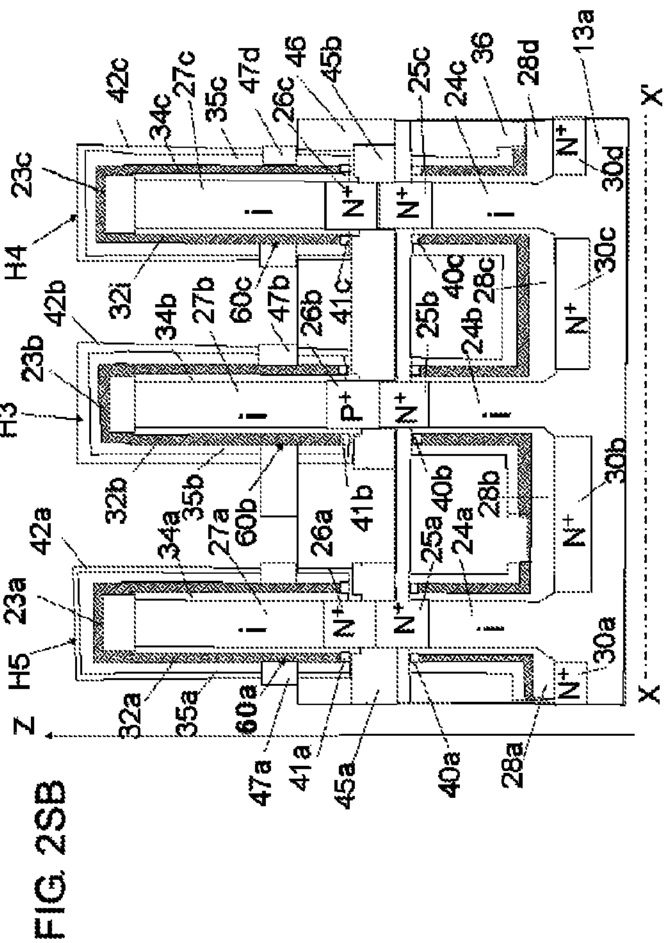

Next, as illustrated in FIGS. 2SA to 2SC, a resist layer is formed by the same method as one described with reference to FIGS. 2KA to 2KC and 2OA to 2OC and HF gas is supplied from the upper surface of the resist layer. As a result, the $SiO_2$ layers 35*a*, 35*b*, 35*c*, 42*a*, 42*b*, and 42*c* on the side walls of the Si pillars H5, H3, and H4 are etched and openings 60*a*, 60*b*, and 60*c* are formed. Then, for example, conductor layers 47*a*, 47*b*, 47*c*, and 47*d* formed by siliciding poly Si layers are formed by the same method as one described with reference to FIGS. 2QA to 2QC. The conductor layer 47*a* is connected to the TiN layer 32*a* in the upper portion of the Si pillar H5. The conductor layer 47*b* is connected to the TiN layer 32*b* in the upper portion of the Si pillar H3. The conductor layer 47*d* is connected to the TiN layer 32*i* in the upper portion of the Si pillar H4. As illustrated in FIG. 2SA, the conductor layer 47*a* is formed so as to connect the Si pillar H5 to the Si pillar H1 and the conductor layer 47*d* is formed so as to connect the Si pillar H4 to the Si pillar H6.

Figure 2T:
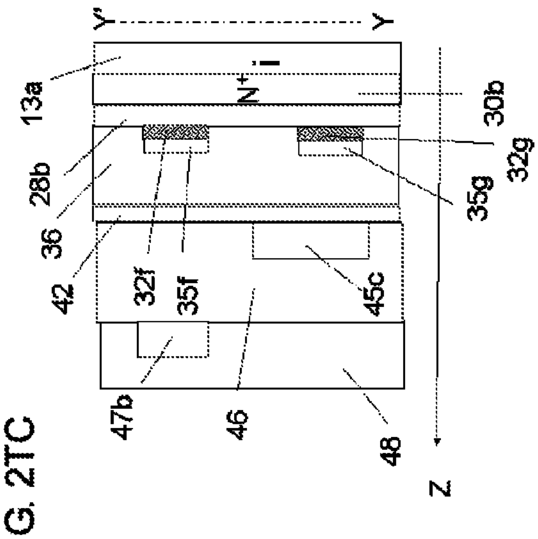
FIGS. 2TA to 2TC are respectively a plan view and cross-sectional views of an SRAM cell illustrating the method for producing an SGT-including semiconductor device according to the first embodiment.
Figure 2T:
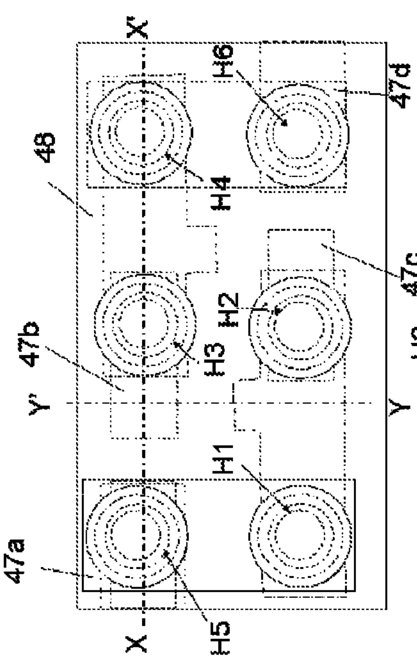
Figure 2T:
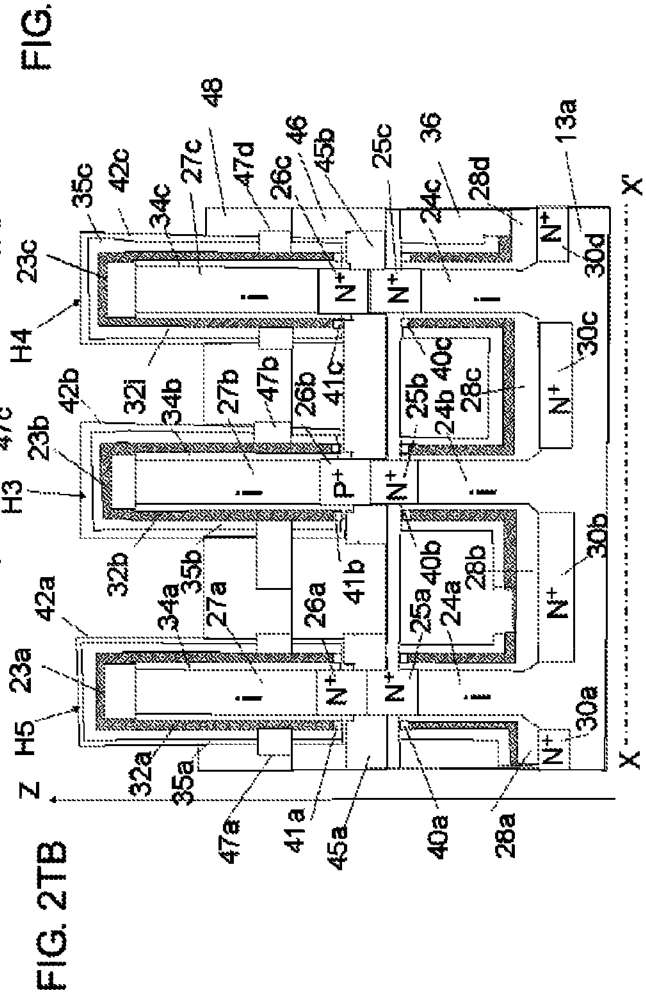

As illustrated in FIGS. 2TA to 2TC, a resist layer 48 is formed so that its surface comes at a position lower than the top portions of the Si pillars H1 to H6.

Figure 2U:
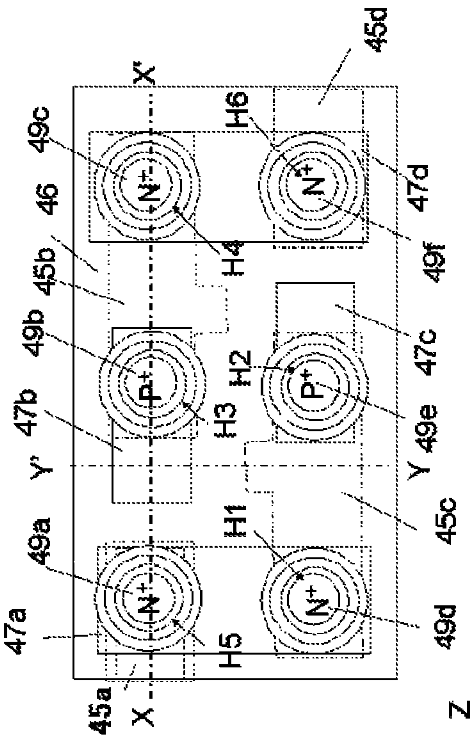
FIGS. 2UA to 2UC are respectively a plan view and cross-sectional views of an SRAM cell illustrating the method for producing an SGT-including semiconductor device according to the first embodiment.
Figure 2U:
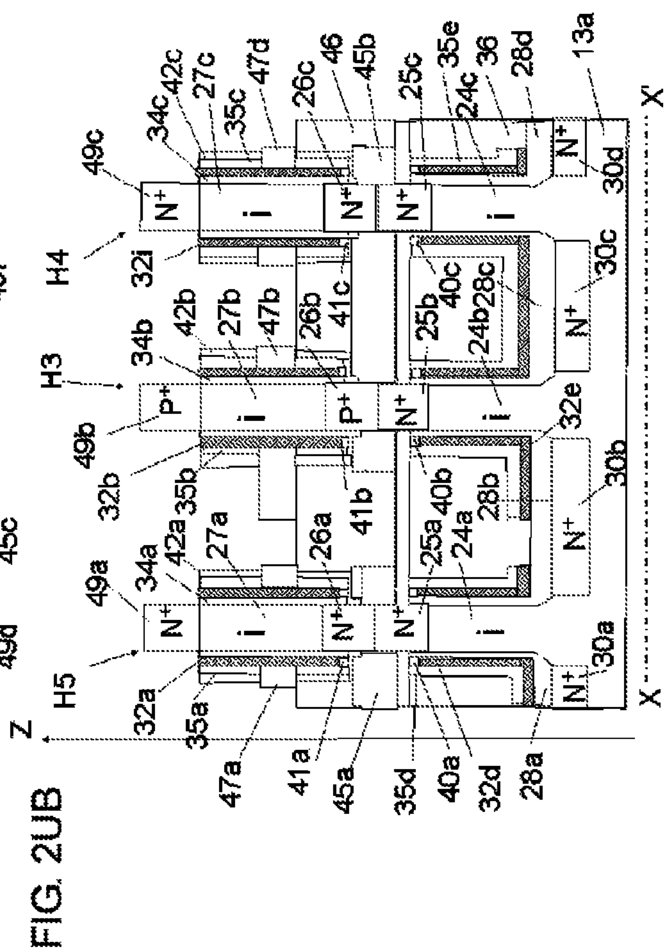
Figure 2U:
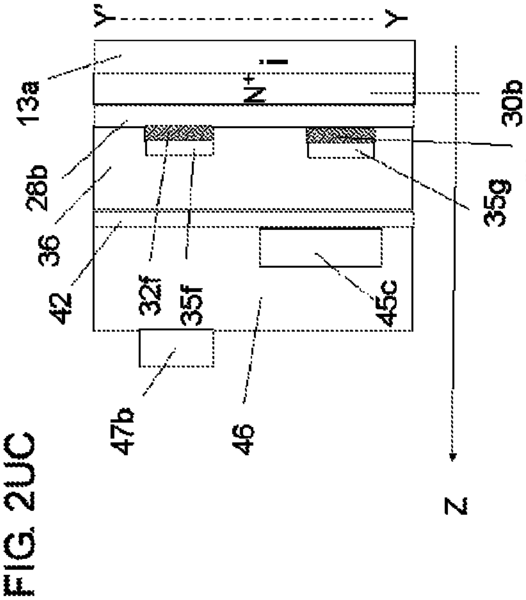

As illustrated in FIGS. 2UA to 2UC, the $SiO_2$ layers 42*a*, 42*b*, 42*c*, 35*a*, 35*b*, and 35*c*, the TiN layers 32*a*, 32*b*, and 32*i*, and the gate $SiO_2$ layers 34*a*, 34*b*, and 34*c* are etched by using the resist layer 48 as an etching mask and the resist layer 48 is removed. Ion implantation is conducted by using the $SiO_2$ layers 42*a*, 42*b*, 42*c*, 35*a*, 35*b*, and 35*c*, the TiN layers 32*a*, 32*b*, and 32*i*, and the gate $SiO_2$ layers 34*a*, 34*b*, and 34*c* as ion implantation stopper layers so as to form $N^+$ regions 49*a*, 49*c*, 49*d*, and 49*f* in the top portions of the Si pillars H1, H4, H5, and H6 and $P^+$ regions 49*b* and 49*e* in the top portions of the Si pillars H3 and H2.

Figure 2V:
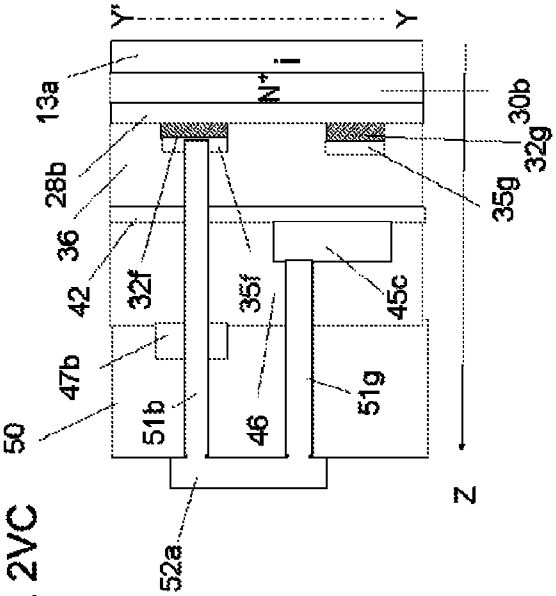
FIGS. 2VA to 2VC are respectively a plan view and cross-sectional views of an SRAM cell illustrating the method for producing an SGT-including semiconductor device according to the first embodiment.
Figure 2V:
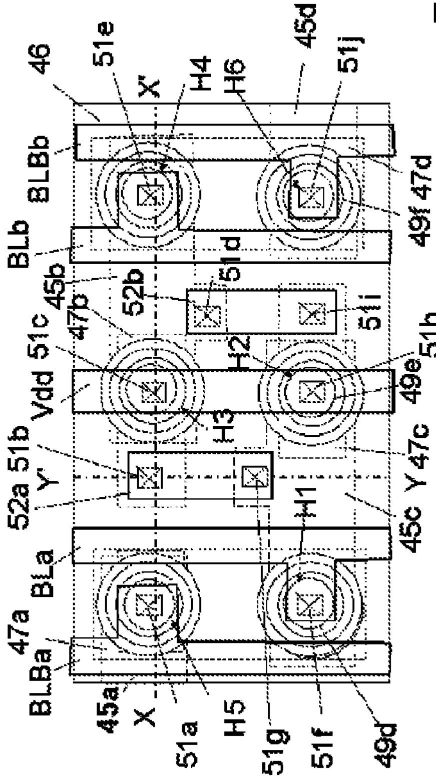
Figure 2V:
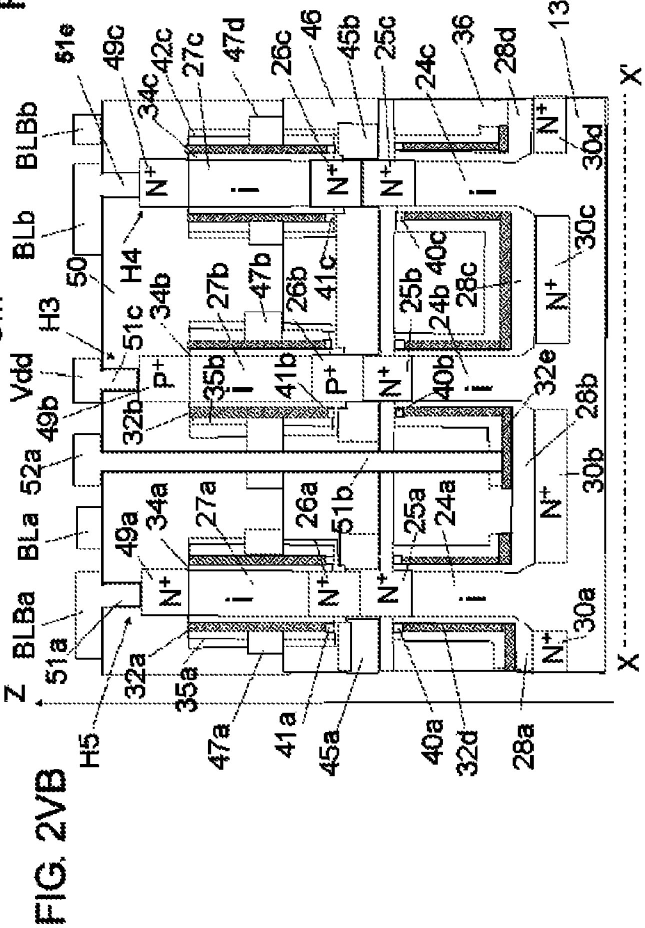

As illustrated in FIGS. 2VA to 2VC, a $SiO_2$ layer 50 is formed over the entire structure by CVD and a contact hole 51*a* is formed on the $N^+$ region 49*a* in the top portion of the Si pillar H5. A contact hole 51*b* is formed on the TiN layer 32*e* (the conductor layer 47*b* is formed in the upper portion of the TiN layer 32*e*) in the lower portion connected to the outer periphery of the Si pillar H3. A contact hole 51*c* is formed on the $P^+$ region 49*b* in the top portion of the Si pillar H3 and a contact hole 51*d* is formed on the conductor layer 45*b*. A contact hole 51*e* is formed on the $N^+$ region 49*c* in the top portion of the Si pillar H4. A contact hole 51*f* is formed on the $N^+$ region 49*d* in the top portion of the Si pillar H1. A contact hole 51*g* is formed on the conductor layer 45*c*, and a contact hole 51*h* is formed on the $P^+$ region 49*e* in the top portion of the Si pillar H2. Then the contact hole 51*b* is formed on the TiN layer 32*f* (there is a conductor layer 47*c* in the upper portion) in the lower portion and a contact hole 51*j* is formed on the $N^+$ region 49*f* in the top portion of the Si pillar H6.

A bit line wiring metal layer BLa connected to the $N^+$ region 49*a* in the top portion of the Si pillar H5 through the contact hole 51*a* is formed. An inversion bit line wiring metal layer BLBa connected to the $N^+$ region 49*d* in the top portion of the Si pillar H1 through the contact hole 51*f* is formed. Then a metal wiring layer 52*a* that connects the TiN layer 32*e* in the lower portion of the Si pillar H3 to the conductor layers 47*b* and 45*c* through the contact holes 51*b* and 51*g* is formed. A power supply wiring metal layer Vdd that connects the $P^+$ regions 49*b* and 49*e* in the Si pillars H3 and H2 to each other through the contact holes 51*c* and 51*h* is formed. Then a metal wiring layer 52*b* that connects the TiN layer 32*g* in the lower portion of the Si pillar H2 to the conductor layers 47*c* and 45*b* through the contact holes 51*d* and 51*i* is formed. A bit line wiring metal layer BLb connected to the $N^+$ region 49*c* in the top portion of the Si pillar H4 through the contact hole 51*e* is formed. An inversion bit line wiring metal layer BLBb connected to the $N^+$ region 49*f* in the top portion of the Si pillar H6 through the contact hole 51*j* is formed.

Figure 2W:
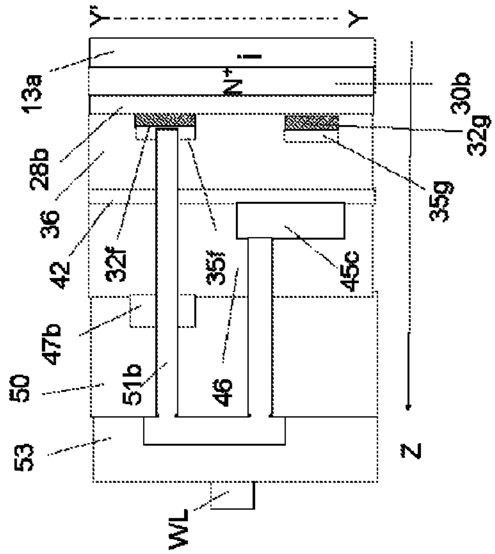
FIGS. 2WA to 2WC are respectively a plan view and cross-sectional views of an SRAM cell illustrating the method for producing an SGT-including semiconductor device according to the first embodiment.
Figure 2W:
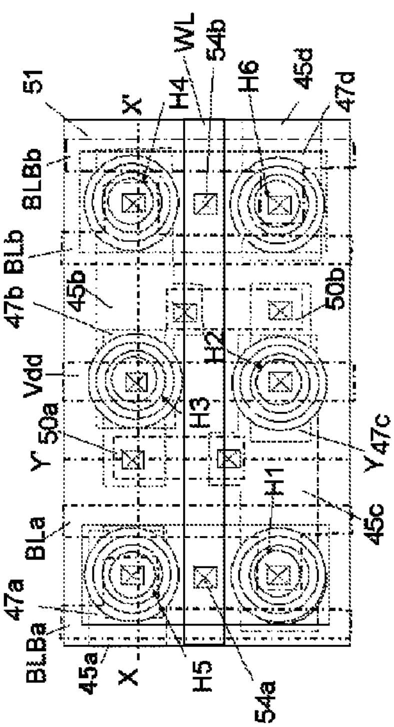
Figure 2W:
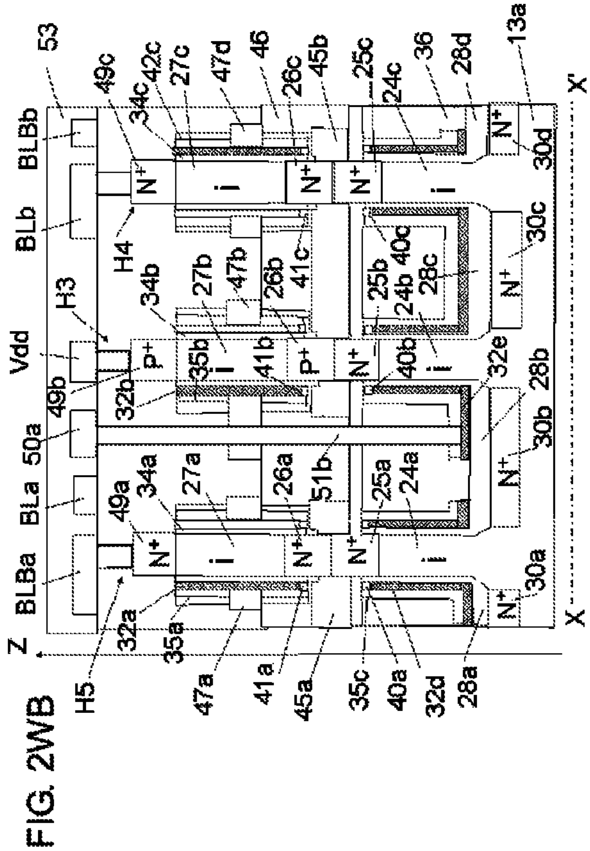

As shown in FIGS. 2WA to 2WC, an $SiO_2$ layer 53 is formed by CVD, contact holes 54*a* and 54*b* are formed on the conductor layers 47*a* and 47*d*, and a word line metal wiring layer WL connected to the conductor layers 47*a* and 47*d* through the contact holes 54*a* and 54*b* is formed.

As described above, according to the method for producing a semiconductor device shown in FIGS. 2AA to 2WC, an SRAM cell circuit shown in the circuit diagram of FIG. 1A, a schematic diagram of FIG. 1B, and the Si pillar arrangement diagram of FIG. 1C is formed.

According to the method for producing a semiconductor device according to the first embodiment, the following effects 1 to 3 are obtained, for example.

Figure 6:
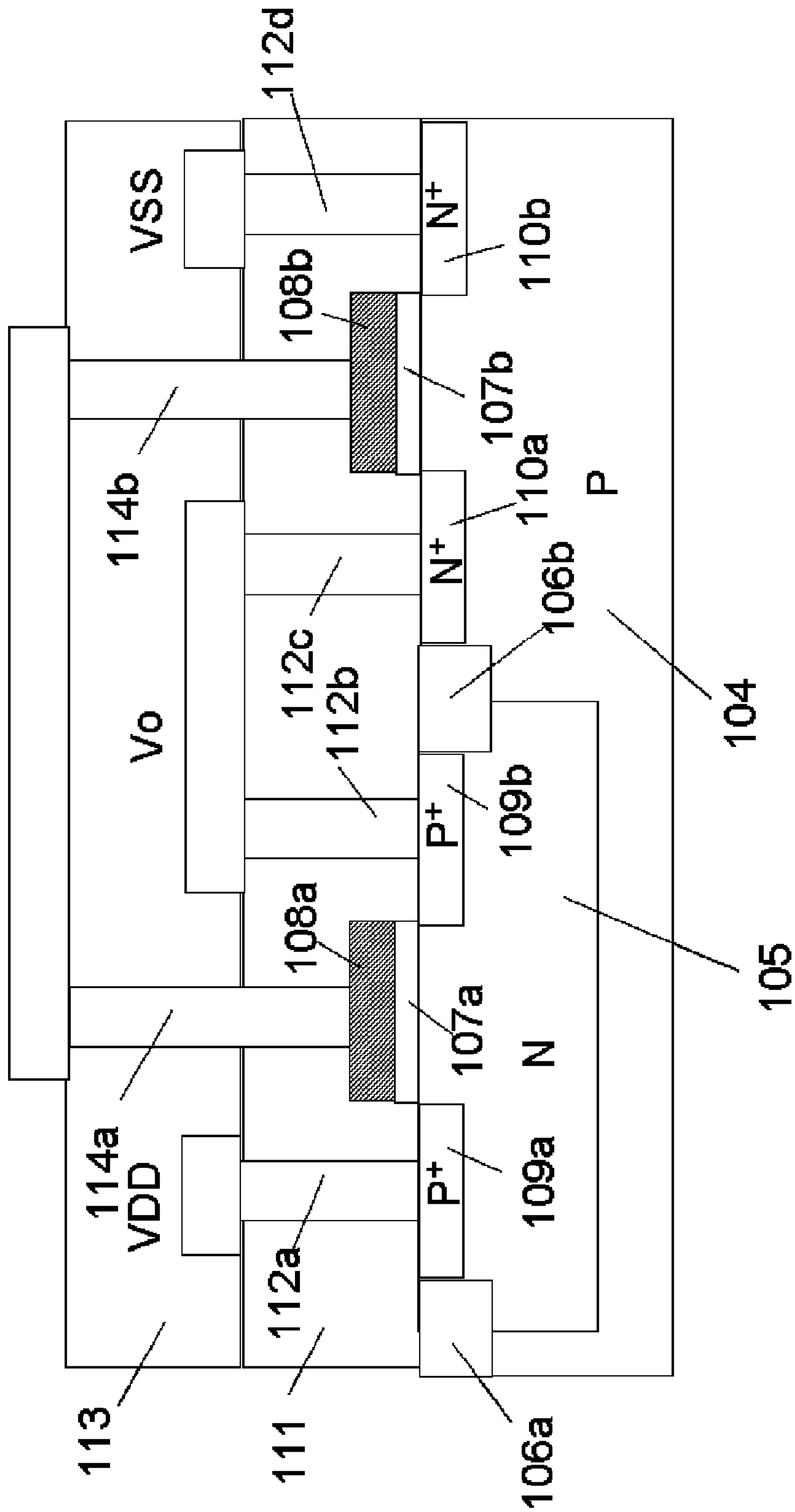
FIG. 6 is a cross-sectional view of a planar CMOS inverter circuit according to the prior art.
Figure 7A:
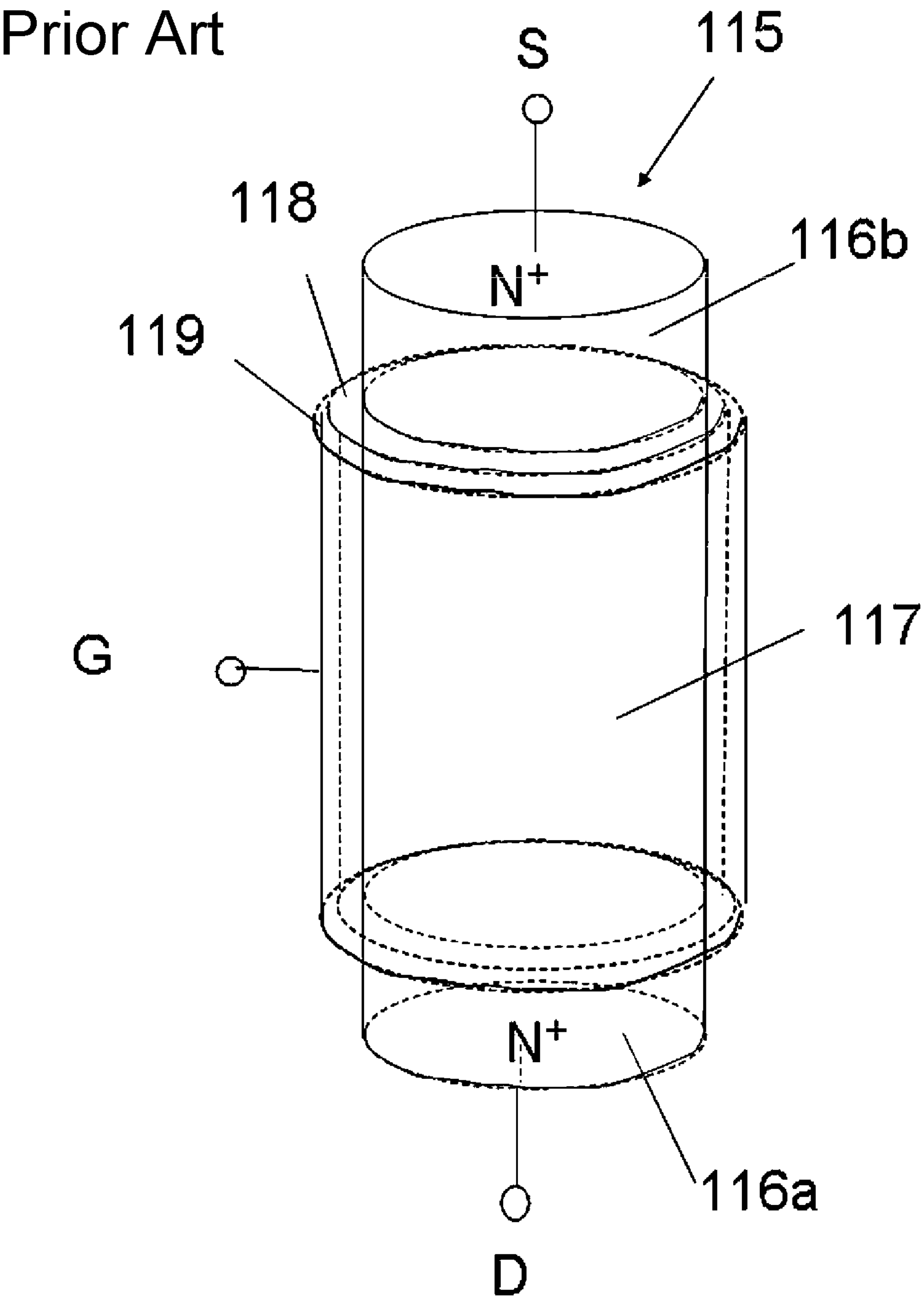
FIG. 7A is a schematic diagram illustrating an SGT according to the prior art.
Figure 7B:
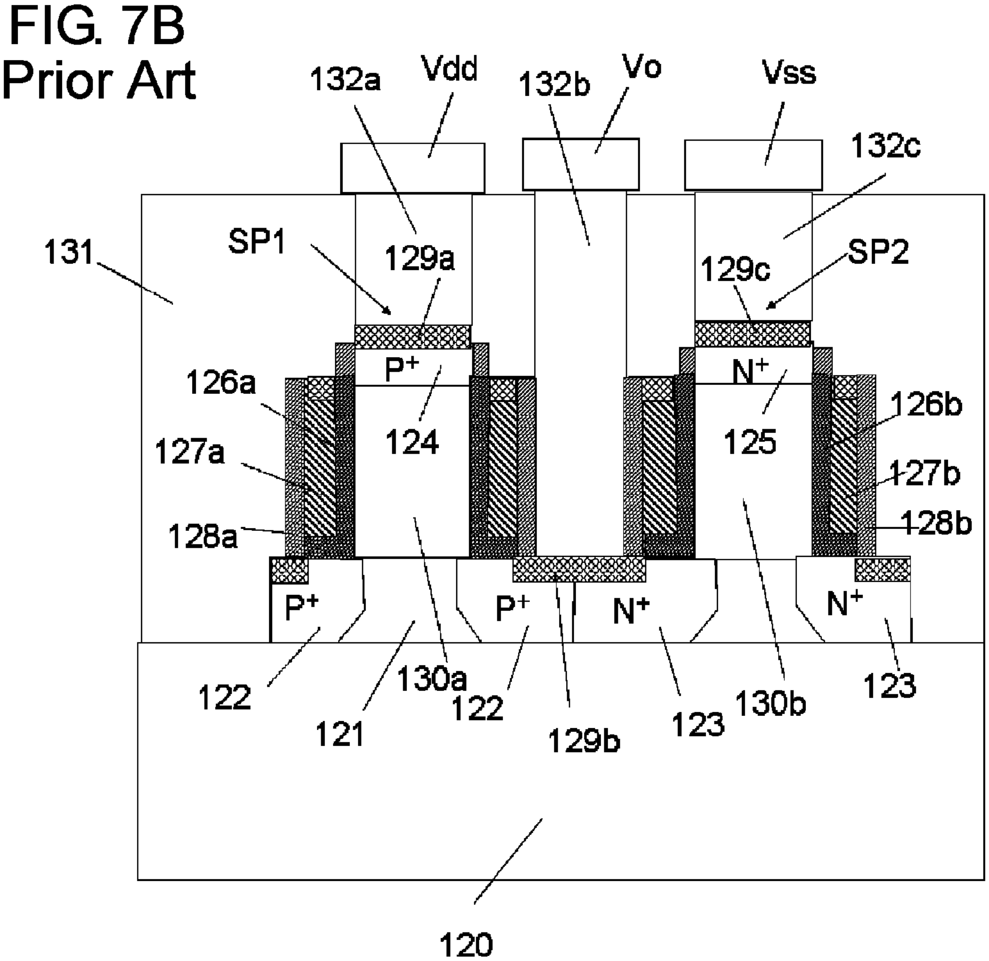
FIG. 7B is a cross-sectional view of an SGT-including CMOS inverter circuit according to the prior art.
Figure 8:
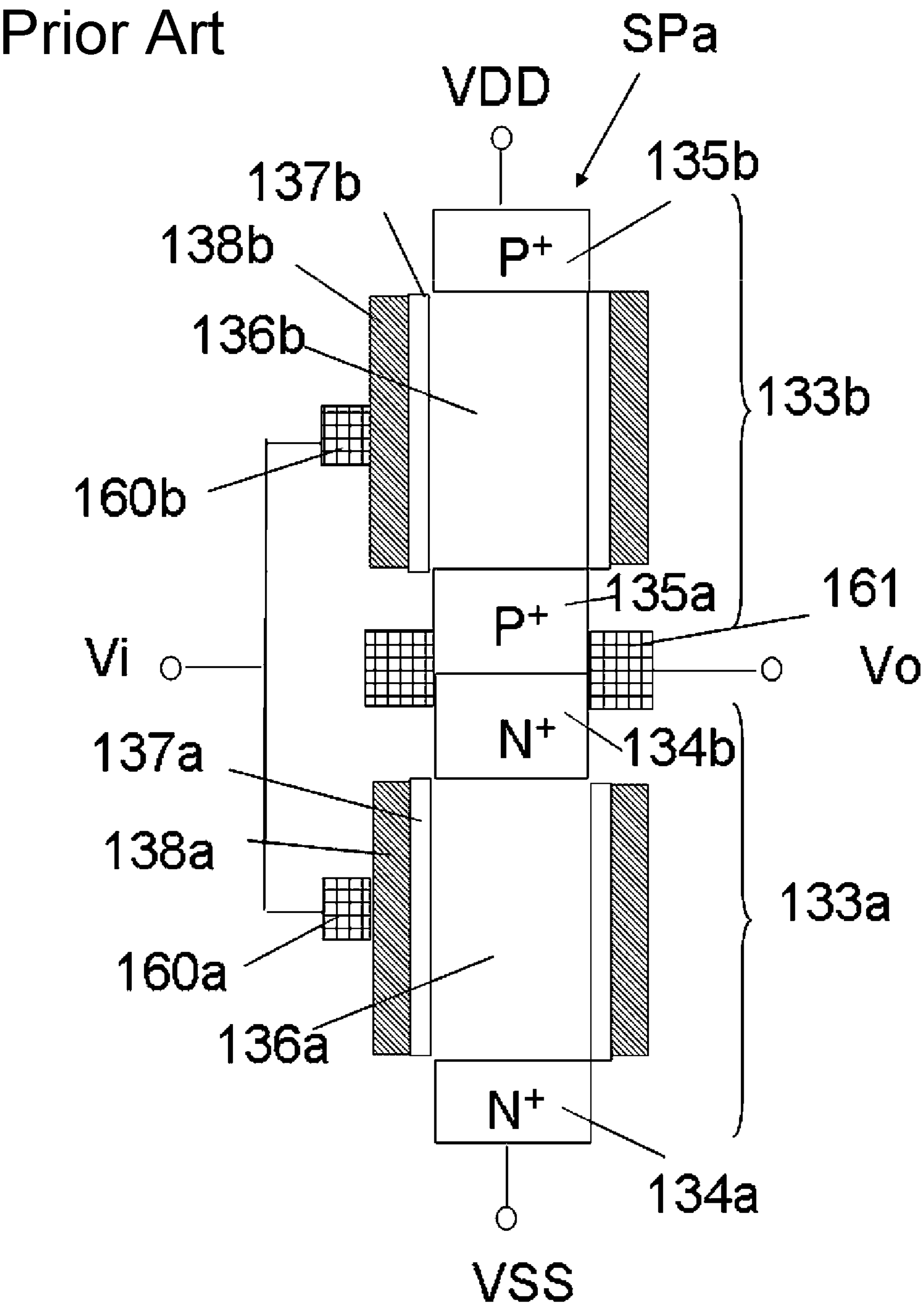
FIG. 8 is a schematic view of a structure in which an N-channel SGT and a P-channel SGT are respectively formed in a lower portion and an upper portion of one Si pillar according to the prior art.
Figure 9:
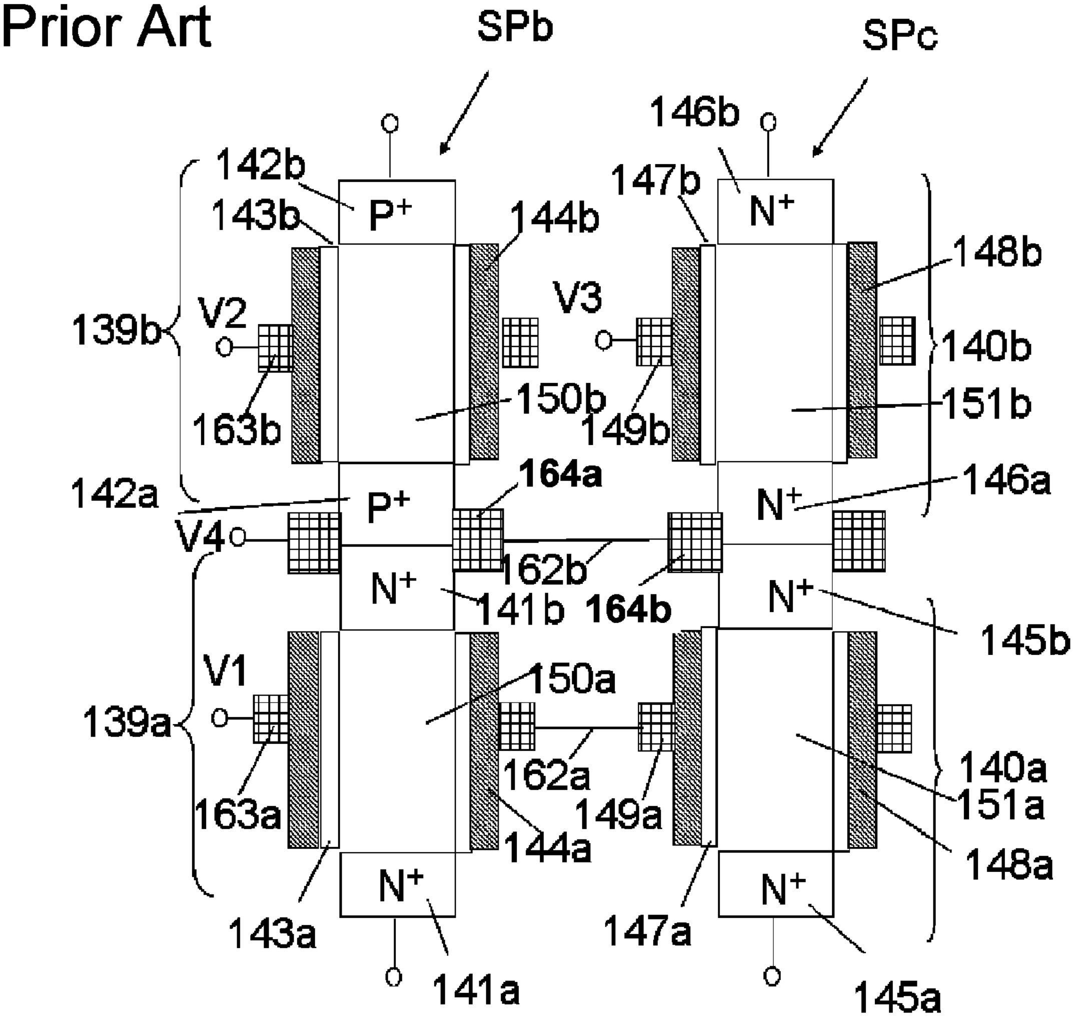
FIG. 9 is a schematic diagram illustrating a state in which SGTs are connected with conductive wires in the case where two SGTs are formed in each Si pillar.
Figure 10:
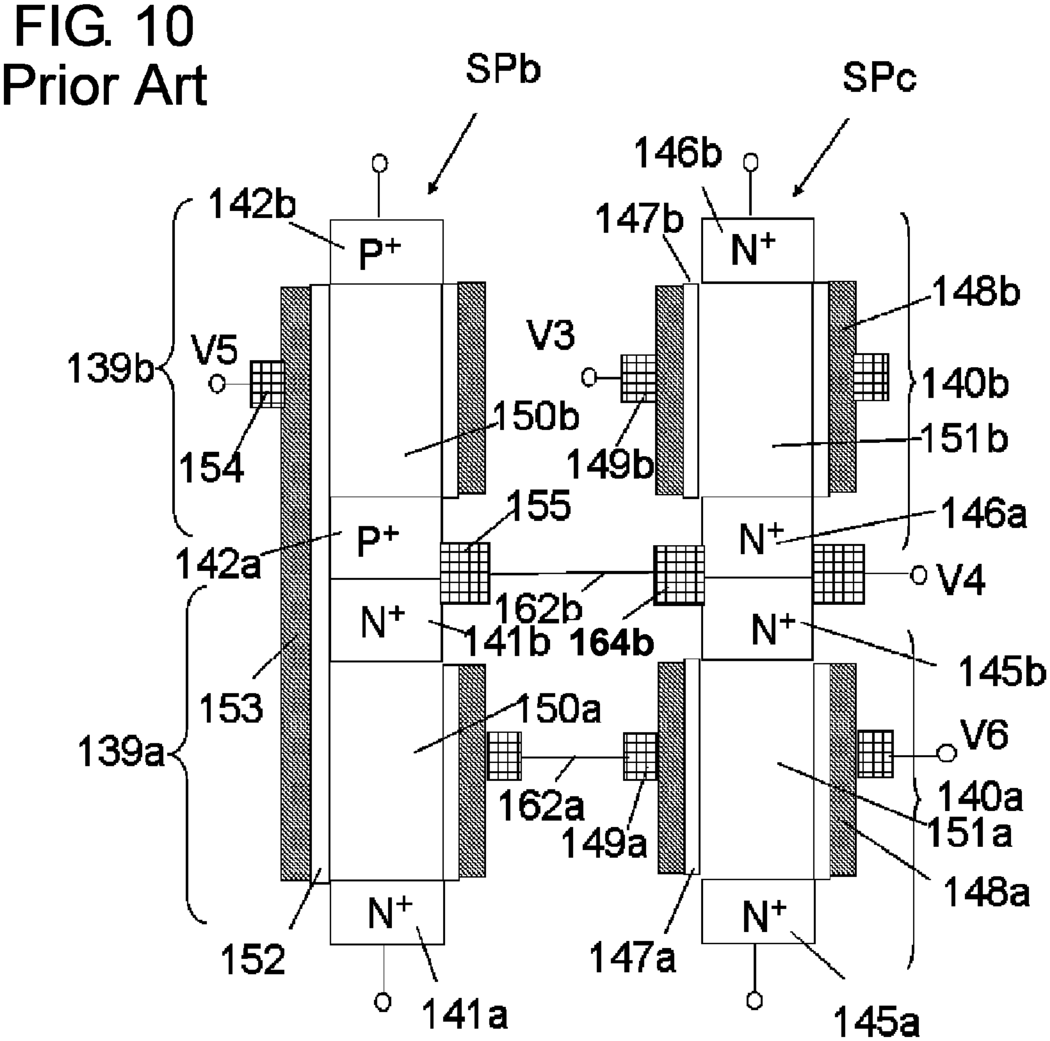
FIG. 10 is a schematic diagram illustrating a connection state of SGTs with conductive wires, in which a continuous gate conductor layer is shared by two SGTs formed in one Si pillar and connection to a metal terminal wiring is established through one connecting part.

1. Openings 44*a*, 44*b*, and 44*c* in contact with the $N^+$ regions 25*a*, 25*b*, 25*c*, 26*a*, and 26*c* and the $P^+$ region 26*b* can be formed on the side walls of the Si pillars H5, H3, and H4 (refer to FIGS. 2PA to 2PC) without using a known lithographic technique for forming contact holes 112*a*, 112*b*, 112*c*, 112*d*, 114*a*, 114*b*, 132*a*, 132*b*, and 132*c* shown in FIGS. 6 and 7B.
2. Openings 60*a*, 60*b*, and 60*c* in contact with the TiN layers 32*a*, 32*b* and 32*i* can be formed on the side walls of the Si pillars H5, H3, and H4 (refer to FIGS. 2SA to 2SC) without using a known lithographic technology.
3. TiN layers 32*a* and 32*b* on the outer peripheries of the Si pillars H5, H3, and H4 can be separated into TiN layers 32*a*, 32*b*, 32*i*, 32*e*, and 32*f* (refer to FIGS. 2MA to 2MC) without using a known lithographic technique.

According to the method for producing an SRAM cell circuit according to this embodiment, fine openings are highly accurately formed by merely uniformly forming the resist layers 37 and 43 above the i-layer substrate. Accordingly, the lithographic process which has been necessary for fine processing is no longer required and the production process can be streamlined.

Formation of fine openings 38*a*, 38*b*, 38*c*, 44*a*, 44*b*, and 44*c* is possible without using an expensive lithographic machine as has been required in the related art, by merely adjusting the amount of the resist applied. Accordingly, semiconductor devices can be produced at lower costs.

According to the mechanism of the $SiO_2$ layer etching by using hydrogen fluoride (HF) (refer to Hirohisa Kikuyama, Nobuhiro Miki, Kiyonori Saka, Jun Takano, Ichiro Kawanabe, Masayuki Miyashita, Tadahiro Ohmi: "Principles of Wet Chemical Processing in ULSI Microfabrication", IEEE Transactions on Semiconductor Manufacturing, Vol. 4, No. 1, pp. 26-35 (1991)), HF is ionized in the HF—$H_2O$ system (aqueous HF solution). HF ions are formed by the reaction formula below and etch $SiO_2$:

$$HF \rightarrow H^+ + F^- \quad (1)$$

$$HF + F^- \rightarrow HF_2^- \quad (2)$$

$$SiO_2 + 3HF_2^- + H^+ \rightarrow SiF_6^{2-} + 2H_2O \quad (3)$$

Due to this reaction, HF ions (HF2— in this case) diffuse in the resist layer 37 and etch parts of the $SiO_2$ layers 35*a*, 35*b*, and 35*i* in contact with the resist layer 37. In contrast, parts of the $SiO_2$ layers 35*a*, 35*b*, and 35*i* not in contact with the resist layer 37 are etched slowly by HF gas and thus remain on the outer peripheries of the Si pillars H1 to H6. The resist layer 37 may be a layer composed of a material other than resist as long as the material absorbs HF gas and allows HF ions generated from the HF gas to diffuse therein.

Second Embodiment

A method for producing an SGT-including semiconductor device according to a second embodiment will now be described with reference to FIGS. 3AA to 3FC.

Figure 3A:
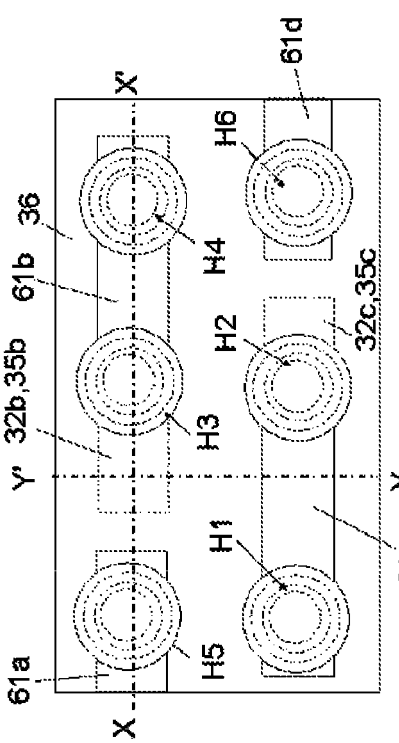
FIGS. 3AA to 3AC are respectively a plan view and cross-sectional views of an SRAM cell illustrating a method for producing an SGT-including semiconductor device according to a second embodiment.
Figure 3A:
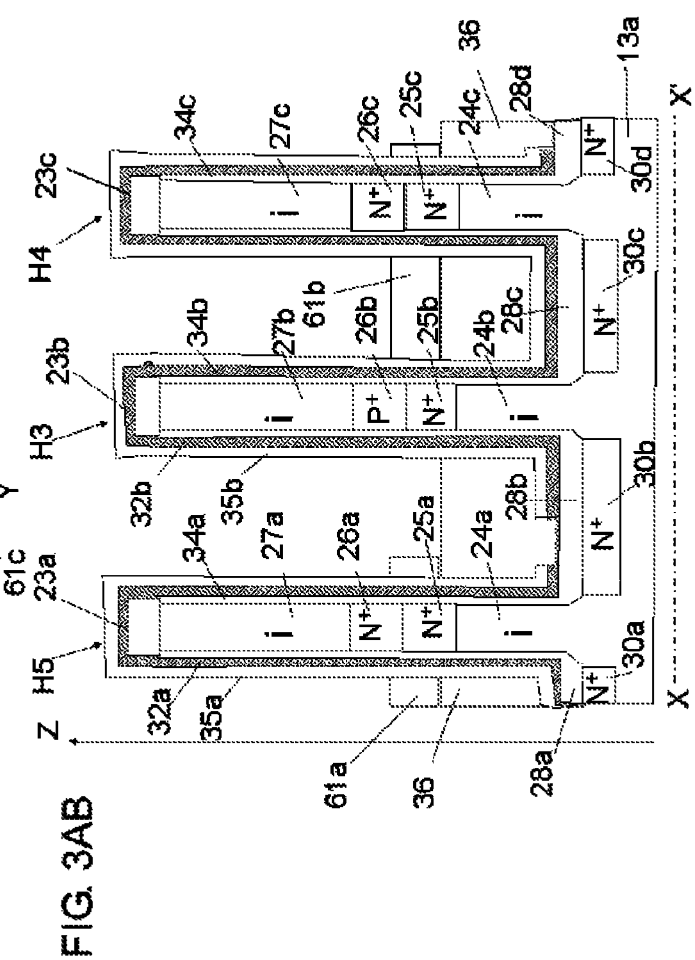
Figure 3A:
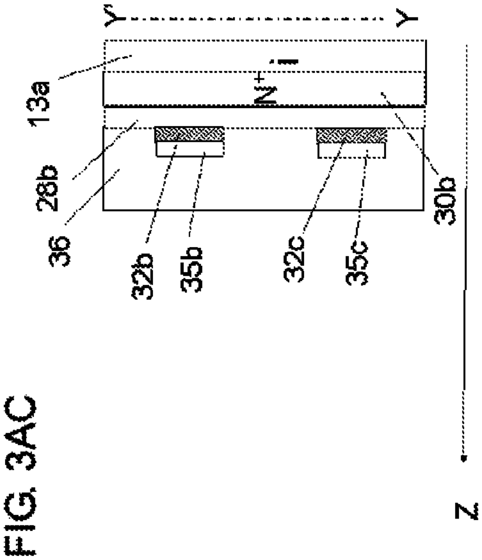

In the second embodiment, the same steps as those illustrated in FIGS. 2AA to 2JC are performed prior to a step shown in FIGS. 3AA to 3AC. The description therefor is thus omitted. Subsequent to the step shown in FIGS. 2JA to 2JC, resist layers 61*a*, 61*b*, 61*c*, and 61*d* are formed by applying a resist sensitive to light, an X-ray, or an electron beam and performing lithography, as shown in FIGS. 3AA to 3AC. The resist layer 61*a* is formed so as to surround the outer periphery of the Si pillar H5. The resist layer 61*b* is formed so as to come into contact with the Si-pillar-H4-side side wall of the Si pillar H3 and surround the outer periphery of the Si pillar H4. The resist layer 61*c* is formed so as to come into contact with the side wall of the Si pillar H2 and surround the outer periphery of the Si pillar H1. The resist layer 61*d* is formed so as to surround the outer periphery of the Si pillar H6.

Figure 3B:
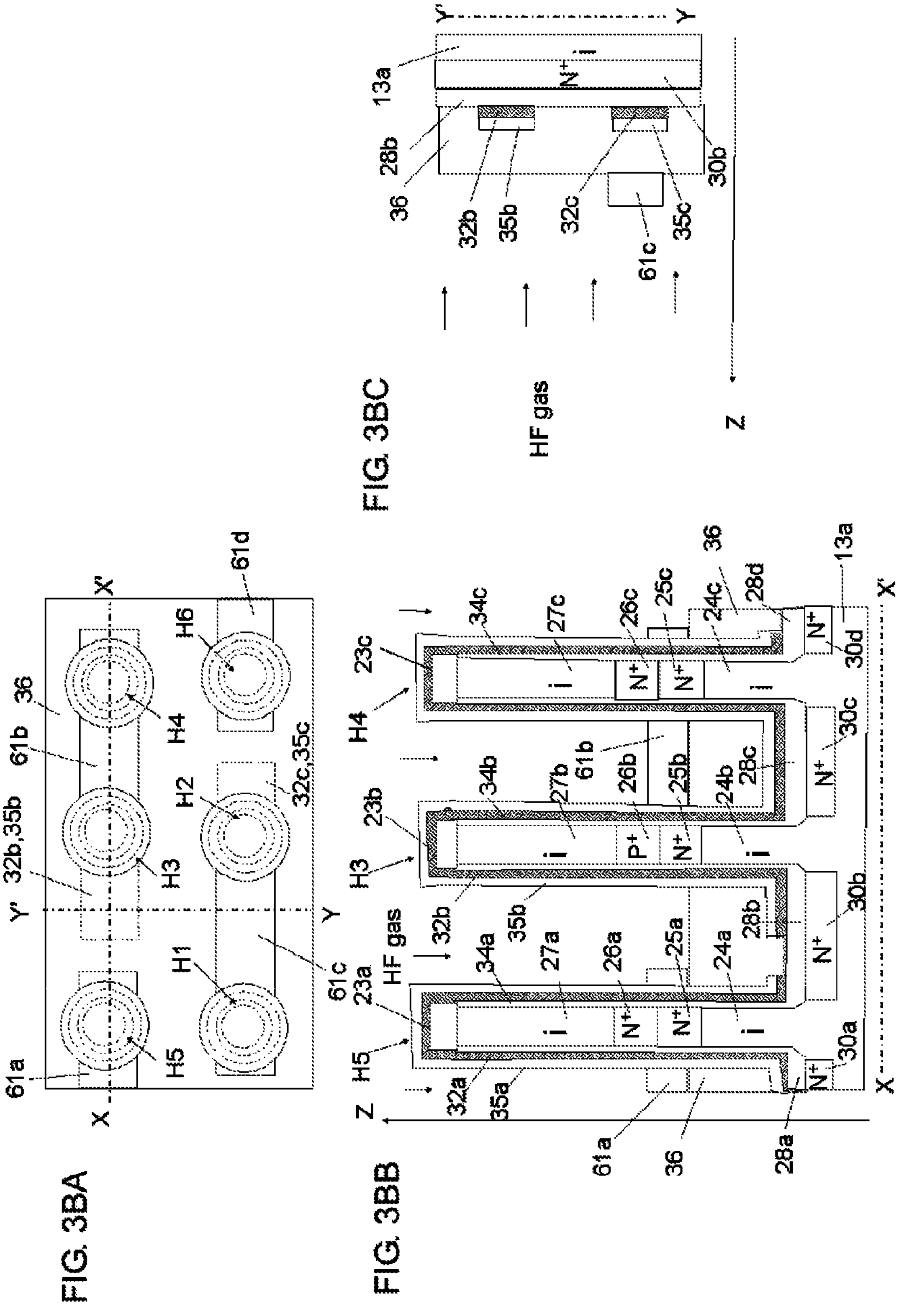
FIGS. 3BA to 3BC are respectively a plan view and cross-sectional views of an SRAM cell illustrating the method for producing an SGT-including semiconductor device according to the second embodiment.

Then, as illustrated in FIGS. 3BA to 3BC, HF gas is supplied to the reaction system. The HF gas diffuses in the resist layers 61*a* and 61*b* as described above and HF ions are generated due to the moisture contained in the resist layers 61*a* and 61*b*. The HF ions etch parts of the $SiO_2$ layers 35*a*, 35*b*, and 35*i* in contact with the resist layers 61*a* and 61*b*. The same process is performed for the resist layer 61*c* in contact with the Si pillar H1 and the Si pillar H2 and the resist layer 61*d* in contact with the Si pillar H6. The resist layer 61*a* and the resist layer 61*b* are then removed. The TiN layers 32*a*, 32*b*, and 32*i* are etched by using the $SiO_2$ layers 35*a*, 35*b*, and 35*i* as an etching mask. The gate $SiO_2$ layers 34*a*, 34*b*, and 34*c* are etched by using the TiN layers 32*a*, 32*b*, and 32*i* as an etching mask.

Figure 3C:
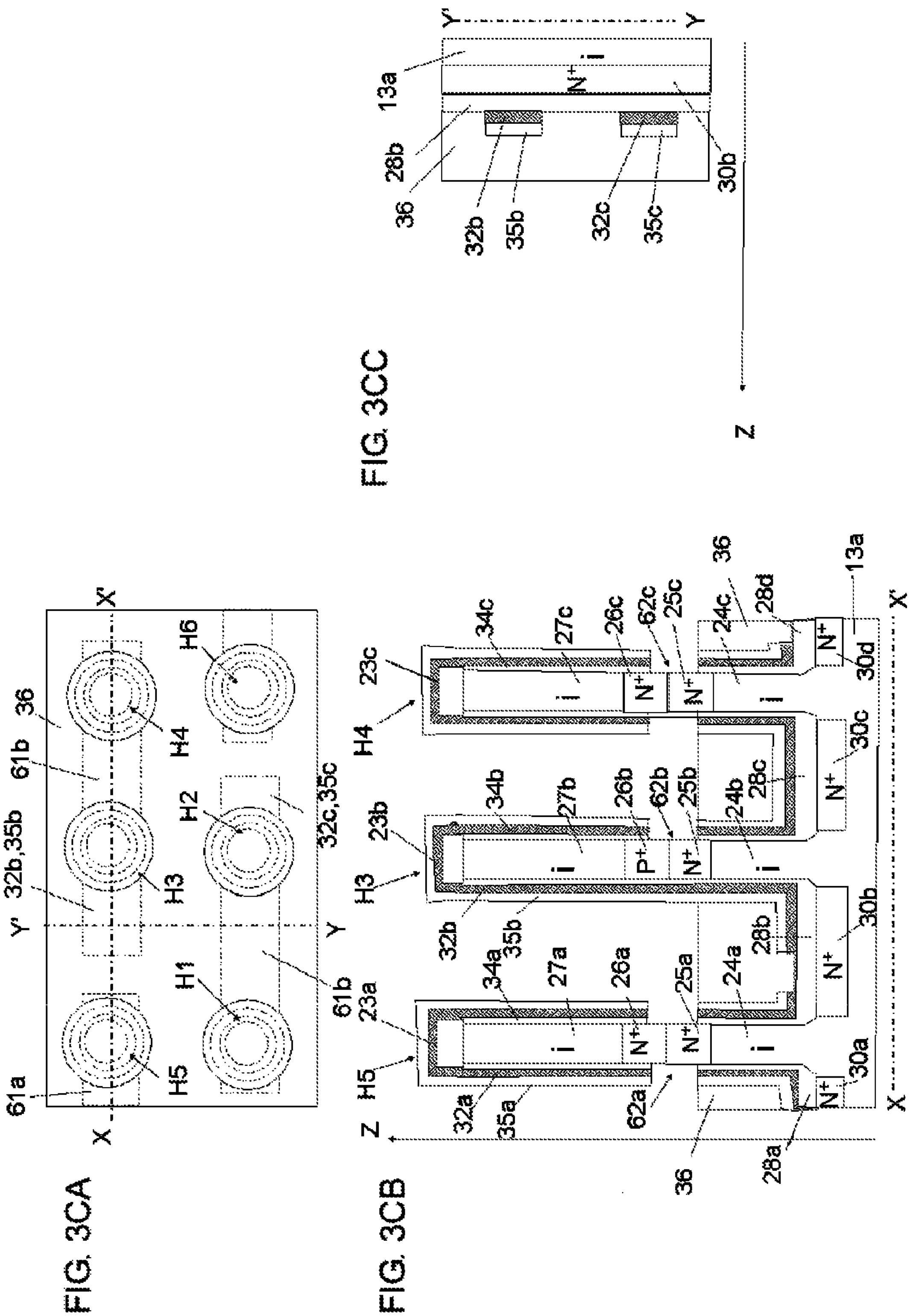
FIGS. 3CA to 3CC are respectively a plan view and cross-sectional views of an SRAM cell illustrating the method for producing an SGT-including semiconductor device according to the second embodiment.

As a result, as illustrated in FIGS. 3CA to 3CC, openings 62*a* and 62*c* are formed on the outer peripheries of the $N^+$ regions 25*a*, 25*c*, 26*a*, and 26*c* of the Si pillar H5 and the Si pillar H4 and an opening 62*b* is formed in a part where the $N^+$ region 25*b* and the $P^+$ region 26*b* have been in contact with the resist layer 61*b*, the part being a part of the outer periphery of the Si pillar H3 in an outer periphery direction.

Figure 3D:
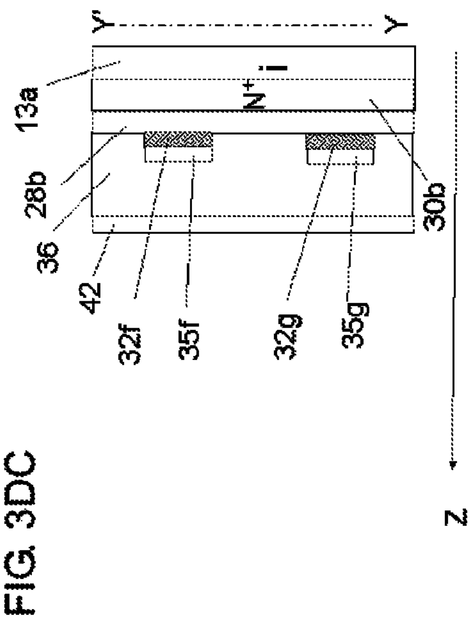
FIGS. 3DA to 3DC are respectively a plan view and cross-sectional views of an SRAM cell illustrating the method for producing an SGT-including semiconductor device according to the second embodiment.
Figure 3D:
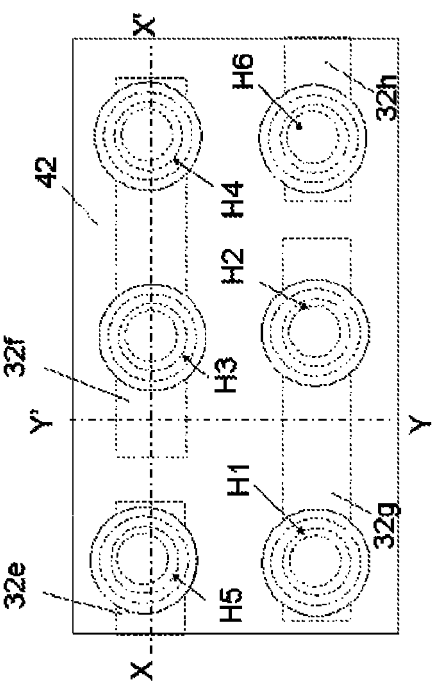
Figure 3D:
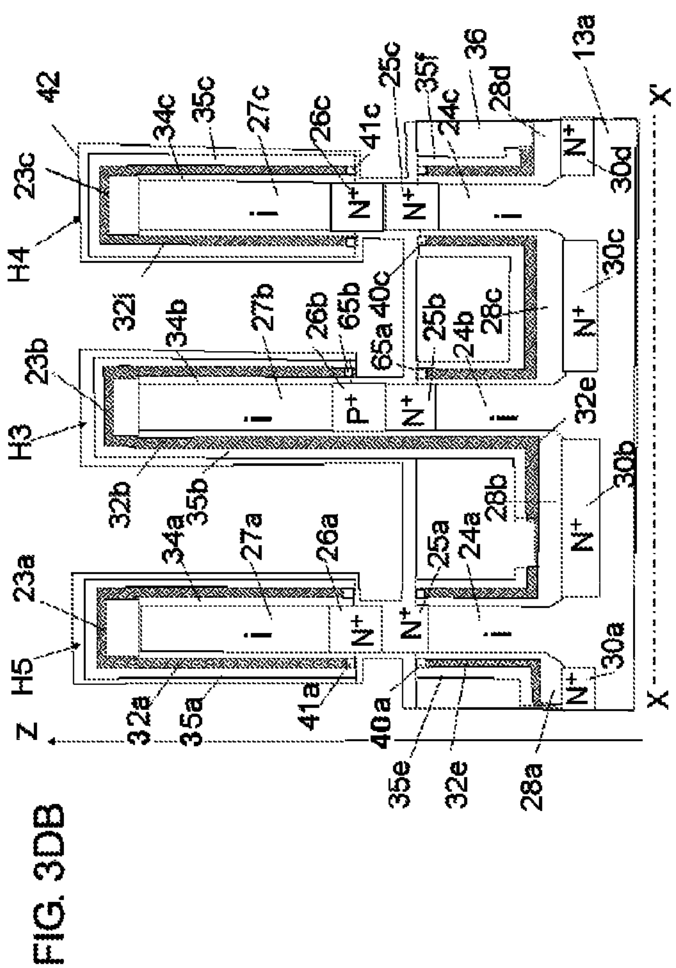

As illustrated in FIGS. 3DA to 3DC, the same process as one described with reference to FIGS. 2NA to 2NC is performed to oxidize the exposed portions of the TiN layers 32*a*, 32*b*, and 32*i* to form TiO layers 40*a*, 65*a*, 40*c*, 41*a*, 65*b*, and 41*c* composed of titanium oxide. Then a $SiO_2$ layer 42 is deposited over the entire structure by CVD. Here, the thickness of the deposited $SiO_2$ layer 42 is relatively small on the side walls of the Si pillars H1 to H6 and relatively large on the top portions of the Si pillars H1 to H6 and the surface of the SiN layer 36.

Figure 3E:
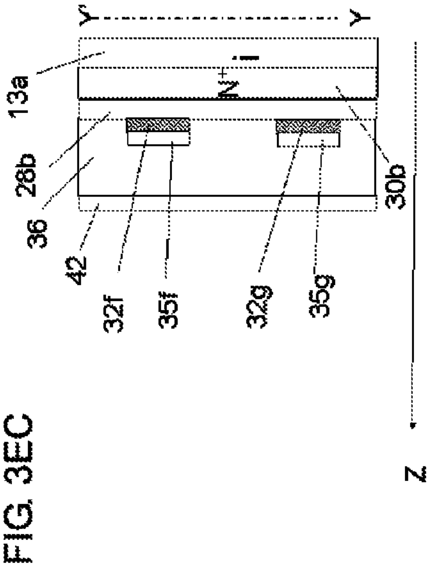
FIGS. 3EA to 3EC are respectively a plan view and cross-sectional views of an SRAM cell illustrating the method for producing an SGT-including semiconductor device according to the second embodiment.
Figure 3E:
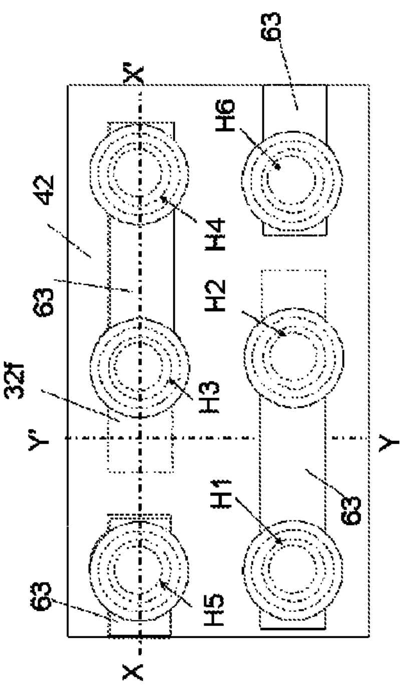
Figure 3E:
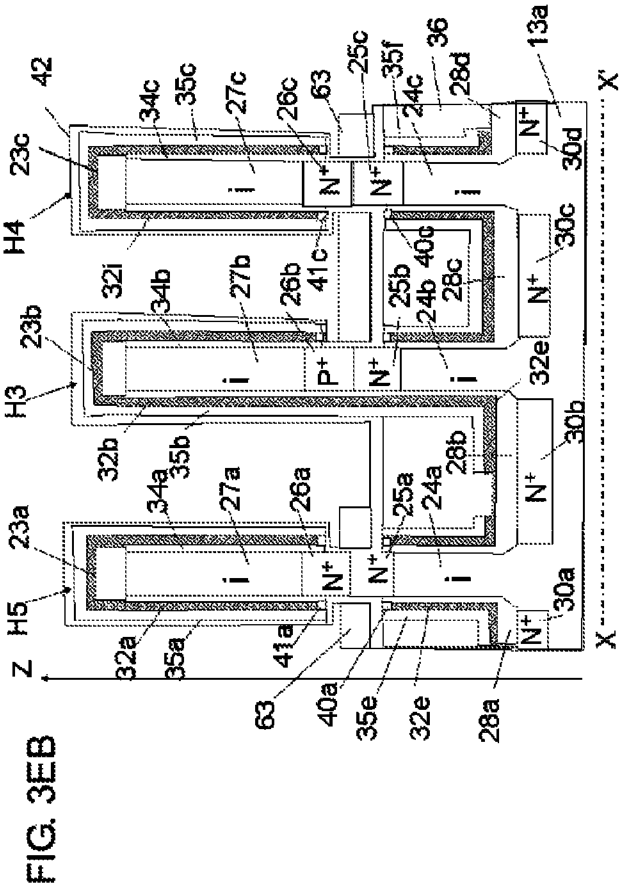

Then as illustrated in FIGS. 3EA to 3EC, the same process as one described with reference to FIGS. 3AA to 3AC is performed to apply a resist sensitive to light, an X-ray, or an electron beam and a resist layer 63 is formed by lithography. The resist layer 63 is formed so as to surround the outer periphery of the Si pillar H5, to be in contact with the Si-pillar-H4-side side wall of the Si pillar H3, and to surround the outer periphery of the Si pillar H4. Likewise, the resist layer 63 is formed so as to be in contact with the side wall of the Si pillar H2 and surround the outer periphery of the Si pillar H1. The resist layer 63 is formed so as to surround the outer periphery of the Si pillar H6. Then HF gas is supplied. The HF gas diffuses into the resist layer 63 and HF ions are generated due to the moisture contained in the resist layer 63. The HF ions etch part of the $SiO_2$ layer 42 in contact with the resist layer 63. The same process occurs in the resist layer 63 in contact with the Si pillar H1 and the Si pillar H2 and the resist layer 63 in contact with the Si pillar H6. The resist layer 63 is then removed.

Figure 3F:
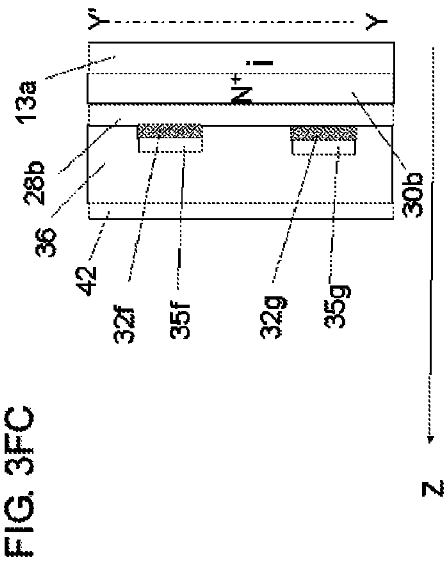
FIGS. 3FA to 3FC are respectively a plan view and cross-sectional views of an SRAM cell illustrating the method for producing an SGT-including semiconductor device according to the second embodiment.
Figure 3F:
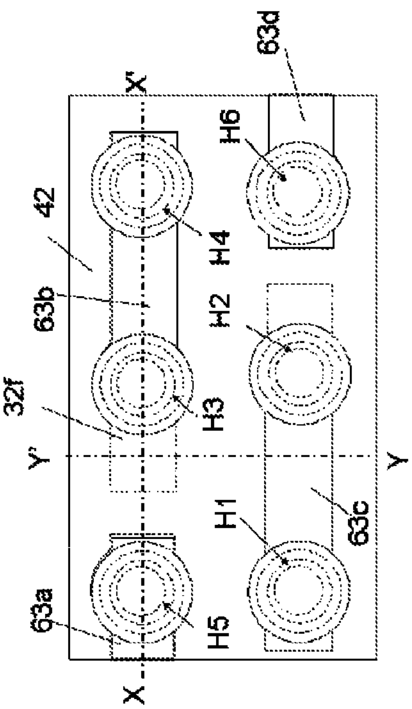
Figure 3F:
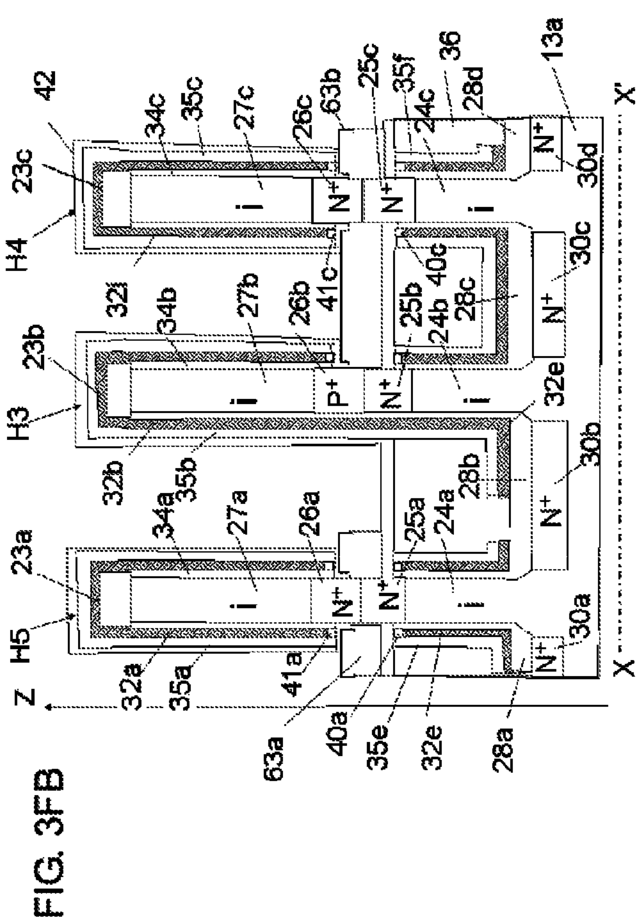

As illustrated in FIGS. 3FA to 3FC, conductor layers 63*a*, 63*b*, 63*c*, and 63*d* are formed. The conductor layer 63*a* is formed so as to contact the $N^+$ regions 25*a* and 26*a* of the Si pillar H5. The conductor layer 63*b* is in contact with the $N^+$ region 25*b* and the $P^+$ region 26*b* of the Si pillar H3 and the $N^+$ regions 25*c* and 26*c* of the Si pillar H4 and extends across the Si pillar H3 and the Si pillar H4. The conductor layers 63*c* and 63*d* are formed in the similar manner. Then the process illustrated in FIGS. 2RA to 2RC, 2SA to 2SC, 2TA to 2TC, 2UA to 2UC, and 2VA to 2VC is performed.

Figure 3G:
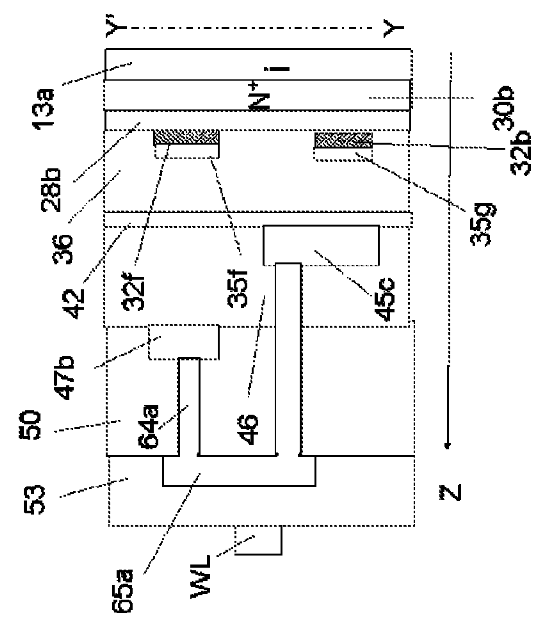
FIGS. 3GA to 3GC are respectively a plan view and cross-sectional views of an SRAM cell illustrating the method for producing an SGT-including semiconductor device according to the second embodiment.
Figure 3G:
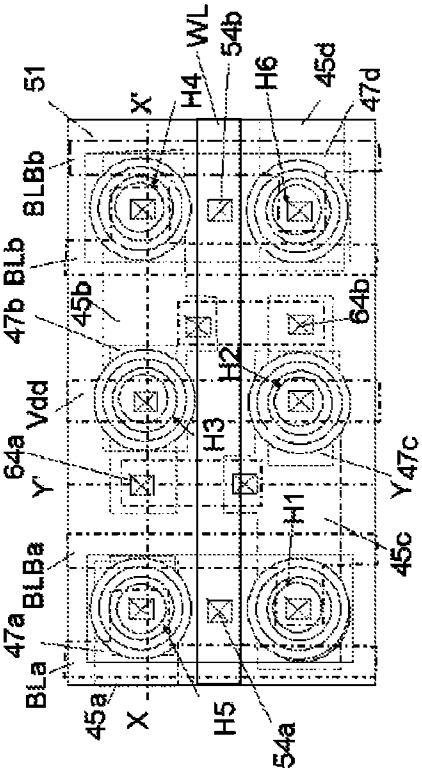
Figure 3G:
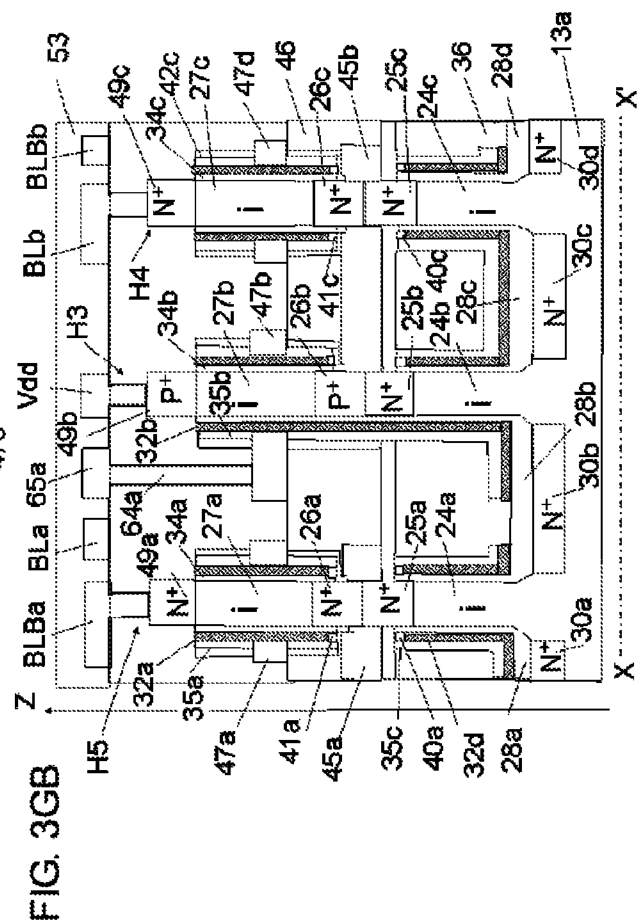

As illustrated in FIGS. 3GA to 3GC, a contact hole 64*a* is formed on the conductor layer 47*b* (in FIGS. 2VA to 2VC of the first embodiment, the contact hole 51*b* that corresponds to the contact hole 64*a* penetrates through the conductor layer 47*b* and is formed on the TiN layer 32*e*). As a result, as with the method for producing a semiconductor device according to the first embodiment, an SRAM cell circuit shown in the circuit diagram of FIG. 1A, a schematic diagram of FIG. 1B, and a Si pillar arrangement diagram of FIG. 1C is formed.

As described above, according to the method for producing a semiconductor device according to the second embodiment, a single continuous TiN layer 32*b* extends across two SGTs located in the upper portion and the lower portion of the Si pillar H3. Accordingly, the gate conductor layers of two SGTs formed in upper and lower portions of a Si pillar can connect to each other without having a contact hole 64*a* penetrate through a conductor layer 47*b* as in the method for producing a semiconductor device according to the first embodiment (refer to FIGS. 2VA to 2VC).

Third Embodiment

Figure 4A:
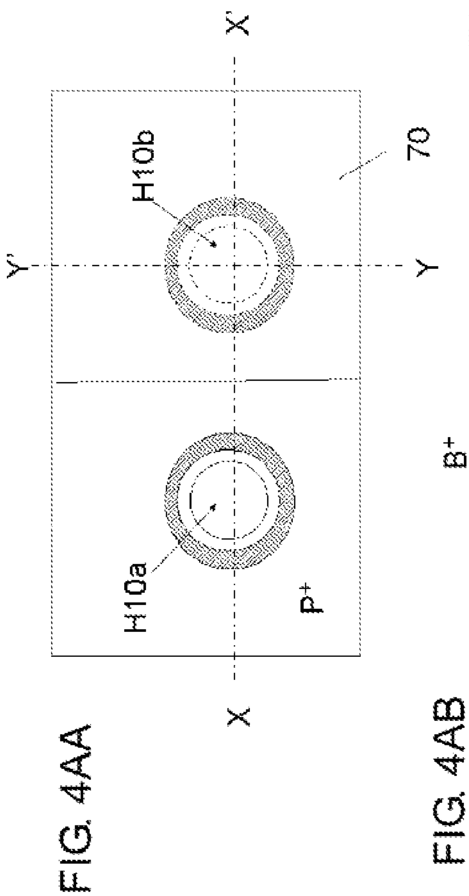
FIGS. 4AA to 4AC are respectively a plan view and cross-sectional views of an SRAM cell illustrating a method for producing an SGT-including semiconductor device according to a third embodiment.
Figure 4A:
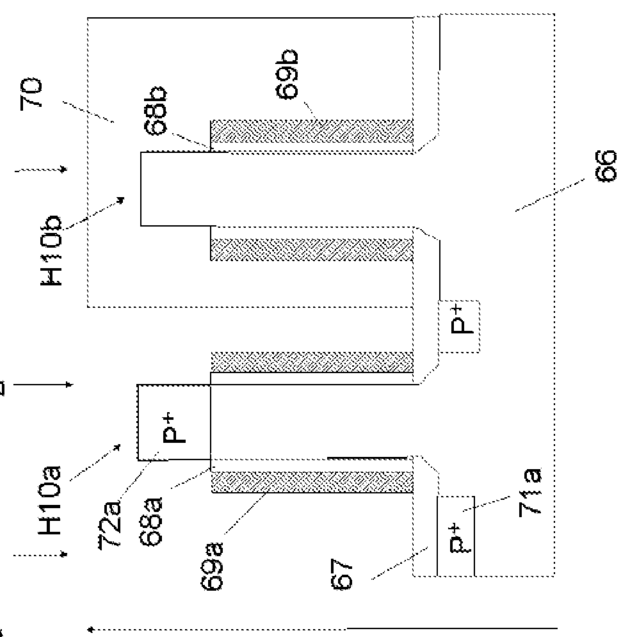
Figure 4A:
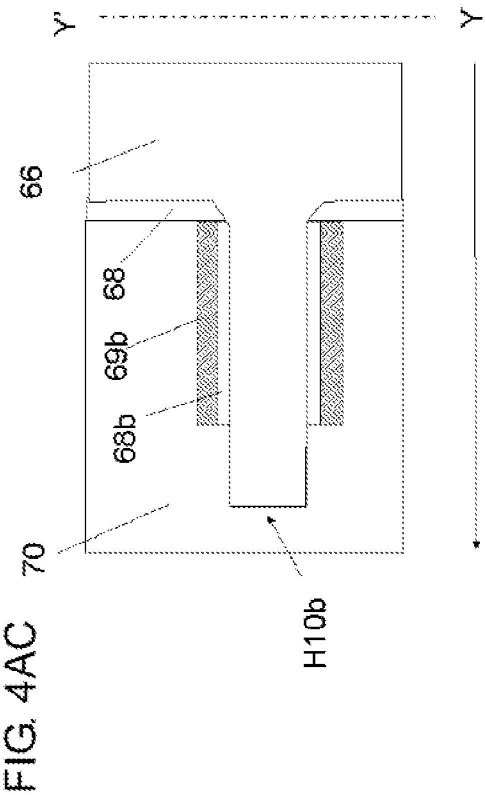

A method for producing an SGT-including semiconductor device according to a third embodiment will now be described with reference to FIGS. 4AA to 4DC. In this embodiment, the technical idea of the present invention is applied to an SGT-CMOS inverter circuit. In FIGS. 4AA to 4DC, a drawing whose reference ends with A is a plan view, a drawing whose reference ends with B is a cross-sectional view taken along line X-X', and a drawing whose reference ends with C is a cross-sectional view taken along line Y-Y'.

As illustrated in FIG. 4AA to 4AC, Si pillars H10*a* and H10*b* are formed on an i-layer substrate 66. A $SiO_2$ layer 67 is formed around the Si pillars H10*a* and H10*b* and on the i-layer substrate 66. Gate insulating layers 68*a* and 68*b* are formed on the outer peripheries of the Si pillars H10*a* and H10*b* and gate conductor layers 69*a* and 69*b* composed of, for example, TiN are formed on the outer peripheries of the gate insulating layers 68*a* and 68*b*. A resist layer 70 is formed so as to cover the Si pillar H10*b* and boron (B) ions are implanted by using the resist layer 70 as a mask. As a result, a $P^+$ region 72*a* is formed in a top portion of the Si pillar H10*a* and a $P^+$ region 71*a* is formed in a surface layer portion of the i-layer substrate 66 around the Si pillar H10*a*.

Figure 4B:
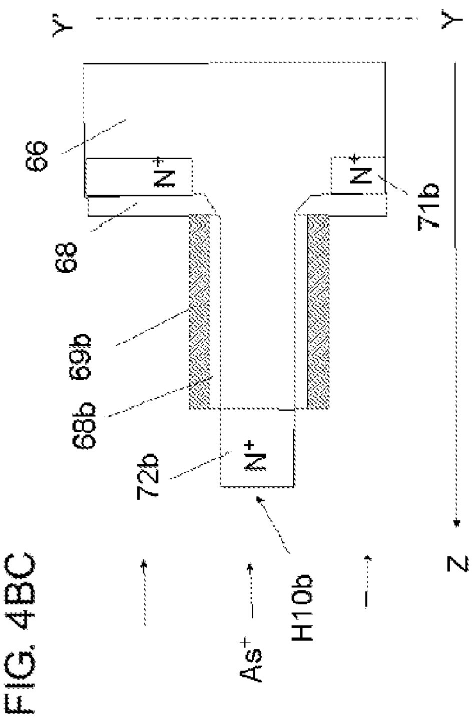
FIGS. 4BA to 4BC are respectively a plan view and cross-sectional views of an SRAM cell illustrating the method for producing an SGT-including semiconductor device according to the third embodiment.
Figure 4B:
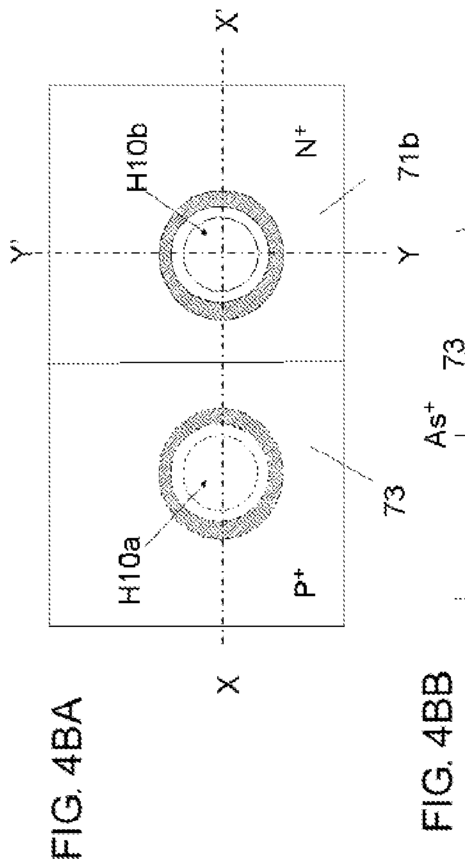
Figure 4B:
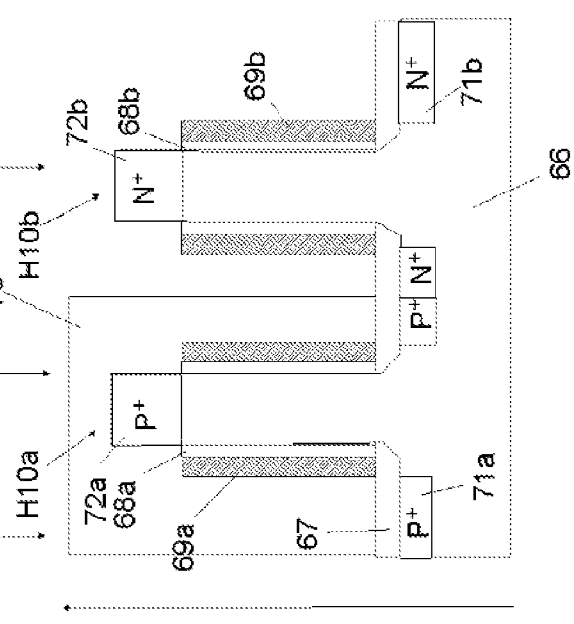

As illustrated in FIGS. 4BA to 4BC, a resist layer 73 is formed so as to cover the Si pillar H10*a* and arsenic (As) ions are implanted by using the resist layer 73 as a mask. As a result, an $N^+$ region 72*b* is formed in a top portion of the Si pillar H10*b* and an $N^+$ region 71*b* is formed in a surface layer portion of the i-layer substrate 66 around the Si pillar H10*b*.

Figure 4C:
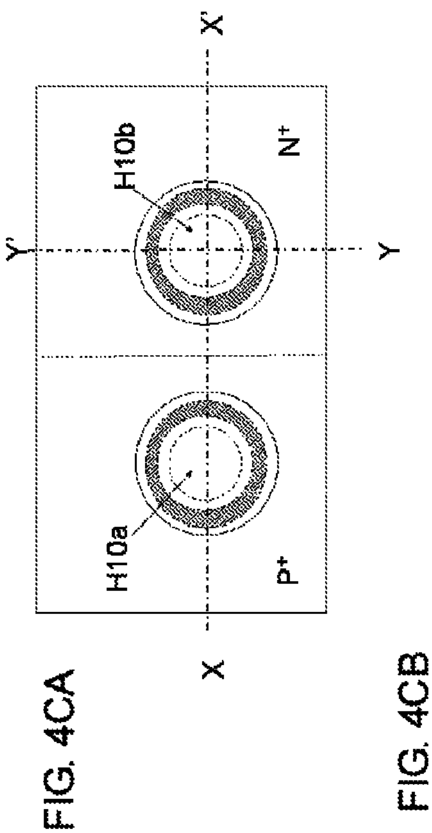
FIGS. 4CA to 4CC are respectively a plan view and cross-sectional views of an SRAM cell illustrating the method for producing an SGT-including semiconductor device according to the third embodiment.
Figure 4C:
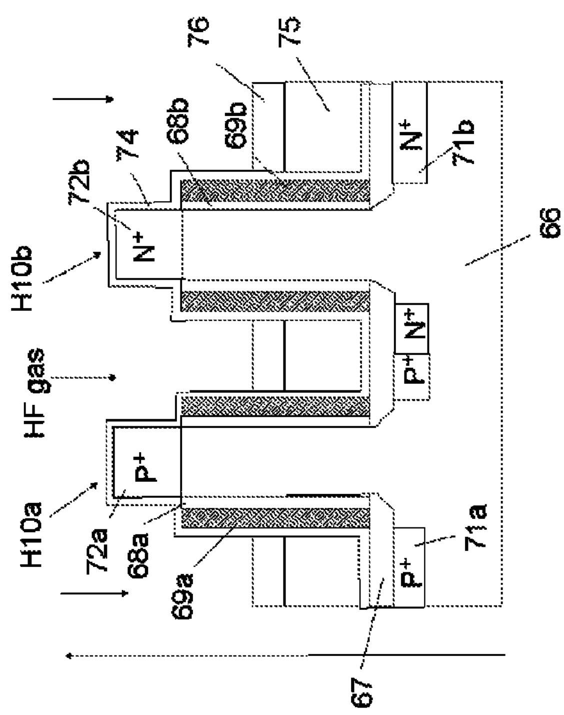
Figure 4C:
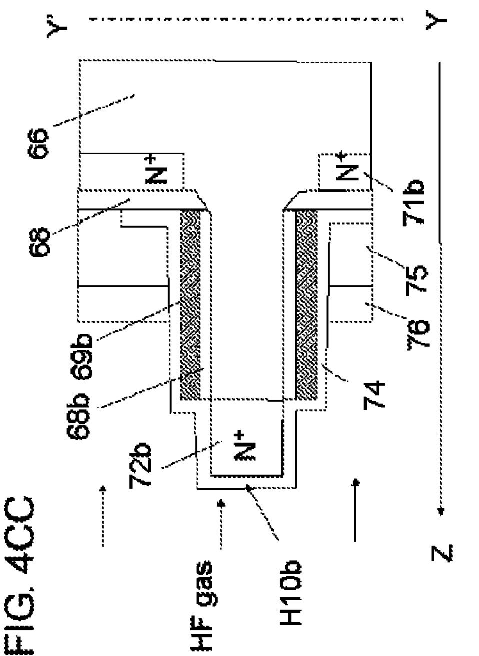

As illustrated in FIGS. 4CA to 4CC, a $SiO_2$ layer 74 is deposited over the entire structure. A SiN layer 75 is formed so that the surface thereof comes near the center portion of the gate conductor layers 69*a* and 69*b*, for example. A resist layer 76 having a particular thickness is formed on the SiN layer 75. HF gas is supplied to the entire structure and a heating environment of about 180° C. is created so as to diffuse the HF gas into the resist layer 76 and ionize the HF gas by moisture inside the resist layer 76. As a result, HF ions ($HF_2^+$) are formed. The HF ions etch part of the $SiO_2$ layer 74 in contact with the resist layer 76. The resist layer 76 is removed. This process is the same process as one described with reference to FIGS. 2JA to 2JC, 2KA to 2KC, and 2LA to 2LC.

Figure 4D:
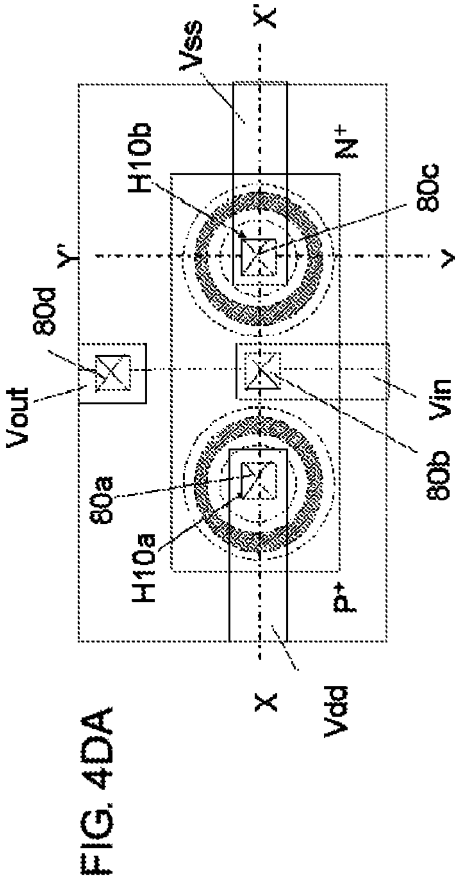
FIGS. 4DA to 4DC are respectively a plan view and cross-sectional views of an SRAM cell illustrating the method for producing an SGT-including semiconductor device according to the third embodiment.
Figure 4D:
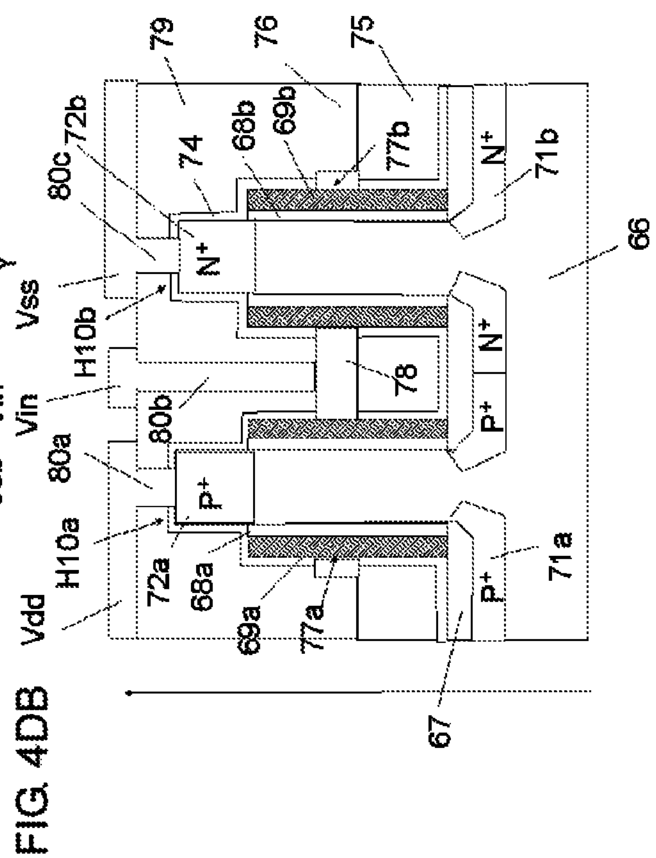
Figure 4D:
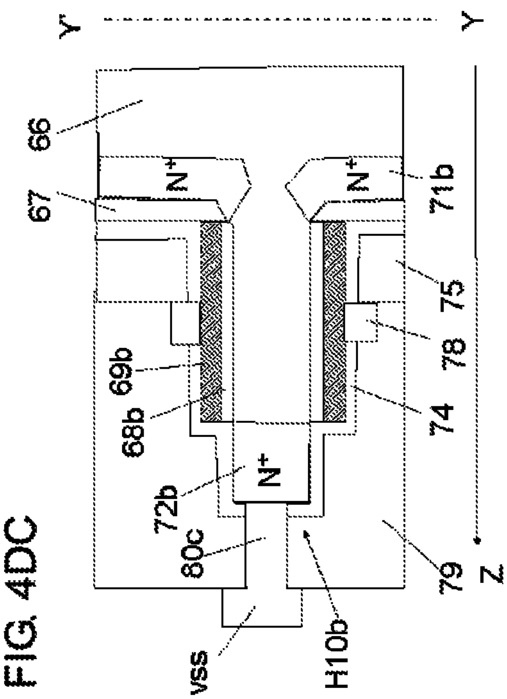
Figure 5:
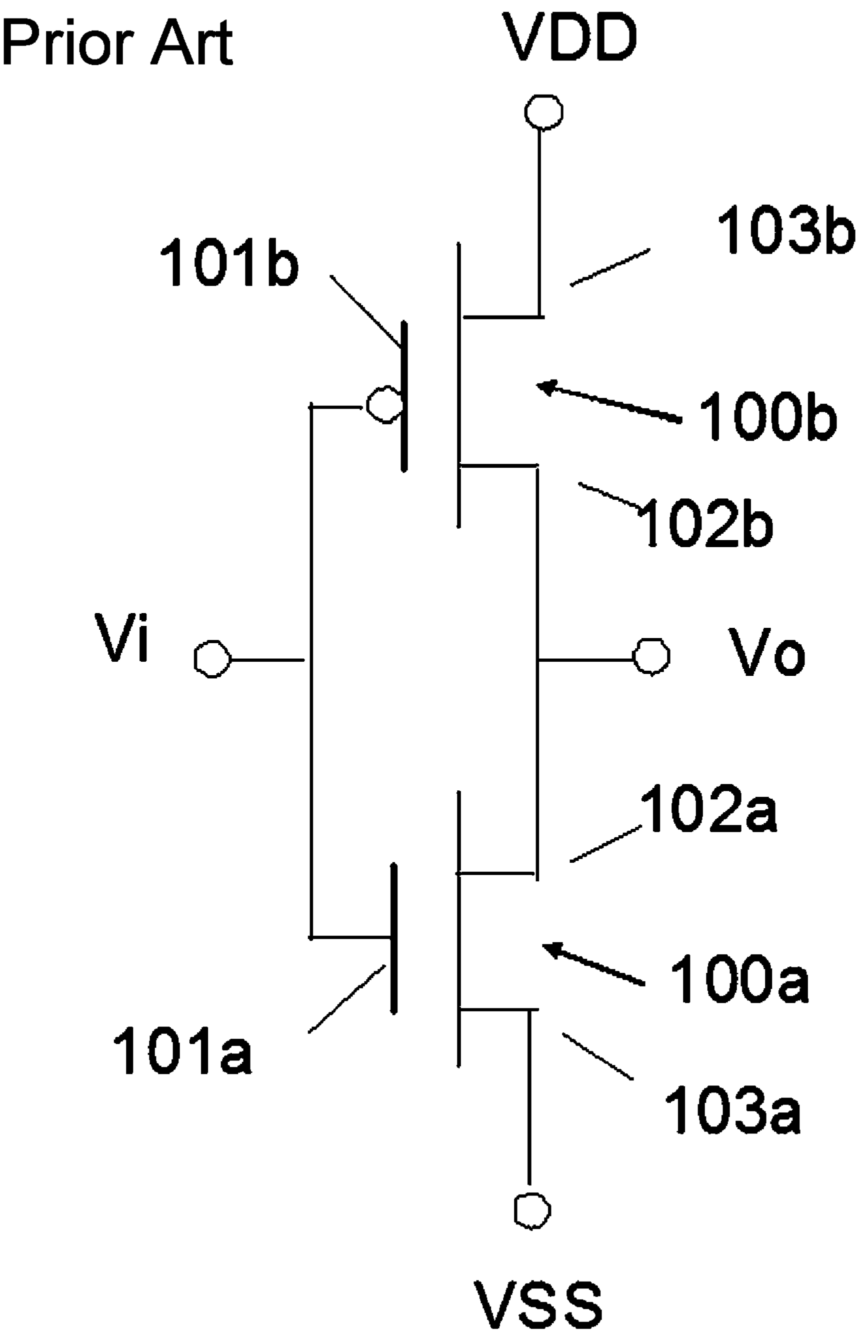
FIG. 5 is diagram illustrating a CMOS inverter circuit according to the prior art.

As illustrated in FIGS. 4DA to 4DC, openings 77*a* and 77*b* connecting to the gate conductor layers 69*a* and 69*b* are formed and a conductor layer 78 that comes into contact with the gate conductor layers 69*a* and 69*b* and connects the Si pillar H10*a* to the Si pillar H10*b* is formed. A $SiO_2$ layer 79 is formed over the entire structure by CVD, a contact hole 80*a* is formed on the Si pillar H10*a*, a contact hole 80*b* is formed on the conductor layer 78, a contact hole 80*c* is formed on the Si pillar H10*b*, and a contact hole 80*d* is formed on the border line between the $P^+$ region 71*a* and the $N^+$ region 71*b* of the surface of the i-layer substrate 66. A power supply wiring metal layer Vdd connected to the $P^+$ region 72*a* through the contact hole 80*a* is formed and an input wiring metal layer Vin connected to the conductor layer 78 through the contact hole 80*b* is formed. A ground wiring metal layer Vss connected to the $N^+$ region 72*b* through the contact hole 80*c* is formed and an output wiring metal layer Vout connected to the $P^+$ region 71*a* and the $N^+$ region 71*b* through the contact hole 80*d* is formed. As a result, an SGT-including CMOS inverter circuit is configured.

In the third embodiment, as illustrated in FIGS. 4AA to 4BC, the $P^+$ region 71*a* and the $N^+$ region 71*b* are formed by ion implantation after forming the gate conductor layers 69*a* and 69*b*. In the first embodiment, as illustrated in FIGS. 2GA to 2GC, the $N^+$ region 30*a*, 30*b*, 30*c*, and 30*d* are formed by arsenic (As) ion implantation into all parts of the surface after forming the Si pillars H1 to H6 and the $SiO_2$ layers 28*a*, 28*b*, 28*c*, 28*d*, 29*a*, 29*b*, and 29*c*. In the first embodiment, there is a risk that arsenic ions reflected at the surface of the i-layer substrate 13*a* would pass through the $SiO_2$ layers 29*a*, 29*b*, and 29*c* and penetrate the i-layers 24*a*, 24*b*, 24*c*, 27*a*, 27*b*, and 27*c* serving as channels, thereby generating variation in properties of the SGTs. In contrast, in the third embodiment, the channel Si pillars H10*a* and H10*b* are surrounded by the gate conductor layers 69*a* and 69*b* composed of TiN having a greater stopper effect (refer to FIGS. 4BA to 4BC) and thus variation in properties of SGTs can be reduced. The gate conductor layers 69*a* and 69*b* can each be formed of a TiN single layer or a polycrystalline Si layer, or have a multilayer structure constituted by a TiN layer and a layer of other metals. Thus, variation in properties of SGTs can be further effectively reduced.

As illustrated in FIGS. 4BA to 4BC, in the case where a $P^+$ region 71*a* and an $N^+$ region 71*b* are formed by impurity ion implantation after formation of the gate conductor layers 69*a* and 69*b* and where the gate conductor layers 69*a* and 69*b* are connected to each other with the conductor layer 78 through the openings 77*a* and 77*b* on the side walls of the gate conductor layers 69*a* and 69*b* (refer to FIGS. 4DA to 4DC), the gate conductor layers 69*a* and 69*b* are formed so as to connect to each other above the $SiO_2$ layer 67 and then impurity ion implantation is performed. In such a case, the $P^+$ region 71*a* and the $N^+$ region 71*b* are not formed in the surface layer portion of the i-layer substrate 66 under the conductor layer formed as a result of connecting the gate conductor layers 69*a* and 69*b* to each other above the $SiO_2$ layer 67. Accordingly, the resistance in the source or drain below the Si pillar H10*a* and the Si pillar H10*b* is increased. In contrast, according to the production method of the third embodiment, the $P^+$ region 71*a* and the $N^+$ region 71*b* are formed in all parts of peripheries of the Si pillars H10*a* and H10*b* and thus the resistance of the source or drain can be decreased.

In the embodiments described above, examples in which silicon (Si) pillars are used as semiconductor pillars are described. The semiconductor pillars are not limited to these and the technical idea of the present invention can be applied to SGT-including semiconductor devices in which semiconductor pillars composed of a semiconductor material other than silicon are used.

In the embodiments described above, the cases in which one or two SGTs are formed in one Si pillar are described. The arrangement is not limited to this and the technical idea of the present invention can be applied to a method for producing an SGT-semiconductor device in which three or more SGTs are formed in one semiconductor pillar.

As shown by the embodiments described above, gate $SiO_2$ layers (gate insulating layer) 34*a*, 34*b*, and 34*c* are formed on the outer peripheries of semiconductor pillars such as Si pillars H1 to H6 and TiN layers (gate conductor layers) 32*a*, 32*b*, and 32*c* are formed on the outer peripheries of the gate $SiO_2$ layers 34*a*, 34*b*, and 34*c* to form SGTs. A flash memory element that includes electrically floating conductor layers between the TiN layers 32*a*, 32*b*, and 32*c* and the gate $SiO_2$ layers 34*a*, 34*b*, and 34*c* is also a type of SGTs. Accordingly, the technical idea of the present invention is also applicable to a method for producing a flash memory element.

The technical idea of the present invention is also applicable to a semiconductor device (for example, refer to Japanese Unexamined Patent Application Publication No. 2010-232631) in which an inner side of a semiconductor pillar serves as a first channel and a semiconductor layer that surrounds the semiconductor pillar serving as the first channel serves as a second channel.

In the first embodiment, openings 38*a*, 38*b*, and 38*c* are formed in the source and drain impurity regions of the Si pillars H1 to H6 in which SGTs are formed or in side walls of the TiN layers (gate conductor layers) 32*a*, 32*b*, and 32*c*. However, the arrangement is not limited to this. The technical idea of the present invention is also applicable to the case in which the gate $SiO_2$ layers 34*a*, 34*b*, and 34*c* are left unetched and the gate conductor layers 32*a*, 32*b*, and 32*c* are separated from each other merely by the side walls of the Si pillars H1 to H6 by the process illustrated in FIGS. 2KA to 2KC and 2LA to 2LC. The same applies to other embodiments of the present invention. Gate conductor layers can be separated easily at particular positions in the perpendicular direction of a semiconductor pillar.

In the embodiments described above, the case in which only SGTs are formed in semiconductor pillars (Si pillars H1 to H6) is described. However, the technical idea of the present invention is applicable to methods for producing semiconductor devices in which SGTs and other elements (for example, photodiodes) are incorporated.

In FIGS. 2HA to 2HC illustrating the first embodiment, an example in which a gate conductor layer composed of TiN is used is described. Alternatively, the gate conductor layer may be composed of any other metal material. The gate conductor layer may have a multilayer structure that includes this metal layer and a polysilicon layer, for example. The same applies to other embodiments of the present invention.

In FIGS. 2KA to 2KC illustrating the first embodiment, formation of a SiN layer 36 having a low etching rate for HF ions under a resist layer 37 is described. Alternatively, the layer 36 may be composed of any other material that has a low etching rate for HF ions instead of SiN. The same applies to the SiN layer 46 and to other embodiments of the present invention.

In FIGS. 2KA to 2KC illustrating the first embodiment, a SiN layer 36 having a low etching rate for HF ions is formed under the resist layer 37. Alternatively, the layer 36 may be a $SiO_2$ layer composed of the same material as the $SiO_2$ layers 35*a*, 35*b*, and 35*i*. In such a case, the depth the layer 36 composed of $SiO_2$ is etched is the same as the depth the $SiO_2$ layers 35*a*, 35*b*, and 35*i* are etched. Since the thickness of the $SiO_2$ layers 35*a* and 35*b* is small, the depth the $SiO_2$ layer is etched is also small and thus the upper surface of the $SiO_2$ layer after etching comes within the range of the heights of the $N^+$ regions 25*a*, 25*b*, and 25*c* in the Si pillars H1 to H6. As long as an SGT-including semiconductor device according to the technical idea of the present invention can be realized, the SiN layer 36 may be replaced by a layer of any other material (for example, $SiO_2$) that can be etched by HF ions. This also applies to other embodiments of the present invention.

In the embodiments described above, SOI substrates each constituted by an i-layer substrate and an insulating substrate attached to the bottom of the i-layer substrate can be used as the i-layer substrates 13, 13*a*, and 13*b*. In such a case, the insulating substrate and impurity regions formed in the i-layer substrate surface (in FIGS. 2AA to 2WC, $N^+$ region 30*a*, 30*b*, 30*c*, and 30*d*) may be or not be in contact with the insulating substrate.

In FIGS. 2AA to 2WC illustrating the first embodiment, the i-layer substrate 13 and other layers are composed of Si.

Alternatively, the technical idea of the present invention is applicable to the case in which other semiconductor material layers are used. This applies to other embodiments as well.

The resist layers 37 and 43 shown in FIGS. 2KA to 2KC and 2OA to 2OC illustrating the first embodiment and the resist layer 76 illustrated in FIGS. 4CA to 4CC need not be subjected to patterning. Accordingly, the material therefor is not limited to cyclic rubber materials (negative type) and novolac materials (positive type) frequently used in photolithography, or resist materials used in X-ray or electron beam lithography. Usually, most of organic materials have some degree of water-absorbency. Most of organic materials can be applied evenly onto objects such as the SiN layer 36. Any of such organic materials can be used instead of resist materials such as cyclic rubber materials (negative type) used in photolithography as long as the organic materials allow formation and diffusion of HF ions within the layers of the organic materials. The same applies to other embodiments of the present invention as well.

The resist layers 37 and 43 shown in FIGS. 2KA to 2KC and 2OA to 2OC illustrating the first embodiment and the resist layer 76 shown in FIGS. 4CA to 4CC may be composed of an inorganic material, such as porous polysilicon, as long as the inorganic material has an appropriate degree of water absorbency. Inorganic materials that allow formation and diffusion of HF ions within the layers can also be used. The same applies to other embodiments of the present invention.

The patterned resist layers 61*a*, 61*b*, 61*c*, 61*d*, 63*b*, 63*b*, 63*c*, and 63*d* shown in FIGS. 3BA to 3BC and 3EA to 3EC illustrating the second embodiment need not be composed of a resist material used in light, X-ray, or electron beam lithography and may be composed of any material as long as the layers can be used to form openings of the desired shapes. This applies to other embodiments of the present invention as well.

In the second embodiment, the HF ions formed within the resist layers 37 and 43 may be used to etch not only the $SiO_2$ layers 35*a*, 35*b*, and 35*c* but also oxide films composed of other materials. Accordingly, oxide films composed of other materials, such as TiO or TaO, that can be etched with hydrofluoric acid (HF) can be used instead of the $SiO_2$ layers 35*a*, 35*b*, and 35*c*.

In FIGS. 2HA to 2HC illustrating the first embodiment, the gate $SiO_2$ layers 34*a*, 34*b*, and 34*c* formed by thermal oxidation are used as the gate insulating layers. Alternatively, high-K dielectric layers composed of, for example, hafnium oxide ($HfO_2$) can be used as the gate insulating layers. The same applies to other embodiments of the present invention.

The SiN layer 36 shown in FIGS. 2JA to 2JC illustrating the first embodiment may have a two-layer structure constituted by a SiN layer and a polysilicon layer on the SiN layer. In this case, the polysilicon that has a lower etching rate for the hydrofluoric acid comes into contact with the resist layer 37 and thus separation of the resist layer 37 during etching of the $SiO_2$ layers 35*a*, 35*b*, and 35*c* is reduced. This applies to other embodiments of the present invention as well.

In FIGS. 2AA to 2WC illustrating the first embodiment, the conductor layers 45*a*, 45*b*, 45*c*, and 45*d* in contact with the $N^+$ regions 25*a*, 25*b*, 25*c*, 26*a*, and 26*c* and the $P^+$ region 26*b* that lie in the middle portions of the Si pillars H1 to H6 and the conductor layers 47*a*, 47*b*, and 47*c* in contact with the conductor layers 32*a*, 32*b*, and 32*i* are formed on the same i-layer substrate 13*a*. Alternatively, the technical idea of the present invention is applicable to the case in which the conductor layers 45*a*, 45*b*, 45*c*, and 45*d* and/or the conductor layers 32*a*, 32*b*, and 32*i* are formed.

Various other embodiments and modifications are possible without departing from the broad spirit and scope of the present invention. The embodiments presented above are merely examples of the present invention and do not limit the scope of the present invention. The embodiments and modifications can be freely combined. Omitting some of the features of the embodiments described above according to need is also within the technical idea of the present invention.

According to a method for producing an SGT-including semiconductor device of the present invention, a highly integrated semiconductor device can be obtained.

The invention claimed is:

1. A method of producing an SGT-including semiconductor device, the method comprising:

a semiconductor-pillar-forming step of forming a semiconductor pillar on a semiconductor substrate;

a first-impurity-region-forming step of forming a first impurity region below the semiconductor pillar, the first impurity region containing a donor impurity or an acceptor impurity;

a second-impurity-region-forming step of forming a second impurity region in the semiconductor pillar so that the second impurity region is distanced from and above the first impurity region, the second impurity region having the same conductivity type as the first impurity region;

a first-gate-insulating-layer-forming step of forming a first gate insulating layer on an outer periphery of the semiconductor pillar and at least a portion of the semiconductor pillar located between the first impurity region and the second impurity region;

a first-gate-conductor-layer-forming step of forming a first gate conductor layer on an outer periphery of the first gate insulating layer;

a first-insulating-layer-forming step of forming a first insulating layer so that the first insulating layer covers the semiconductor pillar and the first gate conductor layer;

a second-insulating-layer-forming step of forming a second insulating layer on the semiconductor substrate and on an outer periphery of the first insulating layer, the second insulating layer being shorter than the semiconductor pillar;

a hydrogen-fluoride-ion-diffusion-layer-forming step of forming a hydrogen fluoride ion diffusion layer having a particular thickness on the second insulating layer and the first insulating layer;

a hydrogen-fluoride-gas-supplying step of supplying hydrogen fluoride gas to the hydrogen fluoride ion diffusion layer such that the hydrogen fluoride ion diffusion layer generates hydrogen fluoride ions and the hydrogen fluoride ions diffuse therein;

a first-insulating-layer-etching step of etching a part of the first insulating layer on the hydrogen fluoride ion diffusion layer by using the hydrogen fluoride ions generated in the hydrogen fluoride ion diffusion layer from the hydrogen fluoride gas supplied to the hydrogen fluoride ion diffusion layer; and a hydrogen-fluoride-ion-diffusion-layer-removing step of removing the hydrogen fluoride ion diffusion layer after the first-insulating-layer-etching step, wherein an SGT is constituted by the first impurity region and the second impurity region that respectively function as a source and a drain or vice versa, the at least a portion of the semiconductor pillar located between the first impurity region and the second impurity region that functions as a channel between the drain and the source, the first gate insulating layer, and the first gate conductor layer.

2. The method according to claim 1, which further comprises:

a third-impurity-region-forming step of forming a third impurity region containing a donor impurity or an acceptor impurity on the second impurity region and in the semiconductor pillar, the third-impurity-region-forming step being performed after the second-impurity-region-forming step and before the hydrogen-fluoride-ion-diffusion-layer-forming step, wherein, in the hydrogen-fluoride-ion-diffusion-layer-forming step, the hydrogen fluoride ion diffusion layer is formed in a range that extends across where the second impurity region and the third impurity region are formed with respect to an upright direction of the semiconductor pillar; and a first-gate-conductor-layer-etching step of etching the first gate conductor layer by using the first insulating layer as a mask, the first-gate-conductor-layer-etching step being performed after the hydrogen-fluoride-ion-diffusion-layer-removing step.

3. The method according to claim 2, further comprising a first-gate-insulating-layer-etching step of etching the first gate insulating layer by using one or both of the first insulating layer and the first gate conductor layer as a mask, the first-gate-insulating-layer-etching step being performed after the first-gate-conductor-layer-etching step.

4. The method according to claim 3, wherein:

a top portion of the second insulating layer is positioned within a range where the second impurity region is formed in the semiconductor pillar with respect to the upright direction of the semiconductor pillar, and the method further comprises a first-conductor-wiring-layer-forming step of forming a first conductor wiring layer so as to connect exposed portions of the second impurity region and the third impurity region in the semiconductor pillar, the first-conductor-wiring-layer-forming step being performed after the first-gate-insulating-layer-etching step.

5. The method according to claim 1, wherein:

a top portion of the second insulating layer and a bottom portion of the second insulating layer are positioned within a range where the first gate conductor layer is formed with respect to an upright direction of the semiconductor pillar, and the method further comprises a second-conductor-wiring-layer-forming step of forming a second conductor wiring layer connected to an exposed portion of the first gate conductor layer, the second-conductor-wiring-layer-forming step being performed after the hydrogen-fluoride-ion-diffusion-layer-removing step.

6. The method according to claim 1, further comprising:

a third-impurity-region-forming step of forming a third impurity region in the semiconductor pillar and on the second impurity region, the third impurity region containing a donor impurity or an acceptor impurity;

a fourth-impurity-region-forming step of forming a fourth impurity region above the third impurity region, the fourth impurity region containing a donor impurity or an acceptor impurity and having the same conductivity type as the third impurity region;

a second-gate-insulating-layer-forming step of forming a second gate insulating layer on the outer periphery of the semiconductor pillar and on at least a portion of the semiconductor pillar located between the third impurity region and the fourth impurity region, the second gate insulating layer being separated from the first gate insulating layer; and a second-gate-conductor-layer-forming step of forming a second gate conductor layer on an outer periphery of the second gate insulating layer, the second gate conductor layer being separated from the first gate conductor layer.

7. The method according to claim 6, wherein, in the hydrogen-fluoride-ion-diffusion-layer-forming step, the hydrogen fluoride ion diffusion layer is formed to be in contact with a part of the first insulating layer in an outer periphery direction so that a top portion of the hydrogen fluoride ion diffusion layer comes within a range of the third impurity region with respect to an upright direction of the semiconductor pillar and a bottom portion of the hydrogen fluoride ion diffusion layer comes within a range of the second impurity region with respect to the upright direction, and the method comprises:

a second-hydrogen-fluoride-gas-supplying step of supplying hydrogen fluoride gas to the hydrogen fluoride ion diffusion layer;

a second-insulating-layer-etching step of etching a part of the first insulating layer on the hydrogen fluoride ion diffusion layer by using the hydrogen fluoride ions generated in the hydrogen fluoride ion diffusion layer from the hydrogen fluoride gas supplied to the hydrogen fluoride ion diffusion layer; and a third-gate-insulating-layer-etching step of etching the first gate conductor layer by using the first insulating layer as a mask and then etching the first gate insulating layer by using one or both of the first insulating layer and the first gate conductor layer as a mask, the third-gate-insulating-layer-etching step being performed after the hydrogen-fluoride-ion-diffusion-layer-removing step.

8. The method according to claim 1, wherein the first-impurity-region-forming step is performed after the first-gate-conductor-layer-forming step.

9. The method according to claim 1, wherein:

the method comprises a forming third-impurity-region-forming step of forming a third impurity region in the semiconductor pillar and on the second impurity region, the third impurity region containing a donor impurity or an acceptor impurity, the third-impurity-region-forming step being performed after the second-impurity-region-forming step and before the hydrogen-fluoride-ion-diffusion-layer-forming step, wherein in the hydrogen-fluoride-ion-diffusion-layer-forming step, the hydrogen fluoride ion diffusion layer is formed so as to contact a part of the first insulating layer in an outer periphery direction so that a top portion of the hydrogen fluoride ion diffusion layer comes within a range of the third impurity region with respect to an upright direction of the semiconductor pillar and a bottom portion of the hydrogen fluoride ion diffusion layer comes within a range of the second impurity region with respect to the upright direction, and the method comprises:

a second-hydrogen-fluoride-gas-supplying step of supplying hydrogen fluoride gas to the hydrogen fluoride ion diffusion layer;

a second-insulating-layer-etching step of etching a part of the first insulating layer on the hydrogen fluoride ion diffusion layer by using the hydrogen fluoride ions generated in the hydrogen fluoride ion diffusion layer from the hydrogen fluoride gas supplied to the hydrogen fluoride ion diffusion layer; and a third-gate-insulating-layer-etching step of etching the first gate conductor layer by using the first insulating layer as a mask and then etching the first gate insulating layer by using one or both of the first insulating layer and the first gate conductor layer as a mask, the third-gate-insulating-layer-etching step being performed after the hydrogen-fluoride-ion-diffusion-layer-removing step.

* * * * *